US012125443B2

(12) United States Patent
Hong et al.

(10) Patent No.: US 12,125,443 B2
(45) Date of Patent: Oct. 22, 2024

(54) DISPLAY DEVICE

(71) Applicant: Samsung Display Co., Ltd., Yongin-si (KR)

(72) Inventors: Sungjin Hong, Seoul (KR); Chung Sock Choi, Seoul (KR); Hyewon Kim, Seoul (KR); Yoomin Ko, Suwon-si (KR); Sunho Kim, Seongnam-si (KR); Juchan Park, Seoul (KR); Pilsuk Lee, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/981,778

(22) Filed: Nov. 7, 2022

(65) Prior Publication Data

US 2023/0206857 A1 Jun. 29, 2023

(30) Foreign Application Priority Data

Dec. 23, 2021 (KR) .................. 10-2021-0185795

(51) Int. Cl.
*G09G 3/3275* (2016.01)
*G09G 3/3266* (2016.01)

(52) U.S. Cl.
CPC ......... *G09G 3/3275* (2013.01); *G09G 3/3266* (2013.01); *G09G 2300/0452* (2013.01); *G09G 2310/0272* (2013.01)

(58) Field of Classification Search
CPC .......................... G09G 3/3275; G09G 3/3266
See application file for complete search history.

(56) References Cited

U.S. PATENT DOCUMENTS

| 10,852,596 | B2 | 12/2020 | Tamaki | |
|---|---|---|---|---|
| 2019/0140025 | A1 | 5/2019 | Wang | |
| 2020/0320941 | A1* | 10/2020 | Ge | G09G 3/3607 |
| 2021/0201743 | A1 | 7/2021 | Park et al. | |
| 2022/0189410 | A1* | 6/2022 | Kim | G09G 3/3266 |

FOREIGN PATENT DOCUMENTS

KR 10-2021-0085299 7/2021

* cited by examiner

*Primary Examiner* — Nelson M Rosario
*Assistant Examiner* — Scott D Au
(74) *Attorney, Agent, or Firm* — KILE PARK REED & HOUTTEMAN PLLC

(57) ABSTRACT

A display panel includes a first display area and a second display area. A plurality of base pixel parts are disposed in the second display area, and each base pixel part includes "k" first color light emitting elements. A controller receives image signals, and the image signals include first image signals corresponding to the first display area and second image signals corresponding to the second display area. The second image signals are divided into a plurality of base signal parts respectively corresponding to the plurality of base pixel parts, and each base signal part includes "m*n" first color image signals. The controller generates color image data by rendering "p" color image signals of "m*n" color image signals included in a corresponding base signal part and "(m*n)−p" referenced image signals included in a referenced signal part adjacent to the corresponding base signal part.

30 Claims, 24 Drawing Sheets

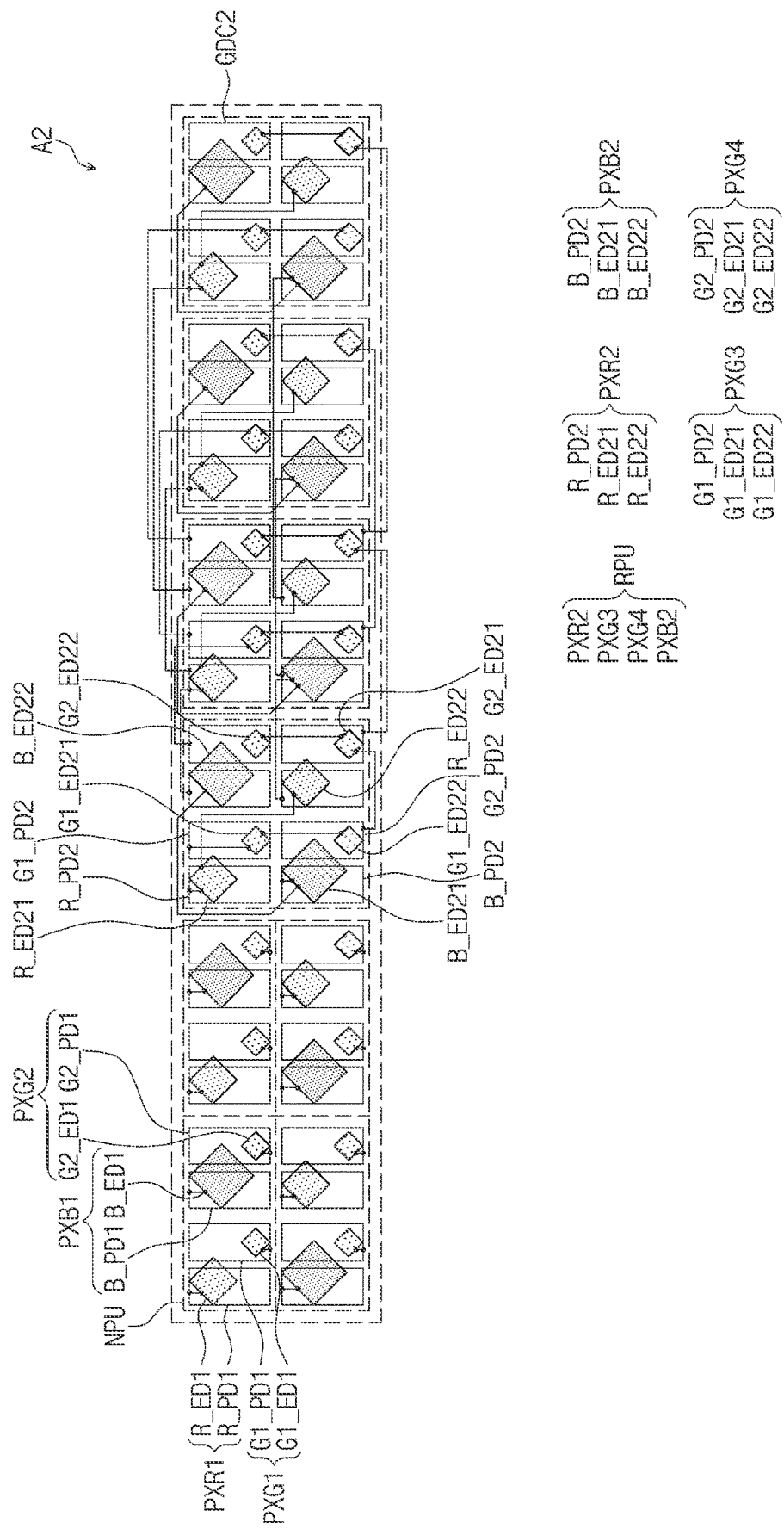

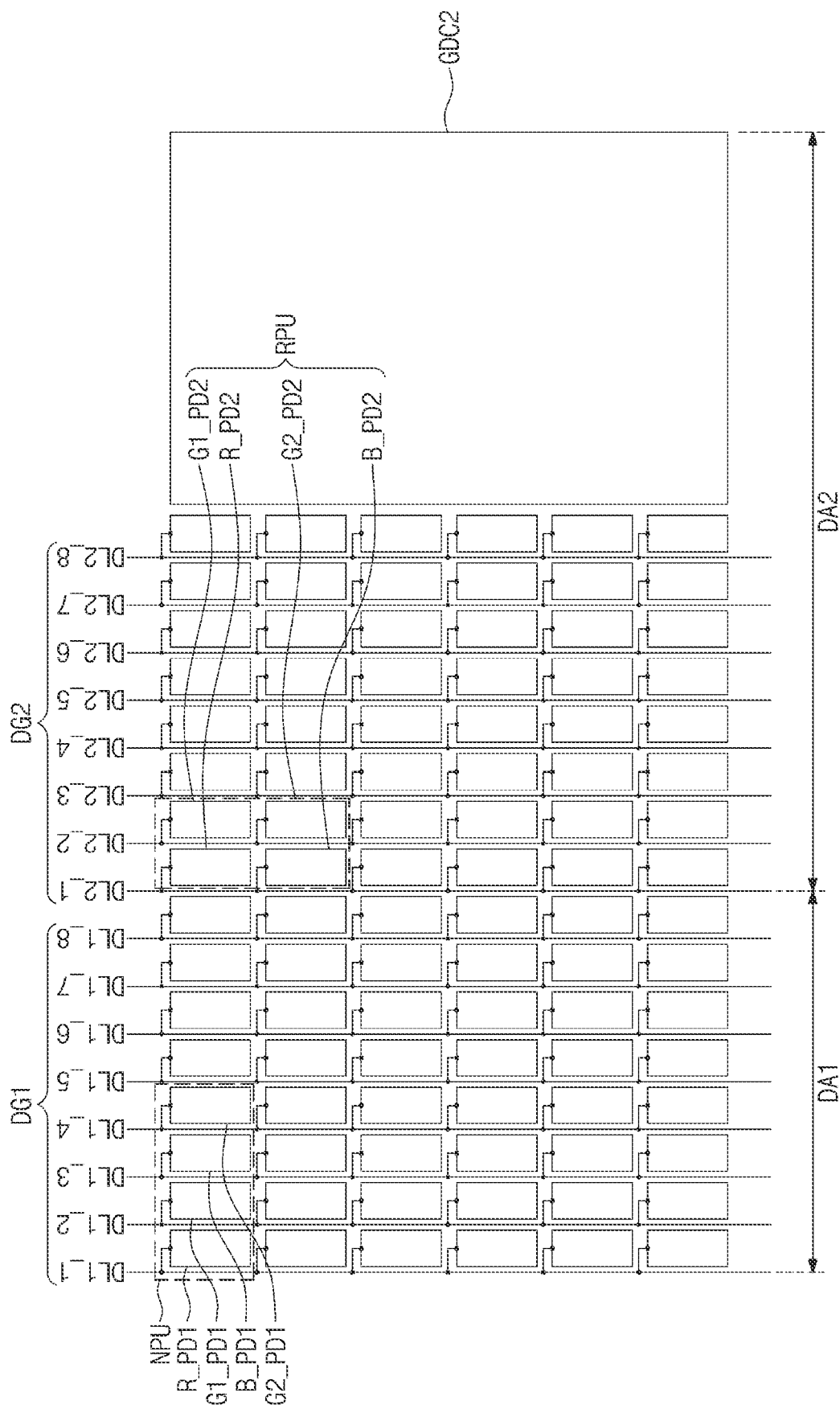

DISPLAY DEVICE

CROSS-REFERENCE TO RELATED APPLICATION(S)

This application claims priority to and benefits of Korean Patent Application No. 10-2021-0185795 under 35 U.S.C. § 119, filed on Dec. 23, 2021, in the Korean Intellectual Property Office (KIPO), the disclosures of which are incorporated by reference herein in their entireties.

BACKGROUND

1. Technical Field

The disclosure described herein relates to a display device having an enlarged display area.

2. Description of the Related Art

Various electronic devices are being developed that are used in a multi-media device such as a television, a mobile phone, a tablet computer, a navigation system, or a game console.

Nowadays, with a demand of a market, the research is being conducted to reduce an area where an image is not displayed on an electronic device. In addition, the research is being conducted to enlarge (or expand) an area where an image is displayed to a user on an electronic device.

SUMMARY

Embodiments of the disclosure provide a display device capable of reducing a width of a bezel area such that a display area is enlarged (or expanded) and improving an image quality of the enlarged display area.

According to an embodiment, a display device may include a display panel including a first display area and a second display area adjacent to the first display area, a controller that receives image signals and renders the image signals to output image data, and a data driver that converts the image data into data signals and provides the data signals to the first and second display areas of the display panel.

A plurality of base pixel parts may be disposed in the second display area, and each of the plurality of base pixel parts may include "k" first color light emitting elements that receive a data signal corresponding to first color image data.

The image signals may include first image signals corresponding to the first display area and second image signals corresponding to the second display area, the second image signals may be divided into a plurality of base signal parts, each of the plurality of base signal parts may respectively correspond to each of the plurality of base pixel parts, and each of the plurality of base signal parts may include "m*n" first color image signals.

The controller may generate the first color image data by rendering "p" first color image signals of "m*n" first color image signals included in a corresponding base signal part and "(m*n)−p" first referenced image signals included in a first referenced signal part adjacent to the corresponding base signal part. Herein, each of k and p may be less than a product of m and n, each of k, m, and n may be a natural number of 2 or more, and p may be a natural number of 1 or more.

Each of the plurality of base signal parts may further include "m*n" second color image signals and "m*n" third color image signals, each of the plurality of base pixel parts may further include "j" second color light emitting elements that receives a data signal corresponding to second color image data and "k" third color light emitting elements that receives a data signal corresponding to third color image data, and j may be a natural number more than k.

A plurality of normal pixel parts may be disposed in the first display area. In case that the first display area is disposed adjacent to a first side of the second display area, the first referenced signal part may be disposed adjacent to the first side of the corresponding base signal part. In case that the first display area is disposed adjacent to a second side of the second display area which is opposite to the first side, the first referenced signal part may be disposed adjacent to the second side of the corresponding base signal part.

The first image signals may be divided into a plurality of normal signal parts, and each of the plurality of normal signal parts respectively may correspond to each of the plurality of normal pixel parts. Each of the plurality of normal signal parts may include two normal color image signals. The controller may generate normal color image data by rendering one of two normal color image signals included in a corresponding one of the plurality of normal signal parts and one referenced normal signal included in a normal-referenced part adjacent to the corresponding normal signal part. A corresponding normal pixel part associated with the corresponding normal signal part may receive a data signal associated with the normal color image data.

The controller may generate the third color image data by rendering "q" third color image signals of the "m*n" third color image signals included in the corresponding base signal part and "(m*n)−q" second referenced image signals included in the first referenced signal part, a data signal associated with the third color image data may be provided to the "k" third color light emitting elements included in the corresponding base pixel part, and q may be less than a product of m and n and may be a natural number of 1 or more.

Each of m and n may be 2 and each of p and q may be 3. One first referenced image signal may be placed at a same row as a first non-referenced image signal other than three of four first color image signals included in the corresponding base signal part, and one second referenced image signal may be placed at a same row as a second non-referenced image signal other than three of four third color image signals included in the corresponding base signal part.

k may be 2 and j may be 4, two first color light emitting elements may be electrically connected with each other, two of four second color light emitting elements may be electrically connected with each other, a rest of the four second color light emitting elements may be electrically connected with each other, and two third color light emitting elements may be electrically connected with each other.

The first non-referenced image signal and the second non-referenced image signal may be placed at different rows.

m may be 3, n may be 2, and each of p and q may be 5. One first referenced image signal may be placed at a same row as a first non-referenced image signal other than five of six first color image signals included in the corresponding base signal part, and one second referenced image signal may be placed at a same row as a second non-referenced image signal other than five of six third color image signals included in the corresponding base signal part.

k may be 3 and j may be 6. Three first color light emitting elements may be electrically connected with each other, three of six second color light emitting elements may be electrically connected with each other, a rest of the six second color light emitting elements may be electrically connected with each other, and three third color light emitting elements may be electrically connected with each other.

m may be 4, n may be 2, and each of p and q may be 7. One first referenced image signal may be placed at a same row as a first non-referenced image signal other than seven of eight first color image signals included in the corresponding base signal part, and one second referenced image signal may be placed at a same row as a second non-referenced image signal other than seven of eight third color image signals included in the corresponding base signal part.

k may be 4 and j may be 8. Four first color light emitting elements may be electrically connected with each other, four of eight second color light emitting elements may be electrically connected with each other, a rest of the eight second color light emitting elements may be electrically connected with each other, and four third color light emitting elements may be electrically connected with each other.

m may be 2, n may be 3, p is 5, and q may be 4. One first referenced image signal may be placed at a same row as a first non-referenced image signal other than five of six first color image signals included in the corresponding base signal part, and two second referenced image signals may be respectively placed at same rows as two second non-referenced image signals other than four of six third color image signals included in the corresponding base signal part.

k may be 3 and j may be 6. Three first color light emitting elements may be electrically connected with each other, three of six second color light emitting elements may be electrically connected with each other, a rest of the six second color light emitting elements may be electrically connected with each other, and three third color light emitting elements may be electrically connected with each other.

m may be 2, n may be 4, and each of p and q may be 6. Two first referenced image signals may be respectively placed at same rows as two first non-referenced image signals other than six of eight first color image signals included in the corresponding base signal part, and two second referenced image signals may be respectively placed at same rows as two second non-referenced image signals other than six of eight third color image signals included in the corresponding base signal part.

k may be 4 and j may be 8. Four first color light emitting elements may be electrically connected with each other, four of eight second color light emitting elements may be electrically connected with each other, a rest of the eight second color light emitting elements may be electrically connected with each other, and four third color light emitting elements may be electrically connected with each other.

m may be 3, n may be 2, p may be 5, and "(m*n)–p" may be 1. One first referenced image signal may be placed at a same row as a first non-referenced image signal other than five of six first color image signals included in the corresponding base signal part, and one second referenced image signal may be placed at a same row as a second non-referenced image signal other than five of six third color image signals included in the corresponding base signal part.

m may be 3, n may be 4, and each of p and q may be 10. Two first referenced image signals may be respectively placed at same rows as two first non-referenced image signals other than 10 of 12 first color image signals included in the corresponding base signal part, and two second referenced image signals may be respectively placed at same rows as two second non-referenced image signals other than 10 of 12 third color image signals included in the corresponding base signal part.

m may be 4, n may be 4, and each of p and q may be 14. Two first referenced image signals may be placed at a same row as two first non-referenced image signals other than 14 of 16 first color image signals included in the corresponding base signal part, and two second referenced image signals may be placed at a same row as two second non-referenced image signals other than 14 of 16 third color image signals included in the corresponding base signal part.

The two first non-referenced image signals may be respectively placed at same rows as the two second non-referenced image signals.

The "k" first color light emitting elements may be electrically connected with each other, "j/2" second color light emitting elements of the "j" second color light emitting elements may be electrically connected with each other, a rest of the "j" second color light emitting elements may be electrically connected with each other, and the "k" third color light emitting elements may be electrically connected with each other.

The data signal converted from the first color image data may be provided to the "k" first color light emitting elements in common.

The "k" first color light emitting elements may output red light, the "j" second color light emitting elements may output green light, and the "k" third color light emitting elements may output blue light.

The display device may further include a scan driver disposed to overlap the second display area of the display panel in a plan view.

According to an embodiment, a display device may include a display panel that includes a first display area and a second display area adjacent to the first display area, and a controller that receives image signals and renders the image signals to output image data.

A plurality of normal pixel parts, each of the plurality of normal pixel parts including a first color light emitting element, may be disposed in the first display area, a plurality of base pixel parts may be disposed in the second display area, each of the plurality of base pixel parts may include second color light emitting elements, and a number of second color light emitting elements included in each of the normal pixel parts may be k times a number of first color light emitting elements included in each of the plurality of base pixel parts.

The image signals may include first image signals corresponding to the first display area and second image signals corresponding to the second display area, the second image signals may be divided into a plurality of base signal parts, each of the plurality of base signal parts may respectively correspond to each of the plurality of base pixel parts, each of the base signal parts may include "m*n" reference color image signals, the first image signals may be divided into a plurality of normal signal parts, each of the plurality of normal signal parts may respectively correspond to each of the plurality of normal pixel parts, and each of the normal signal parts may include "(m*n)/k" normal color image signals.

The controller may generate normal color image data by rendering a portion of "(m*n)/k" normal color image signals included in a corresponding normal signal part and a normal-referenced image signal included in a base signal part adjacent to the corresponding normal signal part. The normal-referenced signal may be not referenced in case that rendering is performed on reference color image signals included in a corresponding base signal part. Herein, k may be less than a product of m and n, and each of k, m, and n may be a natural number of 2 or more.

Each of the plurality of base signal parts may further include "m*n" second color image signals and "m*n" third color image signals, each of the plurality of base pixel parts may further include "j" second color light emitting elements, and "k" third color light emitting elements, and j may be a natural number more than k.

In case that the first display area is disposed adjacent to a first side of the second display area, the normal-referenced signal may be included in a base signal part adjacent to the first side of the normal signal part, and in case that the first display area is disposed adjacent to a second side of the second display area which is opposite to the first side, the normal-referenced signal may be included in a base signal part adjacent to the second side of the normal signal part.

The controller may generate a reference color image data by rendering "p" reference color image signals of "m*n" reference color image signals included in a corresponding base signal part and "(m*n)−p" referenced criterion signals included in a referenced signal part adjacent to the corresponding base signal part, and p may be less than a product of m and n and may be a natural number of 1 or more.

The normal-referenced signal and the referenced criterion signals may be placed at a same row.

BRIEF DESCRIPTION OF THE DRAWINGS

The above and other objects and features of the disclosure will become apparent by describing in detail embodiments thereof with reference to the accompanying drawings.

FIG. 4B is a schematic diagram illustrating a connection relationship between light emitting elements and driving circuits of area A2 illustrated in FIG. 4A.

FIG. 4C is a schematic diagram illustrating a connection relationship between driving circuits and data lines illustrated in FIG. 4A.

DETAILED DESCRIPTION OF THE EMBODIMENTS

Figure 1A:
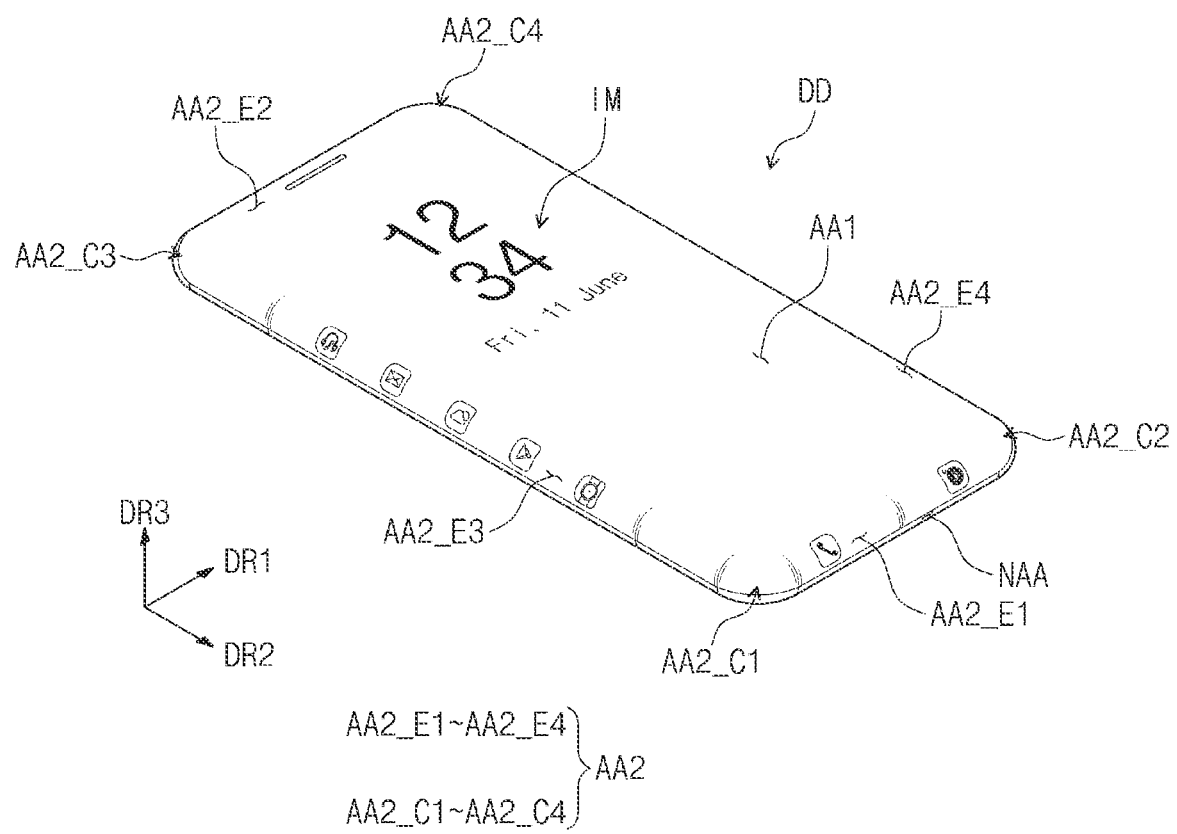
FIG. 1A is a perspective view of a display device according to an embodiment of the disclosure.

In the specification, the expression that a first component (or area, layer, part, portion, etc.) is "on", "connected with", or "coupled to" a second component means that the first component is directly on, connected with, or coupled to the second component or means that a third component is interposed therebetween.

The same reference numeral refers to the same component. Also, in drawings, thicknesses, proportions, and dimensions of components may be exaggerated to describe the technical features effectively. The expression "and/or" includes one or more combinations which associated components are capable of defining.

Although the terms "first", "second", etc. may be used to describe various components, the components should not be construed as being limited by the terms. The terms are only used to distinguish one component from another component. For example, without departing from the scope and spirit of the disclosure, a first component may be referred to as a second component, and similarly, the second component may be referred to as the first component. The singular forms are intended to include the plural forms unless the context clearly indicates otherwise.

Also, the terms "under", "below", "on", "above", etc. are used to describe the correlation of components illustrated in drawings. The terms are relative and are described with reference to a direction indicated in the drawing.

It will be further understood that the terms "comprises", "includes", "have", etc. specify the presence of stated features, numbers, steps, operations, elements, components, or a combination thereof but do not preclude the presence or addition of one or more other features, numbers, steps, operations, elements, components, or a combination thereof.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined, all terms (including technical terms and scientific terms) used in the specification have the same meaning as commonly understood by one skilled in the art to which the disclosure belongs. Furthermore, terms such as terms defined in the dictionaries commonly used should be interpreted as having a meaning consistent with the meaning in the context of the related technology, and should not be interpreted in ideal or overly formal meanings unless explicitly defined herein.

Below, embodiments of the disclosure will be described with reference to accompanying drawings.

Figure 1B:
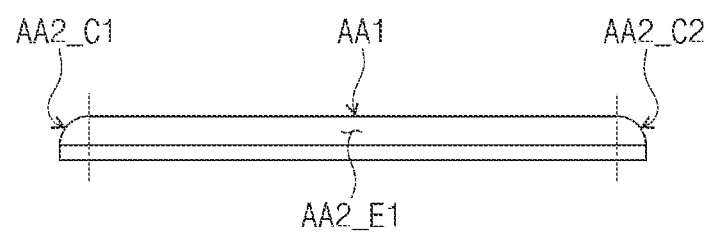
FIG. 1B is a side view of a display device of FIG. 1A viewed from a second direction.
Figure 1C:
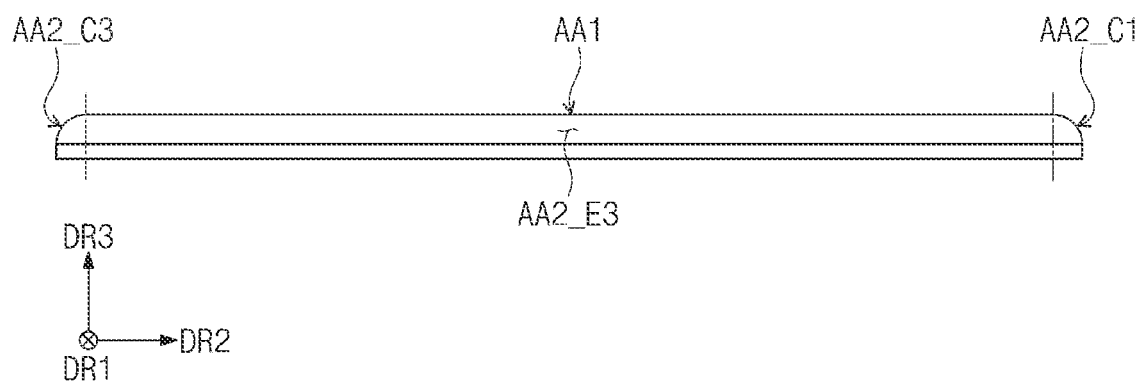
FIG. 1C is a side view of a display device of FIG. 1A viewed from a first direction.

FIG. 1A is a perspective view of a display device according to an embodiment of the disclosure, FIG. 1B is a side view of a display device of FIG. 1A viewed from a second direction, and FIG. 1C is a side view of a display device of FIG. 1A viewed from a first direction.

An embodiment which a display device DD is a smartphone is illustrated in FIGS. 1A to 1C. However, the disclosure is not limited thereto. For example, the display device DD may be a small and medium-sized electronic device, such as a mobile phone, a tablet computer, a vehicle navigation system, a game console, or a smart watch, as well as a large-sized electronic device such as a television or a monitor.

Active areas AA1 and AA2 in which an image IM is displayed and a peripheral area (or a non-display area) NAA in which the image IM is not displayed may be defined in the display device DD. A date, a clock, and an icon image are illustrated in FIG. 1A as an example of the image IM.

The active areas AA1 and AA2 may include a first active area AA1 of a planar shape and a second active area AA2 bent from the first active area AA1. The second active area AA2 may be an area curved from the first active area AA1 with a given curvature. However, the shape of the second active area AA2 is not limited thereto. For example, the second active area AA2 may be in the shape of a plane that is parallel to the first active area AA1 or may be inclined or perpendicular to the first active area AA1. The first and second active areas AA1 and AA2 that are areas classified based on a shape may implement one display surface. The peripheral area NAA may correspond to an area where the image IM is not displayed. A bezel area of the display device DD may be defined by the peripheral area NAA.

The first active area AA1 may be parallel to a surface that is defined by a first direction DR1 and a second direction DR2. The normal direction of the first active area AA1, for example, a thickness direction of the display device DD may be parallel to a third direction DR3. The thickness direction of the display device DD may be aligned with the third direction DR3. Directions that the first to third directions DR1 to DR3 direct may be relative concepts and may be changed to different directions.

The second active area AA2 may be an area bent from the first active area AA1. The second active area AA2 may include edge active areas AA2_E1 to AA2_E4 bent from edges (or sides) of the first active area AA1 and corner active areas AA2_C1 to AA2_C4 bent from corners of the first active area AA1. The second active area AA2 may include a first edge active area AA2_E1 bent from a first edge (or side) of the first active area AA1, a second edge active area AA2_E2 bent from a second edge (or side) of the first active area AA1, a third edge active area AA2_E3 bent from a third edge (or side) of the first active area AA1, and a fourth edge active area AA2_E4 bent from a fourth edge (or side) of the first active area AA1. Each of the first to fourth edge active areas AA2_E1 to AA2_E4 may be curved to have a given curvature in the third direction DR3. Each of the first to fourth edge active areas AA2_E1 to AA2_E4 may be in the shape of a single curvature surface. The first to fourth edge active areas AA2_E1 to AA2_E4 are illustrated in FIG. 1A as being curved with the same curvature, but the disclosure is not limited thereto. For example, the first and second edge active areas AA2_E1 and AA2_E2 may be bent with a different curvature from that of the third and fourth edge active areas AA2_E3 and AA2_E4.

The second active area AA2 may further include a first corner active area AA2_C1 bent from a first corner of the first active area AA1, a second corner active area AA2_C2 bent from a second corner of the first active area AA1, a third corner active area AA2_C3 bent from a third corner of the first active area AA1, a fourth corner active area AA2_C4 bent from a fourth corner of the first active area AA1.

The first corner active area AA2_C1 may be disposed between the first edge active area AA2_E1 and the third edge active area AA2_E3, and the second corner active area AA2_C2 may be disposed between the first edge active area AA2_E1 and the fourth edge active area AA2_E4. The third corner active area AA2_C3 may be disposed between the second edge active area AA2_E2 and the third edge active area AA2_E3, and the fourth corner active area AA2_C4 may be disposed between the second edge active area AA2_E2 and the fourth edge active area AA2_E4.

Each of the first to fourth corner active areas AA2_C1 to AA2_C4 may be curved to have a given curvature in the third direction DR3. Each of the first to fourth corner active areas AA2_C1 to AA2_C4 may be in the shape of multiple curvature surfaces.

In the display device DD, the number of edge active areas AA2_E1 to AA2_E4 and the number of corner active areas AA2_C1 to AA2_C4 are not limited to the above embodiment. For example, in the second active area AA2, the number of edge active areas AA2_E1 to AA2_E4 and the number of corner active areas AA2_C1 to AA2_C4 may vary depending on the shape of the first active area AA1. Also, in the display device DD, at least one of the edge active areas AA2_E1 to AA2_E4 and the corner active areas AA2_C1 to AA2_C4 may be omitted.

In an embodiment of the disclosure, a first image displayed in the first active area AA1 and a second image displayed in the second active area AA2 may depend on each other. For example, one picture, one scene of a movie, or an UX/UI design may be formed by a combination of the first image and the second image. The aesthetic sense of the display device DD may be improved by the second active area AA2 curved to have the given curvature, and the size of the peripheral area NAA that is perceivable by the user may decrease.

Figure 2A:
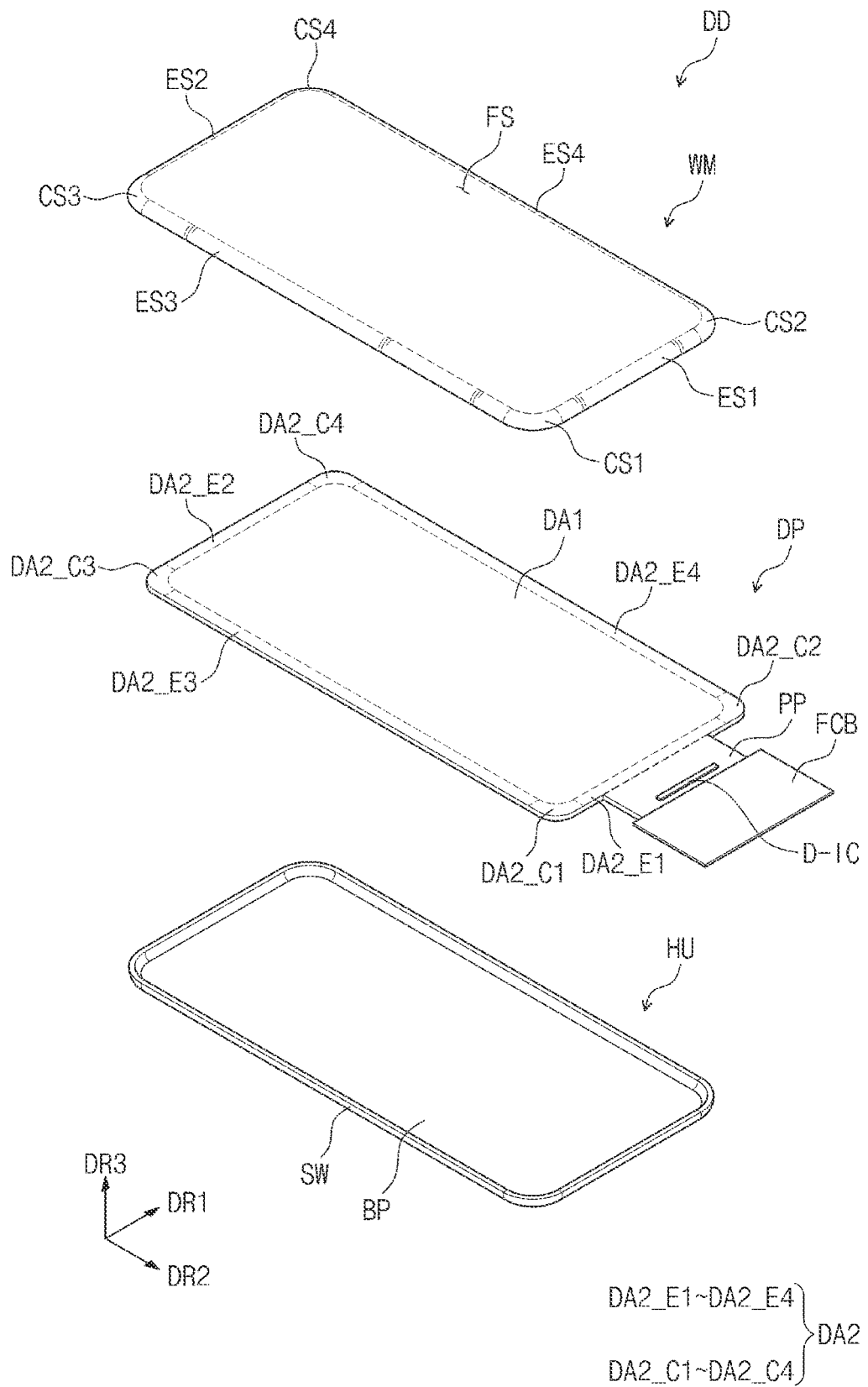
FIG. 2A is an exploded perspective view of a display device according to an embodiment of the disclosure.
Figure 2B:
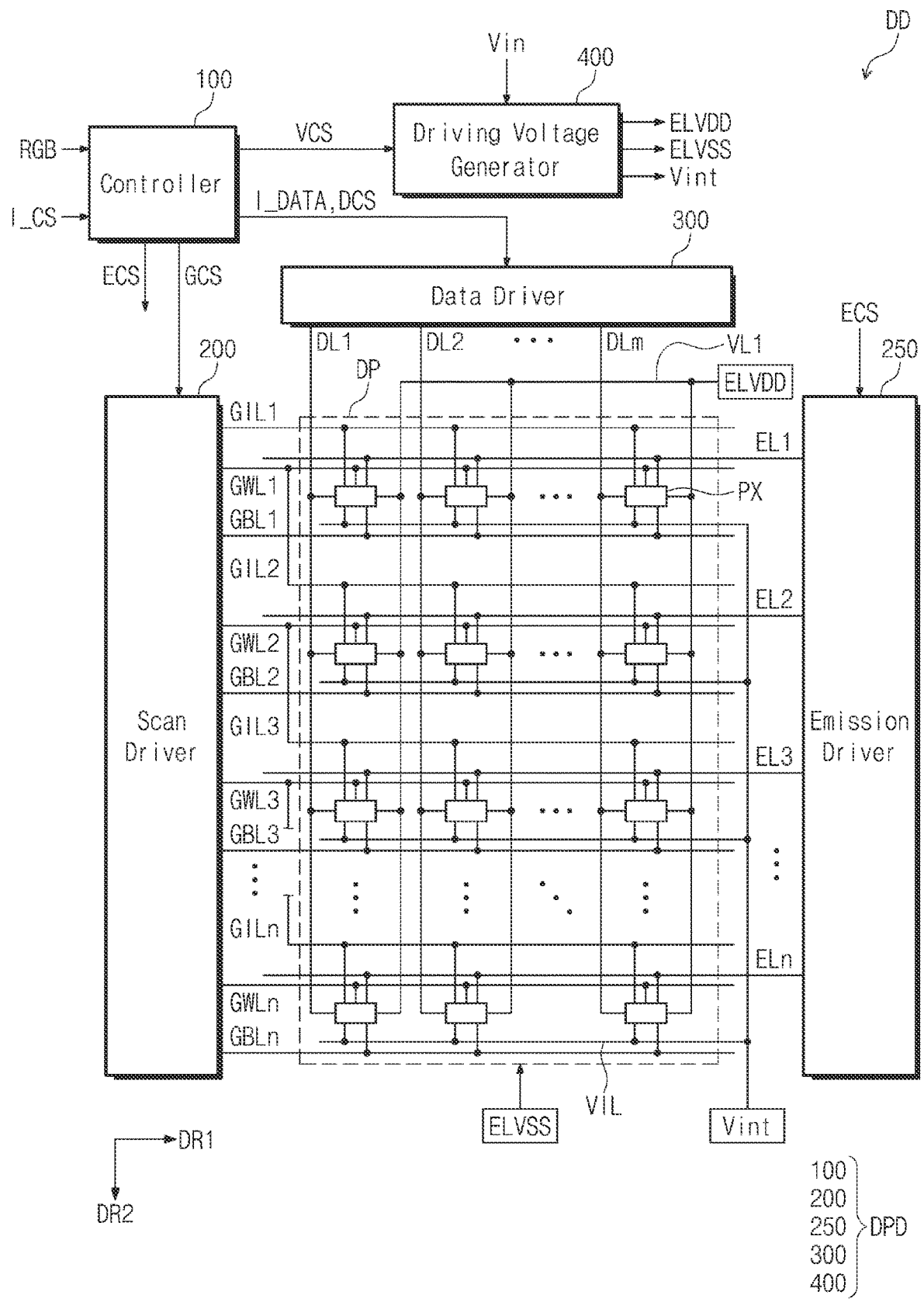
FIG. 2B is a schematic block diagram of a display device according to an embodiment of the disclosure.
Figure 3A:
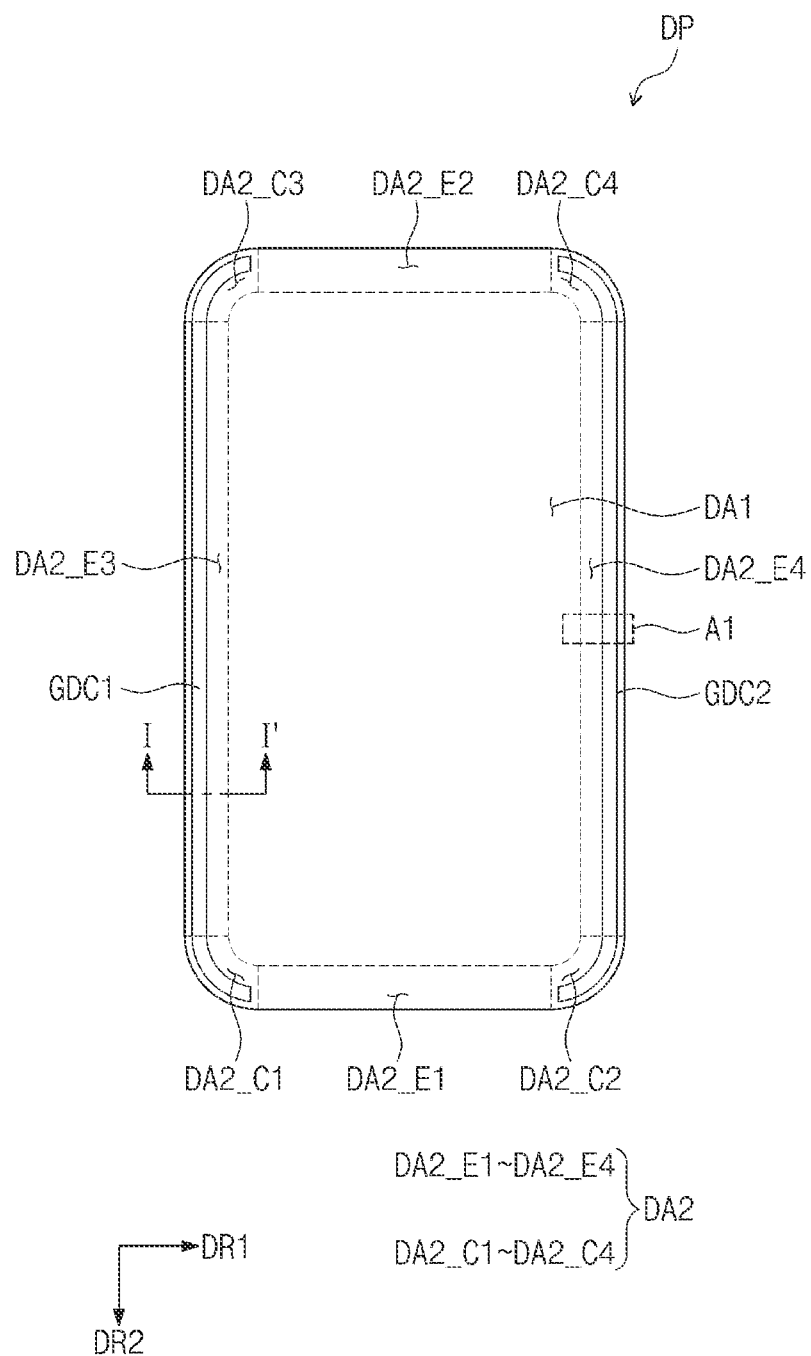
FIGS. 3A and 3B are plan views of a display panel according to embodiments of the disclosure.
Figure 3B:
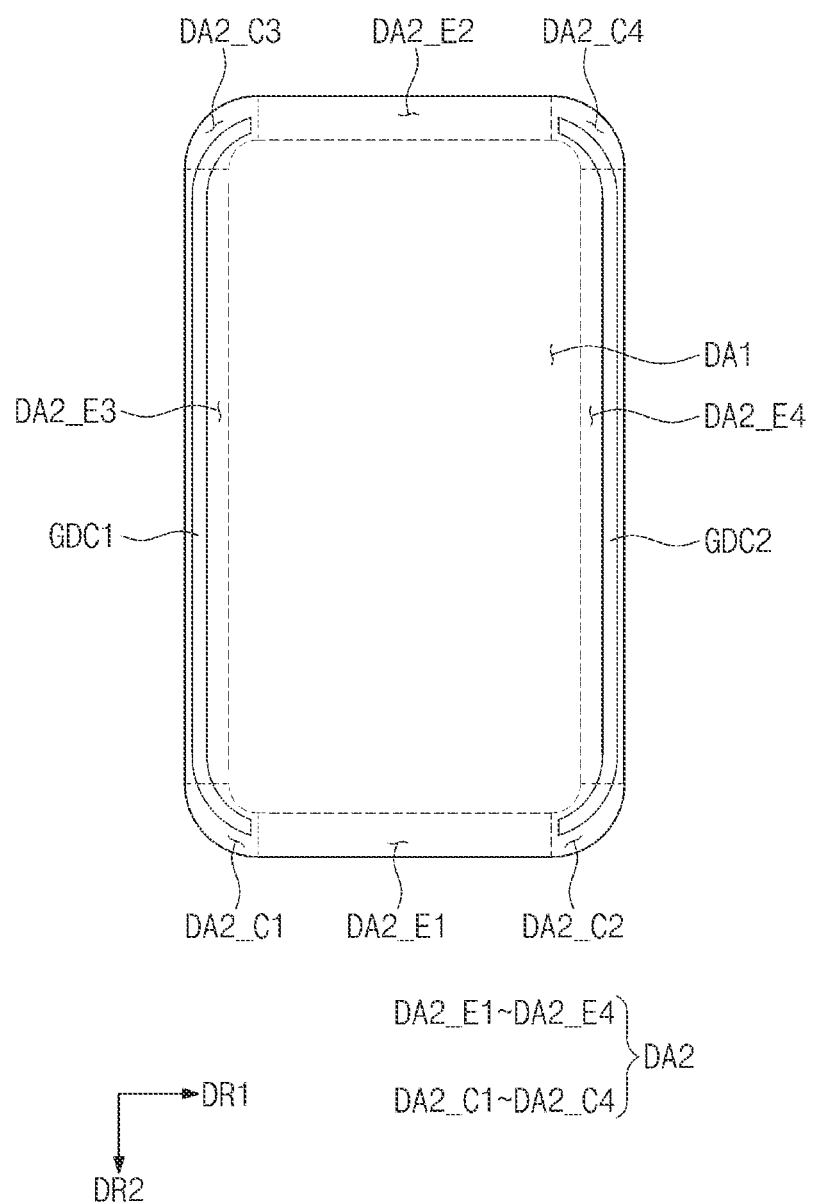

FIG. 2A is an exploded perspective view of a display device according to an embodiment of the disclosure. FIG. 2B is a schematic block diagram of a display device according to an embodiment of the disclosure. FIGS. 3A and 3B are plan views of a display panel according to embodiments of the disclosure.

Referring to FIG. 2A, the display device DD may include a window WM, a display panel DP, and a housing HU. The window WM may protect an upper surface of the display panel DP. The window WM may be optically transparent. As such, an image displayed in the display panel DP may penetrate the window WM and may be visually perceived by the user. For example, the display surface of the display device DD may be defined by the window WM. The window WM may be formed of glass, plastic, or film.

The window WM may have a curved structure. The window WM may include a front surface part FS and one or more curved parts bent from the front surface part FS. Herein, the front surface part FS and the one or more curved parts may be defined as a transmission part through which an image or light passes. The front surface part FS of the window WM may correspond to the first active area AA1 (refer to FIG. 1A) of the display device DD, and the one or more curved parts may correspond to the second active area AA2 (refer to FIG. 1A) of the display device DD.

For example, the window WM may include four curved parts, for example, a first curved part ES1, a second curved part ES2, a third curved part ES3, and a fourth curved part ES4. In an embodiment, the front surface part FS may be a plane defined by the first direction DR1 and the second direction DR2. The front surface part FS may be a plane perpendicular to the third direction DR3. Each of the first to fourth curved parts ES1 to ES4 may be bent from the front surface part FS. Each of the first curved part ES1 and the second curved part ES2 may be bent from the front surface part FS. The first curved part ES1 and the second curved part ES2 may be respectively bent from a first side and a second side of the front surface part FS. The first and second sides of the front surface part FS may be parallel to the first direction DR1. The first curved part ES1 and the second curved part ES2 may be disposed to be parallel to each other in (or to be aligned with) the first direction DR1. Each of the third curved part ES3 and the fourth curved part ES4 may be bent from the front surface part FS. In particular, the third curved part ES3 and the fourth curved part ES4 may be respectively bent from a third side and a fourth side of the front surface part FS. The third and fourth sides of the front surface part FS may be parallel to the second direction DR2. The third curved part ES3 and the fourth curved part ES4 may be disposed to be parallel to each other in (or to be aligned with) the second direction DR2.

The first to fourth curved parts ES1 to ES4 may be bent from the front surface part FS with the given curvature. For example, the first to fourth curved parts ES1 to ES4 may have the same curvature. As another embodiment of the disclosure, the first and second curved parts ES1 and ES2 may have the same curvature, the third and fourth curved parts ES3 and ES4 may have the same curvature, and the curvature of the first and second curved parts ES1 and ES2 may be different from the curvature of the third and fourth curved parts ES3 and ES4.

The window WM may further include at least one corner part. For example, the window WM may include four corner parts, for example, a first corner part CS1, a second corner part CS2, a third corner part CS3, and a fourth corner part CS4. Each of the first to fourth corner parts CS1 to CS4 may have two or more curvatures. Each of the first to fourth corner parts CS1 to CS4 may have a shape which curved surfaces having different curvatures are continuously connected.

The first corner part CS1 may be disposed between the first curved part ES1 and the third curved part ES3 and may connect the first curved part ES1 and the third curved part ES3. The second corner part CS2 may be disposed between the first curved part ES1 and the fourth curved part ES4 and may connect the first curved part ES1 and the fourth curved part ES4. The third corner part CS3 may be disposed between the second curved part ES2 and the third curved part ES3 and may connect the second curved part ES2 and the third curved part ES3. The fourth corner part CS4 may be disposed between the second curved part ES2 and the fourth curved part ES4 and may connect the second curved part ES2 and the fourth curved part ES4. Herein, each of the first to fourth corner parts CS1 to CS4 may be defined as a transmission part through which an image or light passes.

Referring to FIGS. 2A and 3A, the display panel DP may include a display area displaying an image. For example, the display area may include a first display area DA1 and a second display area DA2. The first display area DA1 may be disposed parallel to the front surface part FS of the window WM and may have a shape corresponding to the shape of the front surface part FS. For example, the first display area DA1 may be a planar display area having a planar shape. The second display area DA2 may be disposed to correspond to one or more curved parts and one or more corner parts. The second display area DA2 may have a curved shape corresponding to the one or more curved parts and the one or more corner parts. However, the shape of the second display area DA2 is not limited thereto. For example, the second display area DA2 may have a planar shape. The display panel DP may further include a non-display area adjacent to the second display area DA2. The non-display area may be an area in which an image is not displayed.

The second display area DA2 may include first to fourth edge display areas DA2_E1 to DA2_E4 that are disposed to correspond to the first to fourth curved parts ES1 to ES4, respectively. The first and second edge display areas DA2_E1 and DA2_E2 may be extended from first and second sides of the first display area DA1 and may be disposed to correspond to the first and second curved parts ES1 and ES2 of the window WM. The first and second sides of the first display area DA1 may be extended to be parallel to the first direction DR1. The first and second edge display areas DA2_E1 and DA2_E2 may be curved from the first display area DA1 with the given curvature.

The third and fourth edge display areas DA2_E3 and DA2_E4 may be extended from third and fourth sides of the first display area DA1 and may be disposed to correspond to the third and fourth curved parts ES3 and ES4 of the window WM. The third and fourth sides of the first display area DA1 may be extended to be parallel to the second direction DR2. The third and fourth edge display areas DA2_E3 and DA2_E4 may be curved from the first display area DA1 with the given curvature.

The display panel DP according to an embodiment of the disclosure is described above as having a structure in which the second display area DA2 includes 4 edge display areas DA2_E1 to DA2_E4, but the structure of the display panel DP according to an embodiment of the disclosure is not limited thereto. For example, the second display area DA2 of the display panel DP may include only one edge display area or may include two edge display areas that are provided on the first and second sides of the first display area DA1 or are provided on the third and fourth sides of the first display area DA1.

The second display area DA2 may further include first to fourth corner display areas DA2_C1 to DA2_C4 that are disposed to correspond to the first to fourth corner parts CS1 to CS4, respectively. The first corner display area DA2_C1 may be disposed between the first and third edge display areas DA2_E1 and DA2_E3, and the second corner display area DA2_C2 may be disposed between the first and fourth edge display areas DA2_E1 and DA2_E4. Also, the third corner display area DA2_C3 may be disposed between the second and third edge display areas DA2_E2 and DA2_E3, and the fourth corner display area DA2_C4 may be disposed between the second and fourth edge display areas DA2_E2 and DA2_E4. The first to fourth corner display areas DA2_C1 to DA2_C4 may be areas in which an image is substantially displayed. However, the disclosure is not limited thereto. For example, as another embodiment, the first to fourth corner display areas DA2_C1 to DA2_C4 may be areas in which an image is not displayed, or only some of the first to fourth corner display areas DA2_C1 to DA2_C4 may display an image.

The display panel DP according to an embodiment of the disclosure may be a light emitting display panel, but is not particularly limited thereto. For example, the display panel DP may be an organic light emitting display panel, an inorganic light emitting display panel, or a quantum dot light emitting display panel. An emission layer of the organic light emitting display panel may include an organic light emitting material. An emission layer of the inorganic light emitting display panel may include an inorganic light emitting material. An emission layer of the quantum dot light emitting display panel may include a quantum dot, a quantum rod, and the like.

The display panel DP may be a flexible display panel. As such, the display panel DP may be rolled entirely, or may be folded or unfolded about a folding axis.

The display device DD may further include an input sensing layer for sensing an external input (e.g., a touch event). The input sensing layer may be directly disposed on the display panel DP. According to an embodiment of the disclosure, the input sensing layer may be formed on the display panel DP through a subsequent process. For example, in case that the input sensing layer is directly disposed on the display panel DP, an adhesive film may not be interposed between the input sensing layer and the display panel DP. However, the disclosure is not limited thereto. An adhesive film may be interposed between the input sensing layer and the display panel DP. The input sensing layer may be not fabricated together with the display panel DP through the subsequent processes. In other words, after the input sensing layer is fabricated through a process independent of the process of fabricating the display panel DP, the input sensing layer may be fixed to an upper surface of the display panel DP through an adhesive film.

Referring to FIG. 2B, the display device DD may further include a panel driver DPD for driving the display panel DP. For example, the panel driver DPD may include a controller 100, a scan driver 200, an emission driver 250, a data driver 300, and a driving voltage generator 400.

The controller 100 may receive an image signal RGB and an input control signal I_CS and may generate image data I_DATA by converting a data format of the image signal RGB in compliance with the specification for an interface with the data driver 300. The controller 100 may convert and output the input control signal I_CS into various kinds of control signals DCS, GCS, and VCS.

The scan driver 200 may receive a scan control signal GCS from the controller 100. The scan control signal GCS may include a start vertical signal for initiating an operation of the scan driver 200, a clock signal for determining the output timing of signals, and etc. The scan driver 200 may generate multiple scan signals and may sequentially output the multiple scan signals to multiple scan lines GIL1 to GILn, GWL1 to GWLn, and GBL1 to GBLn to be described later.

The emission driver 250 may receive an emission driving signal ECS from the controller 100. The emission driver 250 may generate multiple emission control signals in response to the emission driving signal ECS and may output the multiple emission control signals to multiple emission control lines EL1 to ELn to be described later.

In FIG. 2B, the scan driver 200 and the emission driver 250 are provided in the display device DD as independent components, but the disclosure is not limited thereto. For example, the scan driver 200 and the emission driver 250 may be provided in the display device DD as one integrated component.

The data driver 300 may receive the data control signal DCS and the image data I_DATA from the controller 100. The data driver 300 may convert the image data I_DATA into data signals and may output the data signals to multiple data lines DL1 to DLm to be described later. The data signals may be analog voltages corresponding to gray scale values of the image data I_DATA.

The driving voltage generator 400 may receive a power supply voltage Vin from a power source (not illustrated). The driving voltage generator 400 may convert the power supply voltage Vin to generate a first driving voltage ELVDD and a second driving voltage ELVSS different in level from the first driving voltage ELVDD. The driving voltage generator 400 may include a DC-DC converter. The driving voltage generator 400 may include a boosting converter that steps up the power supply voltage Vin to generate the first driving voltage ELVDD. Also, the driving voltage generator 400 may include a buck converter that steps down the power supply voltage Vin to generate the second driving voltage ELVSS. The driving voltage generator 400 may receive the driving voltage control signal VCS from the controller 100. The driving voltage generator 400 may generate the first driving voltage ELVDD and the second driving voltage ELVSS in response to the driving voltage control signal VCS.

The driving voltage generator 400 may further generate an initialization voltage Vint. The initialization voltage Vint may be different in voltage level from the first driving voltage ELVDD and the second driving voltage ELVSS.

The display panel DP may include the multiple scan lines GIL1 to GILn, GWL1 to GWLn, and GBL1 to GBLn, the multiple emission control lines EL1 to ELn, the multiple data lines DL1 to DLm, and multiple pixels PX. The multiple scan lines GIL1 to GILn, GWL1 to GWLn, and GBL1 to GBLn may extend in the first direction DR1 and may be arranged in the second direction DR2 perpendicular to the first direction DR1. Each of the multiple emission control lines EL1 to ELn may be arranged in parallel with a corresponding scan line of the multiple scan lines GIL1 to GILn, GWL1 to GWLn, and GBL1 to GBLn. The multiple data lines DL1 to DLm may be insulated from and may cross the multiple scan lines GIL1 to GILn, GWL1 to GWLn, and GBL1 to GBLn in an isolation state.

Each of the multiple pixels PX may be electrically connected with a corresponding scan line of the multiple scan lines GIL1 to GILn, GWL1 to GWLn, and GBL1 to GBLn, a corresponding emission control line of the emission control lines EL1 to ELn, and a corresponding data line of the multiple data lines DL1 to DLm. An embodiment which three scan lines are connected with each of the multiple pixels PX is illustrated in FIG. 2B, but the disclosure is not limited thereto. For example, each of the multiple pixels PX may be electrically connected with two scan line or with four scan lines.

The display panel DP may receive the first driving voltage ELVDD and the second driving voltage ELVSS. The first driving voltage ELVDD may be provided to the multiple pixels PX through a first power supply voltage line VL1. The second driving voltage ELVSS may be provided to the multiple pixels PX through electrodes (not illustrated) or a second power supply voltage line formed in the display panel DP. The display panel DP may receive the initialization voltage Vint. The initialization voltage Vint may be provided to the multiple pixels PX through an initialization voltage line VIL.

Referring to FIGS. 2B, 3A and 3B, the scan driver 200 may include a first scan driver GDC1 and a second scan driver GDC2. Each of the first and second scan drivers GDC1 and GDC2 may generate multiple scan signals and may output the generated scan signals to corresponding pixels. The first and second scan drivers GDC1 and GDC2 may be embedded in the display panel DP. Herein, the expression "A is embedded in the display panel DP" may mean that A is directly formed in the display panel DP through a thin film process of forming the pixels PX.

The display panel DP may further include a non-display area around the second display area DA2. The non-display area may be an area in which an image is not substantially displayed. The non-display area may surround the second display area DA2.

Each of the first and second scan drivers GDC1 and GDC2 may be disposed in the second display area DA2 or may be disposed to partially overlap the second display area DA2. As each of the first and second scan drivers GDC1 and GDC2 is disposed in the second display area DA2 or overlaps the second display area DA2, a width of the non-display area of the display device DD may be prevented from increasing due to the first and second scan drivers GDC1 and GDC2. As a result, the area in which the first and second scan drivers GDC1 and GDC2 are disposed may be implemented as the second display area DA2 in which an image is displayed. This may mean a decrease of the size of the non-display area of the display device DD, which is perceivable by the user.

In FIG. 3A, the first scan driver GDC1 may be disposed adjacent to an outer side of the third edge display area DA2_E3, and the second scan driver GDC2 may be disposed adjacent to an outer side of the fourth edge display area DA2_E4. Also, the first scan driver GDC1 may be disposed adjacent to outer sides of the first and third corner display areas DA2_C1 and DA2_C3, and the second scan driver GDC2 may be disposed adjacent to outer sides of the second and fourth corner display area DA2_C2 and DA2_C4. However, locations of the first and second scan drivers GDC1 and GDC2 are not limited thereto.

As illustrated in FIG. 3B, the first scan driver GDC1 may be disposed adjacent to the first display area DA1 in the first and third corner display areas DA2_C1 and DA2_C3, and the second scan driver GDC2 may be disposed adjacent to the first display area DA1 in the second and fourth corner display area DA2_C2 and DA2_C4. In the first to fourth corner display areas DA2_C1 to DA2_C4, a bending stress may increase from the first display area DA1 toward the outside. In the case where the first and second scan drivers GDC1 and GDC2 are disposed adjacent to the outer sides in the first to fourth corner display areas DA2_C1 to DA2_C4, the bending stress may affect operations of the first and second scan drivers GDC1 and GDC2. Accordingly, the reduction of reliability of the first and second scan drivers GDC1 and GDC2 due to the bending stress may be prevented by disposing the first and second scan drivers GDC1 and GDC2 in the first to fourth corner display areas DA2_C1 to DA2_C4 to be adjacent to the first display area DA1.

In an embodiment of the disclosure, a first image displayed in the first display area DA1 and a second image displayed in the second display area DA2 may depend on each other. For example, one picture, one scene of a movie, or an UX/UI design may be formed by a combination of the first image and the second image. However, the disclosure is not limited thereto. For example, a partial display area of the second display area DA2, for example, the first to fourth corner display areas DA2_C1 to DA2_C4 may display a black image independent of the first image or may display a given pattern image.

For example, the display panel DP may be an organic light emitting display panel, an electrophoretic display panel, or an electrowetting display panel. Also, the display panel DP may be a flexible display panel that is capable of being curved depending on a shape of the window WM.

Returning back to FIG. 2A, the display panel DP may further include a pad area PP that is extended from the second display area DA2. A driver chip D-IC and pads may be disposed in the pad area PP of the display panel DP. The driver chip D-IC may include the data driver 300 (refer to FIG. 2B). The driver chip D-IC in which the data driver 300 is embedded may provide data signals to the first and second display areas DA1 and DA2 of the display panel DP. The driver chip D-IC may include the driving voltage generator 400 (refer to FIG. 2B). The driver chip D-IC may supply the first and second driving voltages ELVDD and ELVSS and the initialization voltage Vint to the first and second display areas DA1 and DA2.

For example, the driver chip D-IC may be mounted on the display panel DP. The display panel DP may be electrically connected with a flexible circuit film FCB through the pads. In an embodiment of the disclosure, the driver chip D-IC may be mounted on the flexible circuit film FCB.

The housing HU may include a bottom part BP and a side wall SW. The side wall SW may be extended from the bottom part BP. The housing HU may accommodate the display panel DP in an accommodation space defined by the bottom part BP and the side wall SW. The window WM may be connected to the side wall SW of the housing HU. The side wall SW of the housing HU may support a periphery of the window WM.

The housing HU may include a material having relatively high rigidity. For example, the housing HU may include glass, plastic, or metal or may include multiple frames and/or plates that are composed of glass, plastic, metal, or a combination thereof. The housing HU may stably protect components of the display device DD accommodated in an inner space from an external impact.

Figure 4A:
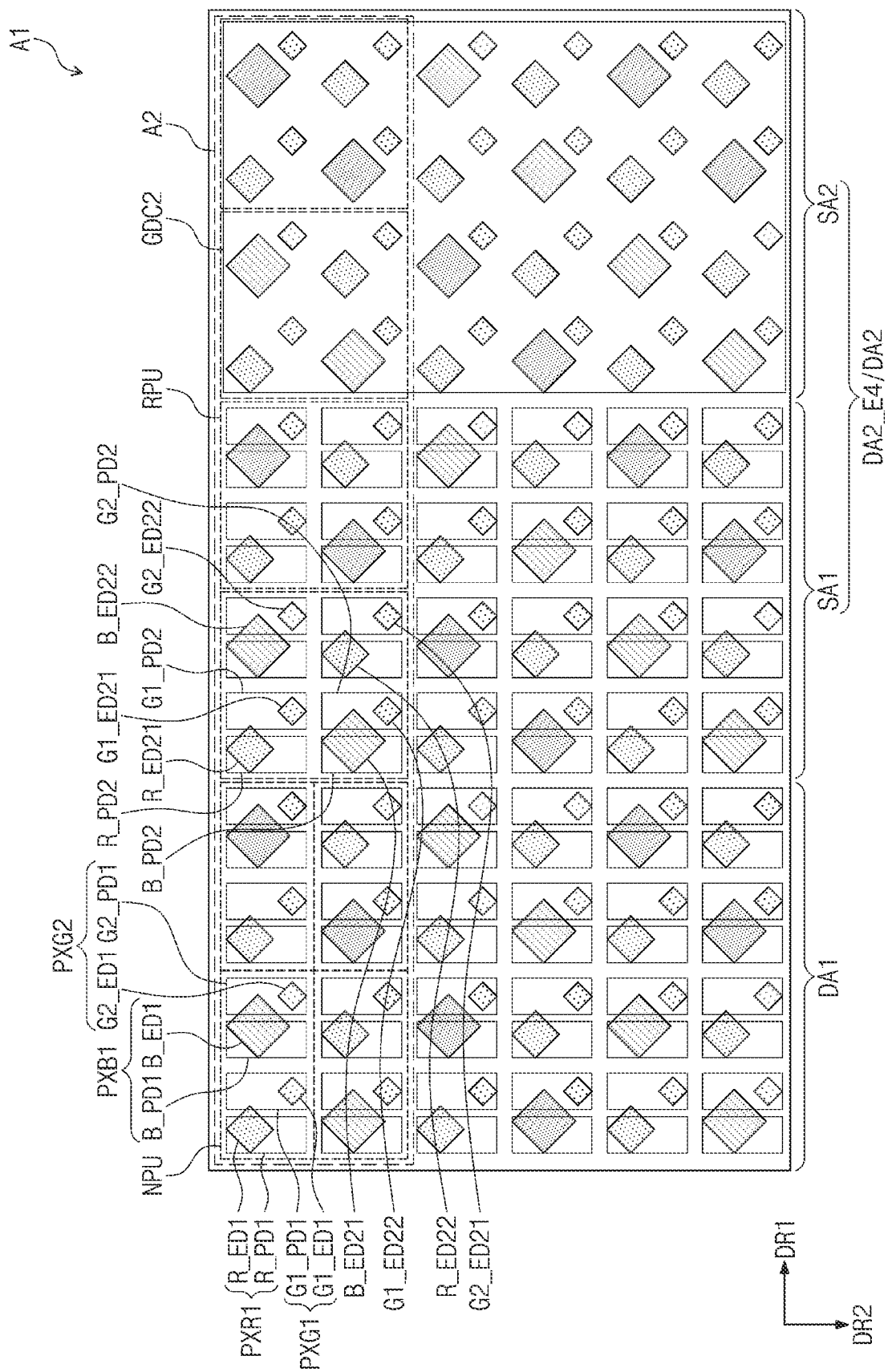
FIG. 4A is an enlarged plan view of area A1 illustrated in FIG. 3A according to an embodiment of the disclosure.

FIG. 4A is an enlarged plan view of area A1 illustrated in FIG. 3A according to an embodiment of the disclosure, and FIG. 4B is a schematic diagram illustrating a connection relationship between light emitting elements and driving circuits of area A2 illustrated in FIG. 4A. FIG. 4C is a schematic diagram illustrating a connection relationship between driving circuits and data lines illustrated in FIG. 4A.

Referring to FIGS. 4A and 4B, multiple normal pixel parts NPU may be repeatedly disposed in the first and second directions DR1 and DR2 in the first display area DA1 of the display panel DP (refer to FIG. 3A). Each of the normal pixel parts NPU may include multiple normal pixels. Each normal pixel may include a red pixel, a blue pixel, or a green pixel. For example, each of the normal pixel parts NPU may include one red pixel, two green pixels, and one blue pixel.

For convenience of description, in each of the normal pixel parts NPU, a red pixel is referred to as a "first red pixel PXR1", and a blue pixel is referred to as a "first blue pixel PXB1". Also, among the green pixels included in each of the normal pixel parts NPU, a green pixel adjacent to the first red pixel PXR1 is referred to as a "first green pixel PXG1", and a green pixel adjacent to the first blue pixel PXB1 is referred to as a "second green pixel PXG2". The number of normal pixels included in each of the normal pixel parts NPU is not limited thereto and may be variously changed.

The first red pixel PXR1 may include a first red driving circuit R_PD1 and a first red light emitting element R_ED1. The first red driving circuit R_PD1 may be electrically connected with the first red light emitting element R_ED1 corresponding thereto and may control the driving of the first red light emitting element R_ED1. The first green pixel PXG1 may include a first green driving circuit G1_PD1 and a first green light emitting element G1_ED1. The first green driving circuit G1_PD1 may be electrically connected with the first green light emitting element G1_ED1 corresponding thereto and may control the driving of the first green light emitting element G1_ED1. The second green pixel PXG2 may include a second green driving circuit G2_PD1 and a second green light emitting element G2_ED1. The second green driving circuit G2_PD1 may be electrically connected with the second green light emitting element G2_ED1 corresponding thereto and may control the driving of the second green light emitting element G2_ED1. The first blue pixel PXB1 may include a first blue driving circuit B_PD1 and a first blue light emitting element B_ED1. The first blue driving circuit B_PD1 may be electrically connected with the first blue light emitting element B_ED1 corresponding thereto and may control the driving of the first blue light emitting element B_ED1. The first red light emitting element R_ED1 may emit a red light; each of the first and second green light emitting elements G1_ED1 and G2_ED1 may emit a green light; the first blue light emitting element B_ED1 may emit a blue light.

The first red driving circuit R_PD1 may be disposed to overlap the first red light emitting element R_ED1 electrically connected therewith, and the first blue driving circuit B_PD1 may be disposed to overlap the first blue light emitting element B_ED1 electrically connected therewith. The first green driving circuit G1_PD1 may be disposed to overlap the first green light emitting element G1_ED1 electrically connected therewith, and the second green driving circuit G2_PD1 may be disposed to overlap the second green light emitting element G2_ED1 electrically connected therewith.

The fourth edge display area DA2_E4 of the second display area DA2 may include a first sub-area SA1 and a second sub-area SA2. Only the fourth edge display area DA2_E4 of the second display area DA2 is illustrated in FIGS. 4A and 4B, but at least one of the first to third edge display areas DA2_E1 to DA2_E3 (refer to FIG. 3A) and the first to fourth corner display areas DA2_C1 to DA2_C4 (refer to FIG. 3A) of the second display area DA2 may have a structure similar to that of the fourth edge display area DA2_E4. Accordingly, the fourth edge display area DA2_E4 will be described with reference to FIGS. 4A and 4B, and additional description associated with the remaining areas of the second display area DA2 will be omitted to avoid redundancy. However, for convenience, the fourth edge display area DA2_E4 will be referred to as the "second display area DA2" in the description to be given with reference to FIGS. 4A and 4B.

Multiple base pixel parts RPU may be repeatedly disposed in the first and second directions DR1 and DR2 in the second display area DA2 of the display panel DP. Each of the base pixel parts RPU may include multiple base pixels. Each of the multiple base pixels may include a red pixel, a blue pixel, or a green pixel. For example, each of the base pixel parts RPU may include two red pixels, four green pixels, and two blue pixels. For convenience of description, in each of the base pixel parts RPU, a red pixel is referred to as a "second red pixel PXR2", and a blue pixel is referred to as a "second blue pixel PXB2". Also, among the green pixels included in each of the base pixel parts RPU, a green pixel adjacent to the second red pixel PXR2 is referred to as a "third green pixel PXG3", and a green pixel adjacent to the second blue pixel PXB2 is referred to as a "fourth green pixel PXG4".

Each of the base pixel parts RPU may include the second red pixel PXR2, the third green pixel PXG3, the fourth green pixel PXG4, and the second blue pixel PXB2. Each of the base pixel parts RPU may include "k" second red light emitting elements R_ED21 and R_ED22, "j" green light emitting elements G1_ED21, G1_ED22, G2_ED21, and G2_ED22, and "k" second blue light emitting elements B_ED21 and B_ED22. Herein, each of "k" and "j" may be a natural number more than or equal to 1, and "j" may be greater than "k". For example, "j" may be 2k. For example, "k" may be 2; and "j" may be 4.

Two second red light emitting elements R_ED21 and R_ED22 may be included in the second red pixel PXR2, and two second blue light emitting elements B_ED21 and B_ED22 may be included in the second blue pixel PXB2. Some of four green light emitting elements, for example, two green light emitting elements (hereinafter referred to as a third green light emitting element G1_ED21/G1_ED22) may be included in the third green pixel PXG3, and the others thereof, for example, two green light emitting elements (hereinafter referred to as a fourth green light emitting element G2_ED21/G2_ED22) may be included in the fourth green pixel PXG4.

Each of the second red light emitting elements R_ED21 and R_ED22 may output a red light, and each of the second blue light emitting elements B_ED21 and B_ED22 may output a blue light. Each of the third green light emitting elements G1_ED21 and G1_ED22 and the fourth green light emitting elements G2_ED21 and G2_ED22 may output a green light.

Each of the base pixel parts RPU may include a second red driving circuit R_PD2, third and fourth green driving circuits G1_PD1 and G2_PD2, and a second blue driving circuit B_PD2. The second red driving circuit R_PD2 may be electrically connected in common with "k" second red light emitting elements R_ED21 and R_ED22, and the second blue driving circuit B_PD2 may be electrically connected in common with "k" second blue light emitting elements B_ED21 and B_ED22. The third green driving circuit G1_PD2 may be electrically connected in common with "j/2" third green light emitting elements G1_ED21 and G1_ED22, and the fourth green driving circuit G_PD4 may be electrically connected in common with "j/2" fourth green light emitting elements G2_ED21 and G2_ED22.

In case that "k" is 2 and "j" is 4, the second red driving circuit R_PD2 may be directly connected with one (e.g., referred to as a "main (or reference) red light emitting element R_ED21") of two second red light emitting elements R_ED21 and R_ED22, and may be connected with another (e.g., referred to as a "sub (or copy) red light emitting element R_ED22") through a connection line. The second red driving circuit R_PD2 may simultaneously control the driving of the two second red light emitting elements R_ED21 and R_ED22. For example, the second red driving circuit R_PD2 may send second red image data to the two second red light emitting elements R_ED21 and R_ED22 in common.

The second blue driving circuit B_PD2 may be directly connected with one (e.g., referred to as a "main (or reference) blue light emitting element B_ED21") of two second blue light emitting elements B_ED21 and B_ED22, and may be connected with another (e.g., referred to as a "sub (or copy) blue light emitting element B_ED22") through a connection line. The second blue driving circuit B_PD2 may simultaneously control the driving of the two blue light emitting elements B_ED21 and B_ED22. For example, the second blue driving circuit B_PD2 may send second blue image data to the two second blue light emitting elements B_ED21 and B_ED22 in common.

The third green driving circuit G1_PD2 may be directly connected with one (e.g., referred to as a "first main (or reference) green light emitting element G1_ED21") of two third green light emitting elements G1_ED21 and G1_ED22, and may be connected with another (e.g., referred to as a "first sub (or copy) green light emitting element G1_ED22") through a connection line. The fourth green driving circuit G2_PD2 may be directly connected with one (e.g., referred to as a "second main (or reference) green light emitting element G2_ED21") of two fourth green light emitting elements G2_ED21 and G2_ED22, and may be connected with another (e.g., referred to as a "second sub (or copy) green light emitting element G2_ED22") through a connection line. The third green driving circuit G1_PD2 may simultaneously control the driving of the two third green light emitting elements G1_ED21 and G1_ED22, and the fourth green driving circuit G2_PD2 may simultaneously control the driving of the two fourth green light emitting elements G2_ED21 and G2_ED22. For example, the third green driving circuit G1_PD2 may send third green image data to the two third green light emitting elements G1_ED21 and G1_ED22 in common, and the fourth green driving circuit G2_PD2 may send fourth green image data to the two fourth green light emitting elements G2_ED21 and G2_ED22 in common.

The number of second red light emitting elements R_ED21 and R_ED22 electrically connected with the second red driving circuit R_PD2 and the number of second blue light emitting elements B_ED21 and B_ED22 electrically connected with the second blue driving circuit B_PD2 may not be particularly limited and may be variously changed. As another example, the number of second red light emitting elements R_ED21 and R_ED22 electrically connected in common with the second red driving circuit R_PD2 may be different from the number of second blue light emitting elements B_ED21 and B_ED22 electrically connected in common with the second blue driving circuit B_PD2.

The number of third green light emitting elements G1_ED21 and G1_ED22 electrically connected in common with the third green driving circuit G1_PD2 and the number of fourth green light emitting elements G2_ED21 and G2_ED22 electrically connected in common with the fourth green driving circuit G2_PD2 may not be particularly limited and may be variously changed. Also, the number of third green light emitting elements G1_ED21 and G1_ED22 electrically connected in common with the third green driving circuit G1_PD2 may be different from the number of second red light emitting elements R_ED21 and R_ED22 electrically connected in common with the second red driving circuit R_PD2.

Each of the second red light emitting elements R_ED21 and R_ED22 may have the same shape and the same size as the first red light emitting element R_ED1. Each of the third green light emitting elements G1_ED21 and G1_ED22 and the fourth green light emitting elements G2_ED21 and G2_ED22 may have the same shape and the same size as the first green light emitting element G1_ED1 and/or the second green light emitting element G2_ED1. Each of the second blue light emitting elements B_ED21 and B_ED22 may have the same shape and the same size as the first blue light emitting element B_ED1.

The second display area DA2 may include the first sub-area SA1 and the second sub-area SA2. In detail, the fourth edge display area DA2_E4 of the second display area DA2 may be divided into the first sub-area SA1 and the second sub-area SA2. Although not illustrated in FIG. 4A, the third edge display area DA2_E3 (refer to FIG. 3A) of the second display area DA2 may also be divided into the first sub-area SA1 and the second sub-area SA2. The first sub-area SA1 may be disposed between the second sub-area SA2 and the first display area DA1.

The driving circuits R_PD2, G1_PD2, G2_PD2, and B_PD2 included in each of the base pixel parts RPU may be disposed in the first sub-area SA1, and the first and second scan drivers GDC1 and GDC2 may be disposed in the second sub-area SA2. Accordingly, the driving circuits R_PD2, G1_PD2, G2_PD2, and B_PD2 may not overlap the second scan driver GDC2 (or the first scan driver GDC1). The light emitting elements included in each of the base pixel parts RPU may be disposed in the first sub-area SA1 or the second sub-area SA2. The light emitting elements disposed in the second sub-area SA2 may overlap the second sub-area SA2 (or the first scan driver GDC1) in a plan view.

Referring to FIG. 4C, a first data line group DG1 including data lines DL1_1 to DL1_8 electrically connected with the normal pixel parts NPU may be disposed in the first display area DA1, and a second data line group DG2 including data lines DL2_1 to DL2_8 electrically connected with the base pixel parts RPU may be disposed in the second display area DA2. For convenience of description, 8 data lines DL1_1 to DL1_8 of data lines included in the first data line group DG1 are illustrated in FIG. 4C, and 8 data lines DL2_1 to DL2_8 of data lines included in the second data line group DG2 are illustrated in FIG. 4C. However, the number of data lines included in each of the first and second data line groups DG1 and DG2 is not limited thereto.

Four data lines DL1_1 to DL1_4 or DL1_5 to DL1_8 may be electrically connected with each of the normal pixel parts NPU illustrated in FIG. 4C. One first red driving circuit R_PD1, one first blue driving circuit B_PD1, one first green driving circuit G1_PD1, and one second green driving circuit G2_PD1 may be included in each of the normal pixel parts NPU. For example, the four data lines DL1_1 to DL1_4 or DL1_5 to DL1_8 may be required to drive four light emitting elements included in each normal pixel part NPU.

Two data lines (e.g., DL2_1 and DL2_2) may be electrically connected with each of the base pixel parts RPU. One second red driving circuit R_PD2, one second blue driving circuit B_PD2, one third green driving circuit G1_PD2, and one fourth green driving circuit G2_PD2 may be included in each of the base pixel parts RPU. For example, two data lines DL2_1 and DL2_2 may be required to drive eight light emitting elements included in each base pixel part RPU.

Figure 5A:
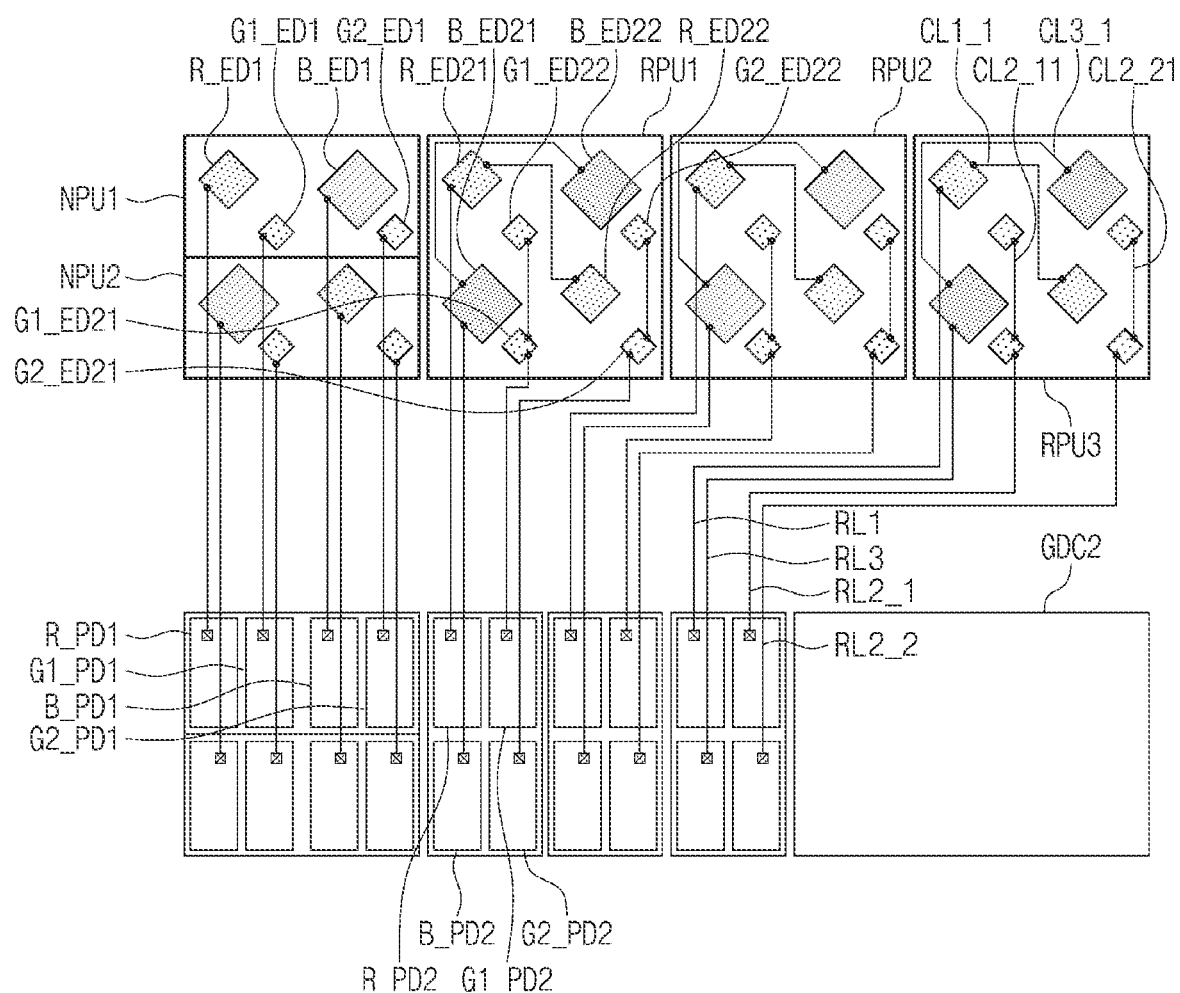
FIG. 5A is a plan view illustrating a connection structure of each of base pixel parts of a 2×2 structure according to an embodiment of the disclosure.
Figure 5B:
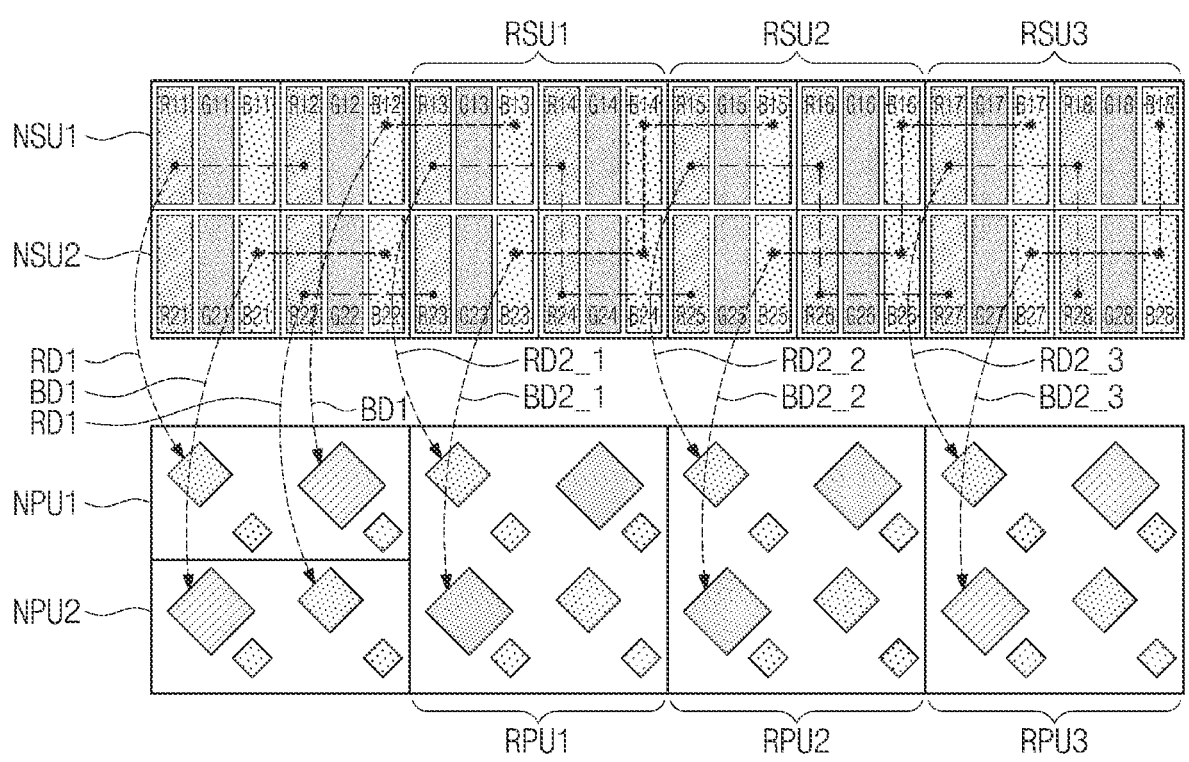
FIG. 5B is a schematic diagram illustrating a process of rendering image signals according to an embodiment of the disclosure.

FIG. 5A is a plan view illustrating a connection structure of each of base pixel parts of a 2×2 structure according to an embodiment of the disclosure. FIG. 5B is a schematic diagram illustrating a process of rendering image signals according to an embodiment of the disclosure.

Referring to FIG. 5A, the second red driving circuit R_PD2 may be electrically connected with one (e.g., the second red light emitting element R_ED21) of the two second red light emitting elements R_ED21 and R_ED22 through a first routing line RL1. The second blue driving circuit B_PD2 may be electrically connected with one (e.g., the second blue light emitting element B_ED21) of the two second blue light emitting elements B_ED21 and B_ED22 through a third routing line RL3.

The two second red light emitting elements R_ED21 and R_ED22 may be electrically connected with each other through a first connection line CL1_1. Accordingly, even though the second red driving circuit R_PD2 is electrically connected with one second red light emitting element R_ED21 of the two second red light emitting elements R_ED21 and R_ED22, the two second red light emitting elements R_ED21 and R_ED22 may operate at the same time and may emit lights with substantially the same intensity. Likewise, the two second blue light emitting elements B_ED21 and B_ED22 may be electrically connected with each other through a third connection line CL3_1. Accordingly, even though the second blue driving circuit B_PD2 is electrically connected with one second blue light emitting element B_ED21 of the two second blue light emitting elements B_ED21 and B_ED22, the two second blue light emitting elements B_ED21 and B_ED22 may operate at the same time and may emit lights with substantially the same intensity.

The third green driving circuit G1_PD2 may be electrically connected with one (e.g., the third green light emitting element G1_ED21) of the two third green light emitting elements G1_ED21 and G1_ED22 through the first sub-routing line RL2_1. The fourth green driving circuit G2_PD2 may be electrically connected with one (e.g., the fourth green light emitting element G2_ED21) of the two fourth green light emitting elements G2_ED21 and G2_ED22 through the second sub-routing line RL2_2. The two third green light emitting elements G1_ED21 and G1_ED22 may be electrically connected with each other through a first sub-connection line CL2_11, and the two fourth green light emitting elements G2_ED21 and G2_ED22 may be electrically connected with each other through a second sub-connection line CL2_21.

Referring to FIGS. 5A and 5B, the first red pixel PXR1 may receive a first red data signal corresponding to first red image data RD1, and the first green pixel PXG1 may receive a first green data signal corresponding to first green image data. The second green pixel PXG2 may receive a second green data signal corresponding to second green image data, and the first blue pixel PXB1 may receive a first blue data signal corresponding to first blue image data BD1.

The second red pixel PXR2 may receive a second red data signal corresponding to second red image data RD2_1, RD2_2, or RD2_3, and the third green pixel PXG3 may receive a third green data signal corresponding to third green image data. The fourth green pixel PXG4 may receive a fourth green data signal corresponding to fourth green image data, and the second blue pixel PXB2 may receive a second blue data signal corresponding to second blue image data BD2_1, BD2_2, or BD2_3.

The controller 100 (refer to FIG. 2B) may receive the image signals RGB (refer to FIG. 2B) and may perform rendering on the image signals RGB such that the first red image data RD1 and the second red image data RD2_1, RD2_2, and RD2_3, the first to fourth green image data, and the first blue image data BD1 and the second blue image data BD2_1, BD2_2, and BD2_3 may be generated.

Image signals corresponding to normal pixel parts (e.g., NPU1 and NPU2) among the image signals RGB may be referred to as "first image signals", and image signals corresponding to base pixel parts (e.g., RPU1, RPU2, and RPU3) among the image signals RGB may be referred to as "second image signals". The first image signals may be classified into multiple normal signal parts (e.g., NSU1 and NSU2). The second image signals may be classified into multiple base signal parts RSU1, RSU2, and RSU3, each of which may include "m*n" second red image signals, "m*n" green image signals, and "m*n" second blue image signals. Herein, each of "m" and "n" may be a natural number of 2 or more. For example, each of the normal signal parts NSU1 and NSU2 may include "(m*n)/k" first red image signals, "(m*n)/j" first green image signals, "(m*n)/j" second green image signals, and "(m*n)/k" first blue image signals. Herein, "m" may be "2", "n" may be "2", "k" may be "2", and "j" may be "4". Each of the normal signal parts NSU1 and NSU2 may include two first red image signals (e.g., R11 and R12), one first green image signal (e.g., G11), one second green image signal (e.g., G12), and two first blue image signals (e.g., B11 and B12).

The controller 100 may generate the first red image data RD1 by rendering the two first red image signals R11 and R12 included in at least one normal signal part (e.g., the first normal signal part NSU1) of the multiple normal signal parts NSU1 and NSU2. The controller 100 may generate the first blue image data BD1 by rendering one (e.g., B12) of the two first blue image signals B11 and B12 included in the first normal signal part NSU1 of the multiple normal signal parts NSU1 and NSU2 and one normal-referenced signal (meaning a signal to be referenced by a normal signal unit) (e.g., a referenced blue signal B13) included in a normal-referenced part (meaning a signal part to be referenced by a normal signal unit) adjacent to the first normal signal part NSU1. The controller 100 may convert the first and second green image signals G11 and G12 included in the first normal signal part NSU1 into the first and second green image data, respectively. Each of the first red image signals R11 and R12 and the first blue image signals B11 and B12 may be referred to as a "normal color image signal", and each of the first red image data RD1 and the first blue image data BD1 may be referred to as "normal color image data".

The controller 100 may generate the first red image data RD1 by rendering one (e.g., R22) of the two first red image signals R21 and R22 included in another normal signal part (e.g., the second normal signal part NSU2) of the multiple normal signal parts NSU1 and NSU2 and one normal-referenced signal (e.g., a referenced red signal R23) included in a normal-referenced part adjacent to the second normal signal part NSU2. Also, the controller 100 may generate the first blue image data BD1 by rendering the two first blue image signals B21 and B22 included in the second normal signal part NSU2. The controller 100 may convert the first and second green image signals G21 and G22 included in the second normal signal part NSU2 into the first and second green image data, respectively.

A normal-referenced part may be a normal signal part adjacent thereto or may be a base signal part adjacent thereto. In particular, in the case where the first and second normal signal parts NSU1 and NSU2 correspond to normal pixel parts disposed adjacent to a boundary of the first and second display areas DA1 and DA2, a normal-referenced part associated with each of the first and second normal signal parts NSU1 and NSU2 may be a base signal part immediately adjacent thereto.

Three base pixel parts RPU1, RPU2, and RPU3 are illustrated in FIG. 5A as an embodiment, and three base signal parts RSU1, RSU2, and RSU3 respectively corresponding to the base pixel parts RPU1, RPU2, and RPU3 are illustrated in FIG. 5B as an embodiment. For convenience of description, the three base signal parts RSU1, RSU2, and RSU3 are respectively referred to as a "first base signal part RSU1", a "second base signal part RSU2", and a "third base signal part RSU3". Also, the three base pixel parts RPU1, RPU2, and RPU3 are respectively referred to as a "first base pixel part RPU1", a "second base pixel part RPU2", and a "third base pixel part RPU3".

The controller 100 may generate the second red image data RD2_1, RD2_2, or RD2_3 by rendering "p" second red image signals of "m*n" second red image signals included in a corresponding base signal part of the multiple base signal parts RSU1, RSU2, and RSU3 and "(m*n)–p" referenced red signals (or referenced criterion signals meaning signals corresponding to a criterion color to be referenced) included in a signal part (hereinafter referred to as a "first referenced signal part") adjacent to the corresponding base signal part. Herein, "p" may be a natural number of 2 or more, and "p" may be a natural number less than a product of "m" and "n". For example, in case that "p" is 3, the controller 100 may generate the second red image data RD2_1, RD2_2, or RD2_3 by rendering three second red image signals and one referenced red signal. For example, the first referenced signal part may be another base signal part adjacent to the corresponding base signal part. The second red image signals may be referred to as a "reference color image signal", and the second red image data may be referred to as "reference color image data".

To drive the first base pixel part RPU1, the controller 100 may generate the second red image data RD2_1, the third green image data, the fourth green image data, and the second blue image data BD2_1 based on the first base signal part RSU1. To drive the second base pixel part RPU2, the controller 100 may generate the second red image data RD2_2, the third green image data, the fourth green image data, and the second blue image data BD2_2 based on the second base signal part RSU2. To drive the third base pixel part RPU3, the controller 100 may generate the second red image data RD2_3, the third green image data, the fourth green image data, and the second blue image data BD2_3 based on the third base signal part RSU3.

To generate the second red image data RD2_1, the controller 100 may render three second red image signals R13, R14, and R24 included in the first base signal part RSU1 and one referenced red signal (e.g., R25) included in the first referenced signal part (e.g., the second base signal part RSU2). For example, the one referenced red signal R25 may be one second red image signal R25 included in the second base signal part RSU2. To generate the second red image data RD2_2, the controller 100 may render three second red image signals R15, R16, and R26 included in the second base signal part RSU2 and one referenced red signal (e.g., R27). For example, the one referenced red signal R27 may be one second red image signal R27 included in the third base signal part RSU3. To generate the second red image data RD2_3, the controller 100 may render three second red image signals R17, R18, and R28 included in the third base signal part RSU3.

The controller 100 may generate the second blue image data BD2_1, BD2_2, or BD2_3 by rendering "q" second blue image signals of "m*n" second blue image signals included in a corresponding base signal part of the multiple base signal parts RSU1, RSU2, and RSU3 and "(m*n)–q" referenced blue signals (or referenced criterion signals) included in a signal part (hereinafter referred to as a "second referenced signal part") adjacent to the corresponding base signal part. Herein, "q" may be a natural number of 2 or more, and "q" may be a natural number less than a product of "m" and "n". For example, in case that "q" is 3, the controller 100 may generate the second blue image data BD2_1, BD2_2, or BD2_3 by rendering three second blue image signals and one referenced blue signal. For example, the second referenced signal part may be another base signal part adjacent to the corresponding base signal part. The second blue image signals may be referred to as "reference color image signals", and the second blue image data may be referred to as "reference color image data".

To generate the second blue image data BD2_1, the controller 100 may render three second blue image signals B14, B23, and B24 included in the first base signal part RSU1 and one referenced blue signal (e.g., B15) included in the second referenced signal part (e.g., the second base signal part RSU2). For example, the one referenced blue signal B15 may be one second blue image signal B15 included in the second base signal part RSU2. To generate the second blue image data BD2_2, the controller 100 may render three second blue image signals B16, B25, and B26 included in the second base signal part RSU2 and one referenced blue signal (e.g., B17) included in the second referenced signal part (e.g., the third base signal part RSU3). For example, the one referenced blue signal B17 may be one second blue image signal B17 included in the third base signal part RSU3. To generate the second blue image data BD2_3, the controller 100 may render three second blue image signals B18, B27, and B28 included in the third base signal part RSU3.

A structure in which the second display area DA2 is disposed on a first side (e.g., a right side) of the first display area DA1 is illustrated in FIGS. 5A and 5B. Each of the first and second referenced signal parts may be disposed on a first side (e.g., a right side) of a corresponding base signal part. However, the disclosure is not limited thereto. For example, in the case where the second display area DA2 is disposed on a second side (e.g., a left side) of the first display area DA1, each of the first and second referenced signal parts may be disposed on a second side (e.g., a left side) of a corresponding base signal part.

Also, an embodiment in which the referenced red signal (e.g., R25) and the referenced blue signal (e.g., B15) are disposed at different rows is illustrated in FIG. 5A, but the disclosure is not limited thereto. For example, the referenced red signal and the referenced blue signal may be disposed at the same row.

The remaining, for example, "(m*n)–p" second red image signals other than "p" second red image signals of a corresponding base signal part may be referred to as "non-referenced red signals", and the remaining, for example, "(m*n)–q" second blue image signals other than "q" second blue image signals of the corresponding base signal part may be referred to as "non-referenced blue signals". The non-referenced red signal and the referenced red signal may be placed at the same row, and the non-referenced blue signal and the referenced blue signal may be placed at the same row.

For example, the first base signal part RSU1 may include a first non-referenced red signal R23; and the referenced red signal R25 of the first referenced signal part (e.g., the second base signal part RSU2) may be placed at the same row as the first non-referenced red signal R23. Also, the first base signal part RSU1 may include a first non-referenced blue signal B13; and the referenced blue signal B15 of the second referenced signal part (e.g., the second base signal part RSU2) may be placed at the same row as the first non-referenced blue signal B13.

To generate the third green image data corresponding to the first base pixel part RPU1, the controller 100 may render two green image signals (e.g., G13 and G23) included in the first base signal part RSU1. To generate the third green image data corresponding to the second base pixel part RPU2, the controller 100 may render two green image signals (e.g., G15 and G25) included in the second base signal part RSU2. To generate the third green image data corresponding to the third base pixel part RPU3, the controller 100 may render two green image signals (e.g., G17 and G27) included in the third base signal part RSU3. To generate the fourth green image data corresponding to the first base pixel part RPU1, the controller 100 may render two green image signals (e.g., G14 and G24) included in the first base signal part RSU1. To generate the fourth green image data corresponding to the second base pixel part RPU2, the controller 100 may render two green image signals (e.g., G16 and G26) included in the second base signal part RSU2. To generate the fourth green image data corresponding to the third base pixel part RPU3, the controller 100 may render two green image signals (e.g., G18 and G28) included in the third base signal part RSU3.

As described above, in the case where some image signals (i.e., the normal-referenced signals B13 and R23) included in an adjacent base signal part are used to generate normal color image data, the normal-referenced signals B13 and R23 may be excluded in case that rendering is performed on image signals included in each of the base signal parts RSU1 to RSU3. Also, in case that rendering is performed on image signals included in each of the base signal parts RSU1 to RSU3, some image signals (i.e., referenced image signals) included in an adjacent base signal part (i.e., a referenced reference unit) may be used as much as the number of non-referenced image signals included in each of the base signal parts RSU1 to RSU3. Accordingly, the rendering may be performed on image signals of a normal signal part and image signals of the base signal parts RSU1 to RSU3 without the duplication or loss of image signals, and thus, a color may be prevented from being distorted at a boundary of the first and second display areas DA1 and DA2.

Figure 6A:
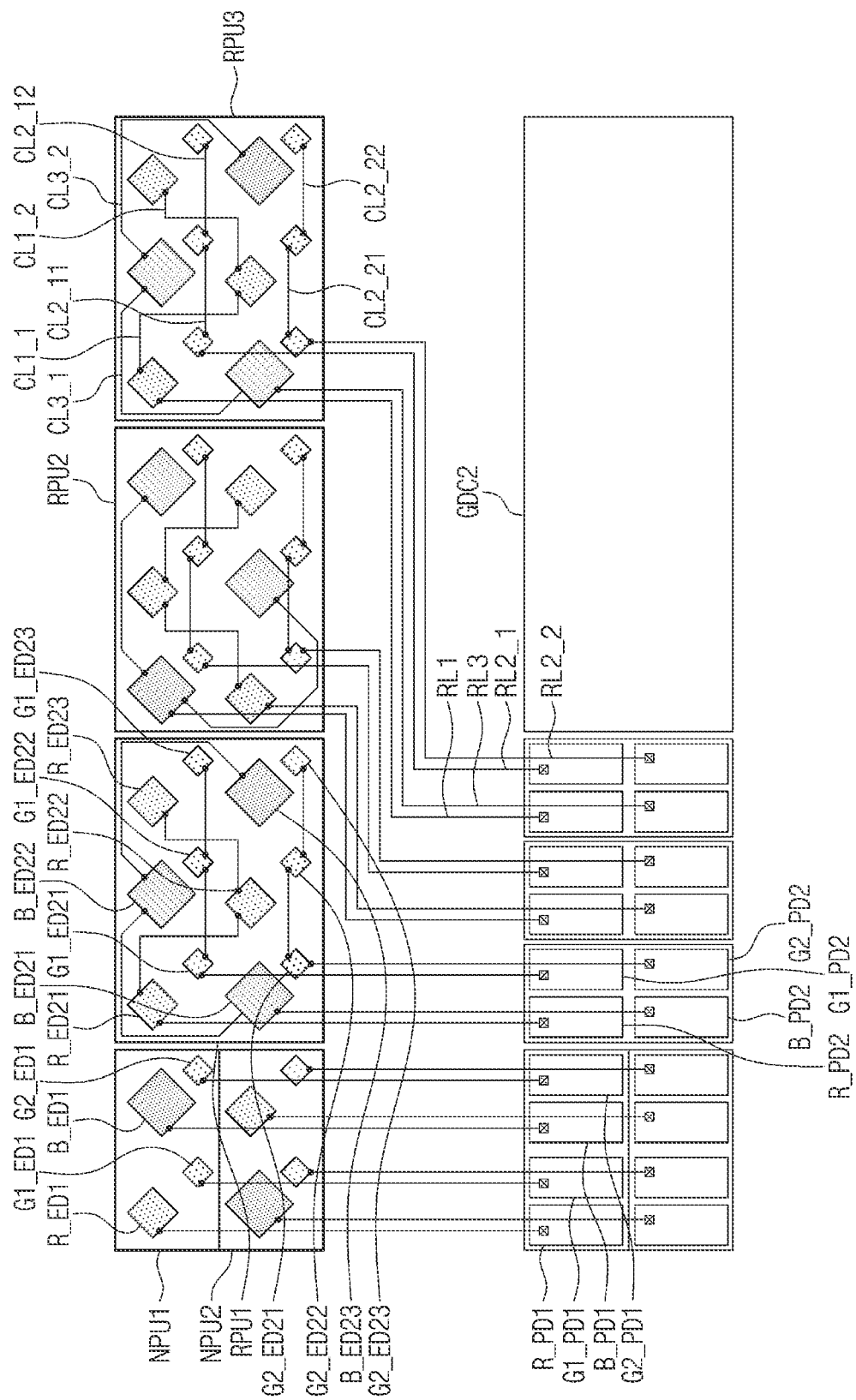
FIG. 6A is a plan view illustrating a connection structure of normal pixel parts and base pixel parts of a 3×2 structure according to an embodiment of the disclosure.
Figure 6B:
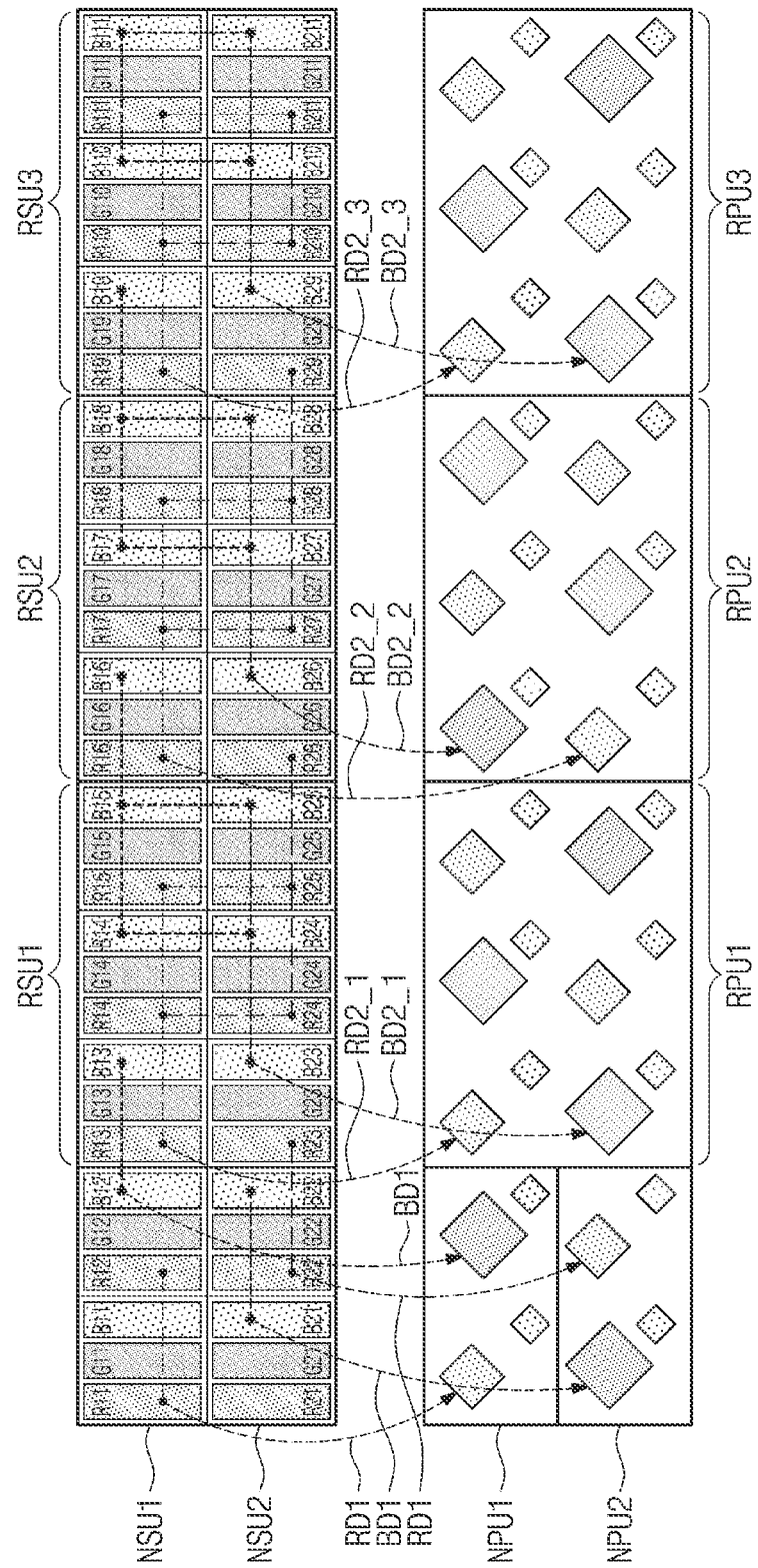
FIG. 6B is a schematic diagram illustrating a process of rendering image signals according to an embodiment of the disclosure.

FIG. 6A is a plan view illustrating a connection structure of normal pixel parts and base pixel parts of a 3×2 structure according to an embodiment of the disclosure. FIG. 6B is a schematic diagram illustrating a process of rendering image signals according to an embodiment of the disclosure.

Referring to FIG. 6A, the second red driving circuit R_PD2 may be electrically connected with one (e.g., the second red light emitting element R_ED21) of three second red light emitting elements R_ED21, R_ED22, and R_ED23 through the first routing line RL1. The second blue driving circuit B_PD2 may be electrically connected with one (e.g., the second blue light emitting element B_ED21) of three second blue light emitting elements B_ED21, B_ED22, and B_ED23 through the third routing line RL3.

The three second red light emitting elements R_ED21, R_ED22, and R_ED23 may be electrically connected with each other through first connection lines CL1_1 and CL1_2. Accordingly, even though the second red driving circuit R_PD2 is electrically connected with one second red light emitting element R_ED21 of the three second red light emitting elements R_ED21, R_ED22, and R_ED23, the three second red light emitting elements R_ED21, R_ED22, and R_ED23 may operate at the same time and may emit lights with substantially the same intensity. Likewise, the three second blue light emitting elements B_ED21, B_ED22, and B_ED23 may be electrically connected with each other through third connection lines CL3_1 and CL3_2. Accordingly, even though the second blue driving circuit B_PD2 is electrically connected with one second blue light emitting element B_ED21 of the three second blue light emitting elements B_ED21, B_ED22, and B_ED23, the three second blue light emitting elements B_ED21, B_ED22, and B_ED23 may operate at the same time and may emit lights with substantially the same intensity.

The third green driving circuit G1_PD2 may be electrically connected with one (e.g., the third green light emitting element G1_ED21) of three third green light emitting elements G1_ED21, G1_ED22, and G1_ED23 through the first sub-routing line RL2_1. The fourth green driving circuit G2_PD2 may be electrically connected with one (e.g., the fourth green light emitting element G2_ED21) of three fourth green light emitting elements G2_ED21, G2_ED22, and G2_ED23 through the second sub-routing line RL2_2. The three third green light emitting elements G1_ED21, G1_ED22, and G1_ED23 may be electrically connected with each other through first sub-connection lines CL2_11 and CL2_12, and the three fourth green light emitting elements G2_ED21, G2_ED22, and G2_ED23 may be electrically connected with each other through second sub-connection lines CL2_21 and CL2_22.

Referring to FIGS. 6A and 6B, image signals corresponding to the normal pixel parts NPU1 and NPU2 among the image signals RGB are referred to as "first image signals", and image signals corresponding to the base pixel parts RPU1, RPU2, and RPU3 among the image signals RGB are referred to as "second image signals". The first image signals may be classified into multiple normal signal parts (e.g., NSU1 and NSU2). For example, each of the normal signal parts NSU1 and NSU2 may include two first red image signals (e.g., R11 and R12), one first green image signal (e.g., G11), one second green image signal (e.g., G12), and two first blue image signals (e.g., B11 and B12). The second image signals may be classified into the multiple base signal parts RSU1, RSU2, and RSU3, each of which may include "m*n" second red image signals, "m*n" green image signals, and "m*n" second blue image signals. Herein, each of "m" and "n" may be a natural number of 2 or more. For example, "m" may be 3, and "n" may be 2.

The controller 100 may generate the first red image data RD1 by rendering the two first red image signals R11 and R12 included in at least one normal signal part (e.g., the first normal signal part NSU1) of the multiple normal signal parts NSU1 and NSU2. The controller 100 may generate the first blue image data BD1 by rendering one (e.g., B12) of the two first blue image signals B11 and B12 included in the first normal signal part NSU1 of the multiple normal signal parts NSU1 and NSU2 and one normal-referenced signal (e.g., a referenced blue signal B13) included in a normal-referenced part adjacent to the first normal signal part NSU1. The controller 100 may convert the first and second green image signals G11 and G12 included in the first normal signal part NSU1 into the first and second green image data, respectively.

How the controller 100 generates the first red image data RD1 and the first blue image data BD1 is described with reference to FIGS. 5A and 5B, and thus, additional description will be omitted to avoid redundancy.

Three base pixel parts RPU1, RPU2, and RPU3 are illustrated in FIG. 6A as an embodiment, and three base signal parts RSU1, RSU2, and RSU3 respectively corresponding to the base pixel parts RPU1, RPU2 and RPU3 are illustrated in FIG. 6B as an embodiment. For convenience of description, the three base signal parts RSU1, RSU2, and RSU3 are respectively referred to as a "first base signal part RSU1", a "second base signal part RSU2", and a "third base signal part RSU3". Also, the three base pixel parts RPU1, RPU2, and RPU3 are respectively referred to as a "first base pixel part RPU1", a "second base pixel part RPU2", and a "third base pixel part RPU3".

The controller 100 may generate the second red image data RD2_1, RD2_2, or RD2_3 by rendering "p" second red image signals of "m*n" second red image signals included in a corresponding base signal part of the multiple base signal parts RSU1, RSU2, and RSU3 and "(m*n)–p" referenced red signals included in the first referenced signal part adjacent to the corresponding base signal part. Herein, "p" may be a natural number of 2 or more, and "p" may be a natural number less than a product of "m" and "n". For example, in the case where "m" is 3 and "n" is 2, "p" may be 5. The controller 100 may generate the second red image data RD2_1, RD2_2, or RD2_3 by rendering five second red image signals and one referenced red signal. For example, the first referenced signal part may be another base signal part adjacent to the corresponding base signal part.

To generate the second red image data RD2_1, the controller 100 may render five second red image signals R13, R14, R15, R24, and R25 included in the first base signal part RSU1 and one referenced red signal (e.g., R26) included in the first referenced signal part (e.g., the second base signal part RSU2). For example, the one referenced red signal R26 may be one second red image signal R26 included in the second base signal part RSU2. To generate the second red image data RD2_2, the controller 100 may render five second red image signals R16, R17, R18, R27, and R28 included in the second base signal part RSU2 and one referenced red signal (e.g., R29). For example, the one referenced red signal R29 may be one second red image signal R29 included in the third base signal part RSU3. To generate the second red image data RD2_3, the controller 100 may render five second red image signals R19, R110, R111, R210, and R211 included in the third base signal part RSU3.

The controller 100 may generate the second blue image data BD2_1, BD2_2, or BD2_3 by rendering "q" second blue image signals of "m*n" second blue image signals included in a corresponding base signal part of the multiple base signal parts RSU1, RSU2, and RSU3 and "(m*n)–q" referenced blue signals included in the second referenced signal part adjacent to the corresponding base signal part. Herein, "q" may be a natural number of 2 or more, and "q" may be a natural number less than a product of "m" and "n". For example, in the case where "m" is 3 and "n" is 2, "q" may be 5. The controller 100 may generate the second blue image data BD2_1, BD2_2, or BD2_3 by rendering five second blue image signals and one referenced blue signal. For example, the second referenced signal part may be another base signal part adjacent to the corresponding base signal part.

To generate the second blue image data BD2_1, the controller 100 may render five second blue image signals B14, B15, B23, B24, and B25 included in the first base signal part RSU1 and one referenced blue signal (e.g., B16) included in the second referenced signal part (e.g., the second base signal part RSU2). For example, the one referenced blue signal B16 may be one second blue image signal B16 included in the second base signal part RSU2. To generate the second blue image data BD2_2, the controller 100 may render five second blue image signals B17, B18, B26, B27, and B28 included in the second base signal part RSU2 and one referenced blue signal (e.g., B19) included in the second referenced signal part (e.g., the third base signal part RSU3). For example, the one referenced blue signal B19 may be one second blue image signal B19 included in the third base signal part RSU3. To generate the second blue image data BD2_3, the controller 100 may render five second blue image signals B110, B111, B29, B210, and B211 included in the third base signal part RSU3.

A structure in which the second display area DA2 is disposed on a first side (e.g., a right side) of the first display area DA1 is illustrated in FIGS. 6A and 6B. Each of the first and second referenced signal parts may be disposed on a first side (e.g., a right side) of a corresponding base signal part. However, the disclosure is not limited thereto. For example, in the case where the second display area DA2 is disposed on a second side (e.g., a left side) of the first display area DA1, each of the first and second referenced signal parts may be disposed on a second side (e.g., a left side) of a corresponding base signal part.

Also, an embodiment in which the referenced red signal (e.g., R26) and the referenced blue signal (e.g., B16) are disposed at different rows is illustrated in FIG. 6A, but the disclosure is not limited thereto. For example, the referenced red signal and the referenced blue signal may be disposed at the same row.

The remaining, for example, "(m*n)–p" second red image signals other than "p" second red image signals of a corresponding base signal part may be referred to as "non-referenced red signals", and the remaining, for example, "(m*n)–q" second blue image signals other than "q" second blue image signals of the corresponding base signal part may be referred to as "non-referenced blue signals". The non-referenced red signal and the referenced red signal may be placed at the same row, and the non-referenced blue signal and the referenced blue signal may be placed at the same row.

For example, the first base signal part RSU1 may include the first non-referenced red signal R23. The referenced red signal R26 of the first referenced signal part (e.g., the second base signal part RSU2) may be placed at the same row as the first non-referenced red signal R23. Also, the first base signal part RSU1 may include the first non-referenced blue signal B13. The referenced blue signal B16 of the second referenced signal part (e.g., the second base signal part RSU2) may be placed at the same row as the first non-referenced blue signal B13.

In the case where some image signals (i.e., the normal-referenced signals B13 and R23) included in an adjacent base signal part are used to generate normal color image data, the normal-referenced signals B13 and R23 may be excluded in case that rendering is performed on image signals included in each of the base signal parts RSU1 to RSU3. Also, in case that rendering is performed on image signals included in each of the base signal parts RSU1 to RSU3, some image signals (i.e., referenced image signals) included in an adjacent base signal part (i.e., a referenced reference unit) may be used as much as the number of non-referenced image signals included in each of the base signal parts RSU1 to RSU3. Accordingly, the rendering may be performed on image signals of the normal signal parts NSU1 and NSU2 and image signals of the base signal parts RSU1 to RSU3 without the duplication or loss of image signals, and thus, a color may be prevented from being distorted at a boundary of the first and second display areas DA1 and DA2.

Figure 7A:
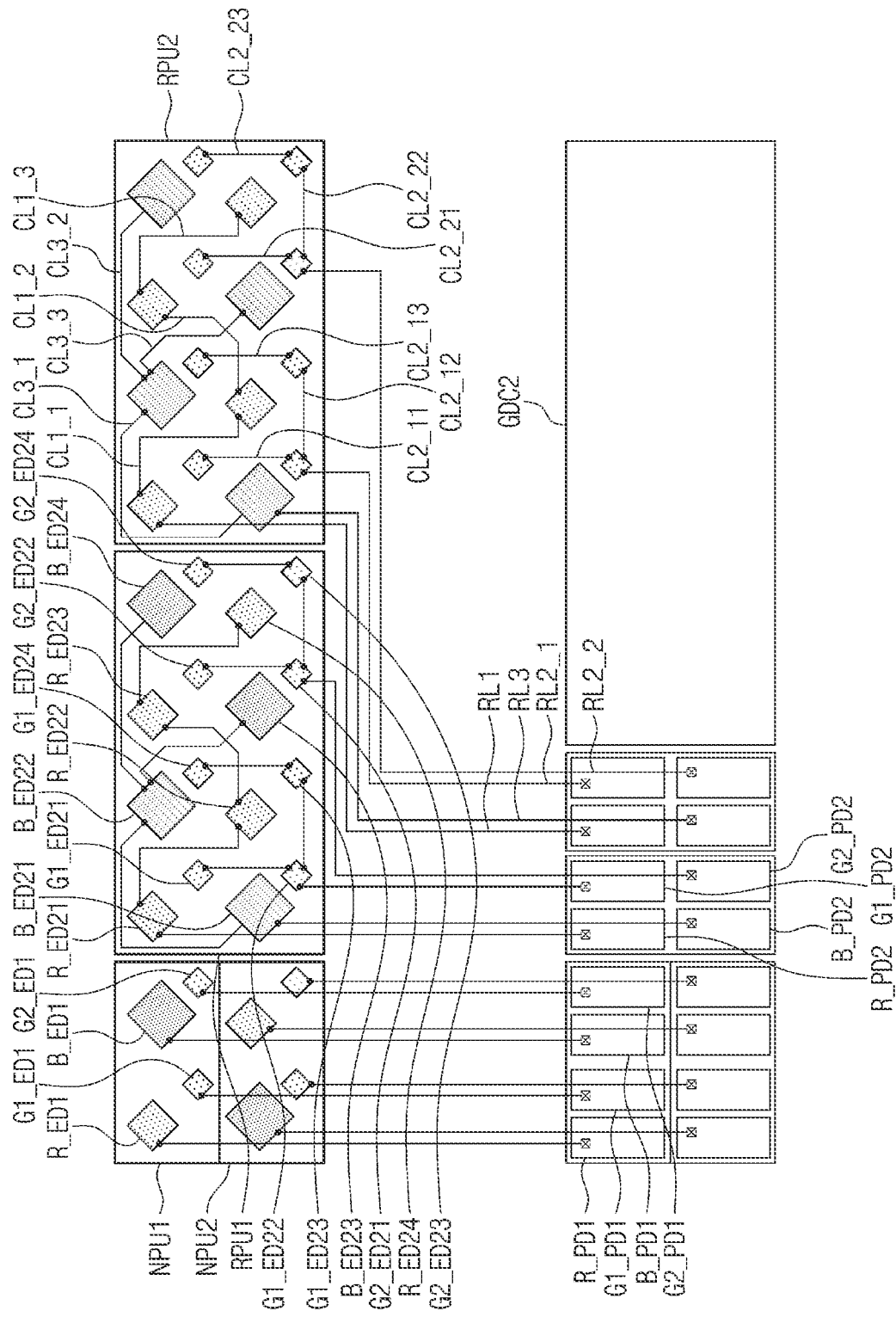
FIG. 7A is a plan view illustrating a connection structure of normal pixel parts and base pixel parts of a 4×2 structure according to an embodiment of the disclosure.
Figure 7B:
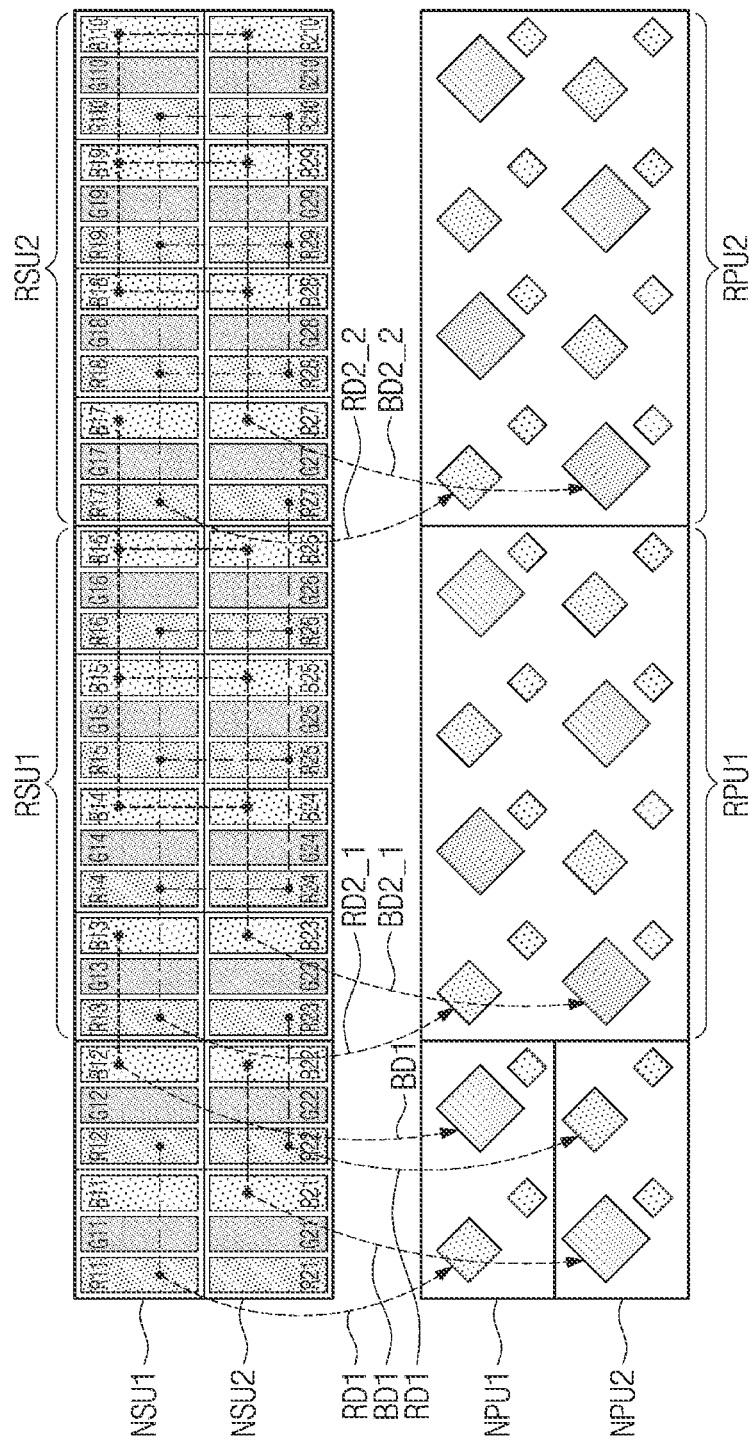
FIG. 7B is a schematic diagram illustrating a process of rendering image signals according to an embodiment of the disclosure.

FIG. 7A is a plan view illustrating a connection structure of normal pixel parts and base pixel parts of a 4×2 structure according to an embodiment of the disclosure. FIG. 7B is a schematic diagram illustrating a process of rendering image signals according to an embodiment of the disclosure.

Referring to FIG. 7A, the second red driving circuit R_PD2 may be electrically connected with one (e.g., the second red light emitting element R_ED21) of four second red light emitting elements R_ED21, R_ED22, R_ED23, and R_ED24 through the first routing line RL1. The second blue driving circuit B_PD2 may be electrically connected with one (e.g., the second blue light emitting element B_ED21) of four second blue light emitting elements B_ED21, B_ED22, B_ED23, and B_ED24 through the third routing line RL3.

The four second red light emitting elements R_ED21, R_ED22, R_ED23, and R_ED24 may be electrically connected with each other through first connection lines CL1_1, CL1_2, and CL1_3. Accordingly, even though the second red driving circuit R_PD2 is electrically connected with one second red light emitting element R_ED21 of the four second red light emitting elements R_ED21, R_ED22, R_ED23, and R_ED24, the four second red light emitting elements R_ED21, R_ED22, R_ED23, and R_ED24 may operate at the same time and may emit lights with substantially the same intensity. Likewise, the four second blue light emitting elements B_ED21, B_ED22, B_ED23, and B_ED24 may be electrically connected with each other through third connection lines CL3_1, CL3_2, and CL3_3. Accordingly, even though the second blue driving circuit B_PD2 is electrically connected with one second blue light emitting element B_ED21 of the four second blue light emitting elements B_ED21, B_ED22, B_ED23, and B_ED24, the four second blue light emitting elements B_ED21, B_ED22, B_ED23, and B_ED24 may operate at the same time and may emit lights with substantially the same intensity.

The third green driving circuit G1_PD2 may be electrically connected with one (e.g., the third green light emitting element G1_ED21) of four third green light emitting elements G1_ED21, G1_ED22, G1_ED23, and G1_ED24 through the first sub-routing line RL2_1. The fourth green driving circuit G2_PD2 may be electrically connected with one (e.g., the fourth green light emitting element G2_ED21) of four fourth green light emitting elements G2_ED21, G2_ED22, G2_ED23, and G2_ED24 through the second sub-routing line RL2_2. The four third green light emitting elements G1_ED21, G1_ED22, G1_ED23, and G1_ED24 may be electrically connected with each other through first sub-connection lines CL2_11, CL2_12, and CL2_13, and the four fourth green light emitting elements G2_ED21, G2_ED22, G2_ED23, and G2_ED24 may be electrically connected with each other through second sub-connection lines CL2_21, CL2_22, and CL2_23.

Referring to FIGS. 7A and 7B, image signals corresponding to the normal pixel parts NPU1 and NPU2 among the image signals RGB are referred to as "first image signals", and image signals corresponding to the base pixel parts RPU1 and RPU2 among the image signals RGB are referred to as "second image signals". The first image signals may be classified into multiple normal signal parts (e.g., NSU1 and NSU2). For example, each of the normal signal parts NSU1 and NSU2 may include two first red image signals (e.g., R11 and R12), one first green image signal (e.g., G11), one second green image signal (e.g., G12), and two first blue image signals (e.g., B11 and B12). The second image signals may be classified into the multiple base signal parts RSU1 and RSU2, each of which may include "m*n" second red image signals, "m*n" green image signals, and "m*n" second blue image signals. Herein, each of "m" and "n" may be a natural number of 2 or more. For example, "m" may be 4, and "n" may be 2.

Two base pixel parts RPU1 and RPU2 are illustrated in FIG. 7A as an embodiment, and two base signal parts RSU1 and RSU2 respectively corresponding to the base pixel parts RPU1 and RPU2 are illustrated in FIG. 7B as an embodiment. For convenience of description, the two base signal parts RSU1 and RSU2 are respectively referred to as a "first base signal part RSU1" and a "second base signal part RSU2". Also, the two base pixel parts RPU1 and RPU2 are respectively referred to as a "first base pixel part RPU1" and a "second base pixel part RPU2".

The controller 100 may generate the second red image data RD2_1 or RD2_2 by rendering "p" second red image signals of "m*n" second red image signals included in a corresponding base signal part of the multiple base signal parts RSU1 and RSU2 and "(m*n)−p" referenced red signals included in the first referenced signal part adjacent to the corresponding base signal part. Herein, "p" may be a natural number of 2 or more, and "p" may be a natural number less than a product of "m" and "n". For example, in the case where "m" is 4 and "n" is 2, "p" may be 7. The controller 100 may generate the second red image data RD2_1 or RD2_2 by rendering seven second red image signals and one referenced red signal. For example, the first referenced signal part may be another base signal part adjacent to the corresponding base signal part.

To generate the second red image data RD2_1, the controller 100 may render seven second red image signals R13, R14, R15, R16, R24, R25, and R26 included in the first base signal part RSU1 and one referenced red signal (e.g., R27) included in the first referenced signal part (e.g., the second base signal part RSU2). For example, the one referenced red signal R27 may be one second red image signal R27 included in the second base signal part RSU2. To generate the second red image data RD2_2, the controller 100 may render seven second red image signals R17, R18, R19, R110, R28, R29, and R210 included in the second base signal part RSU2.

The controller 100 may generate the second blue image data BD2_1 and BD2_2 by rendering "q" second blue image signals of "m*n" second blue image signals included in a corresponding base signal part of the multiple base signal parts RSU1 and RSU2 and "(m*n)−q" referenced blue signals included in the second referenced signal part adjacent to the corresponding base signal part. Herein, "q" may be a natural number of 2 or more, and "q" may be a natural number less than a product of "m" and "n". For example, in the case where "m" is 4 and "n" is 2, "p" may be 7. The controller 100 may generate the second blue image data BD2_1 or BD2_2 by rendering seven second blue image signals and one referenced blue signal. For example, the second referenced signal part may be another base signal part adjacent to the corresponding base signal part.

To generate the second blue image data BD2_1, the controller 100 may render seven second blue image signals B14, B15, B16, B23, B24, B25, and B26 included in the first base signal part RSU1 and one referenced blue signal (e.g., B17) included in the second referenced signal part (e.g., the second base signal part RSU2). For example, the one referenced blue signal B17 may be one second blue image signal B17 included in the second base signal part RSU2. To generate the second blue image data BD2_2, the controller 100 may render seven second blue image signals B18, B19, B110, B27, B28, B29, and B210 included in the second base signal part RSU2.

A structure in which the second display area DA2 is disposed on a first side (e.g., a right side) of the first display area DA1 is illustrated in FIGS. 7A and 7B. Each of the first and second referenced signal parts may be disposed on a first side (e.g., a right side) of a corresponding base signal part. However, the disclosure is not limited thereto. For example, in the case where the second display area DA2 is disposed on a second side (e.g., a left side) of the first display area DA1, each of the first and second referenced signal parts may be disposed on a second side (e.g., a left side) of a corresponding base signal part.

Also, an embodiment in which the referenced red signal (e.g., R26) and the referenced blue signal (e.g., B16) are disposed at different rows is illustrated in FIG. 7A, but the disclosure is not limited thereto. For example, the referenced red signal and the referenced blue signal may be disposed at the same row.

The remaining, for example, "(m*n)−p" second red image signals other than "p" second red image signals of a corresponding base signal part may be referred to as "non-referenced red signals", and the remaining, for example, "(m*n)−q" second blue image signals other than "q" second blue image signals of the corresponding base signal part may be referred to as "non-referenced blue signals". The non-referenced red signal and the referenced red signal may be placed at the same row, and the non-referenced blue signal and the referenced blue signal may be placed at the same row.

For example, the first base signal part RSU1 may include the first non-referenced red signal R23; and the referenced red signal R27 of the first referenced signal part (e.g., the second base signal part RSU2) may be placed at the same row as the first non-referenced red signal R23. Also, the first base signal part RSU1 may include the first non-referenced blue signal B13; and the referenced blue signal B17 of the second referenced signal part (e.g., the second base signal part RSU2) may be placed at the same row as the first non-referenced blue signal B13.

As described above, in the case where some image signals (i.e., the normal-referenced signals B13 and R23) included in an adjacent base signal part are used to generate normal color image data, the normal-referenced signals B13 and R23 may be excluded in case that rendering is performed on image signals included in each of the base signal parts RSU1 and RSU2. Also, in case that rendering is performed on image signals included in each of the base signal parts RSU1 and RSU2, some image signals (i.e., referenced image signals) included in an adjacent base signal part (i.e., a referenced reference unit) may be used as much as the number of non-referenced image signals included in each of the base signal parts RSU1 and RSU2. Accordingly, the rendering may be performed on image signals of the normal signal part NSU1 and NSU2 and image signals of the base signal parts RSU1 and RSU2 without the duplication or loss of image signals, and thus, a color may be prevented from being distorted at a boundary of the first and second display areas DA1 and DA2.

Figure 8A:
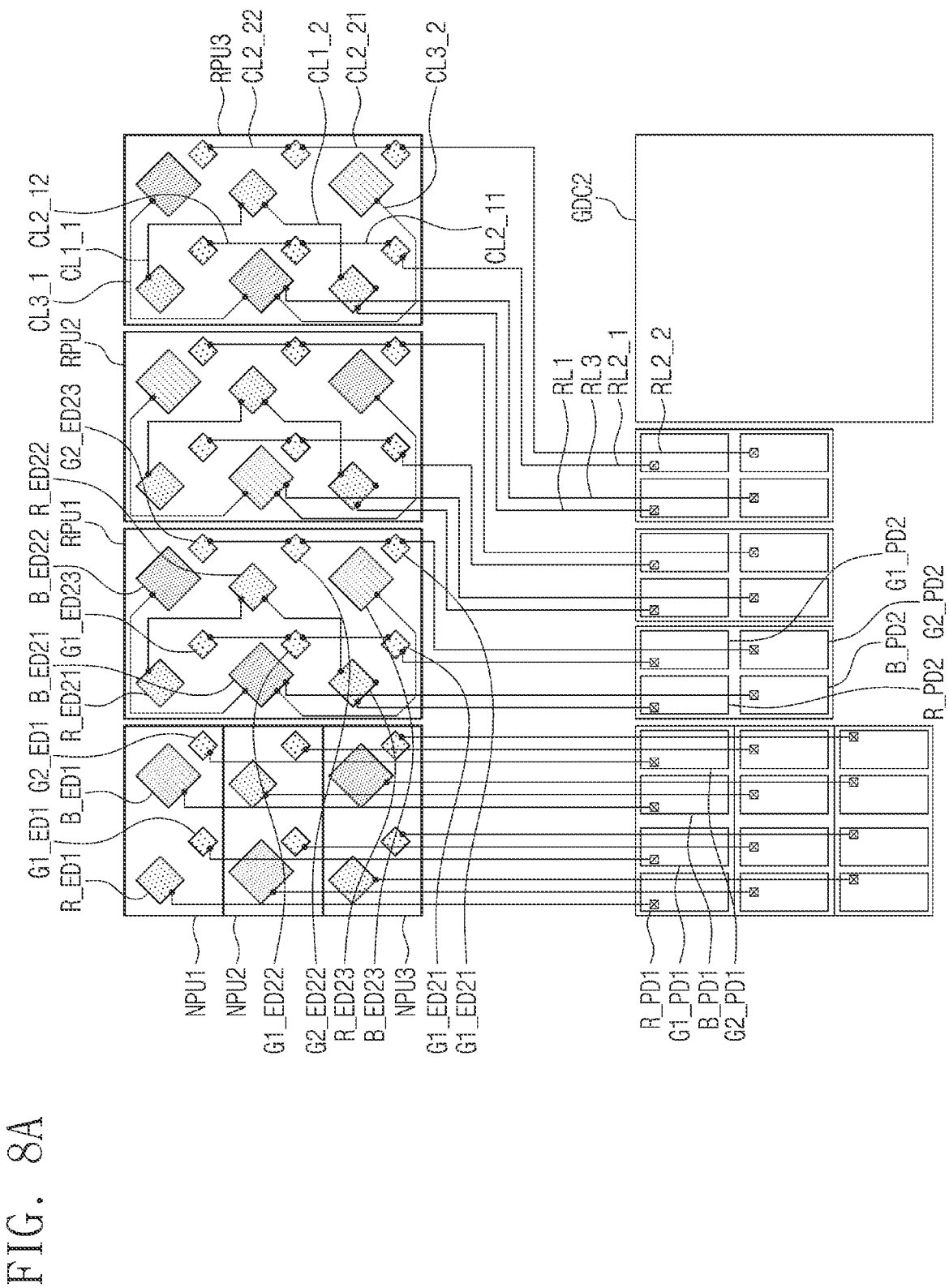
FIG. 8A is a plan view illustrating a connection structure of normal pixel parts and base pixel parts of a 2×3 structure according to an embodiment of the disclosure.
Figure 8B:
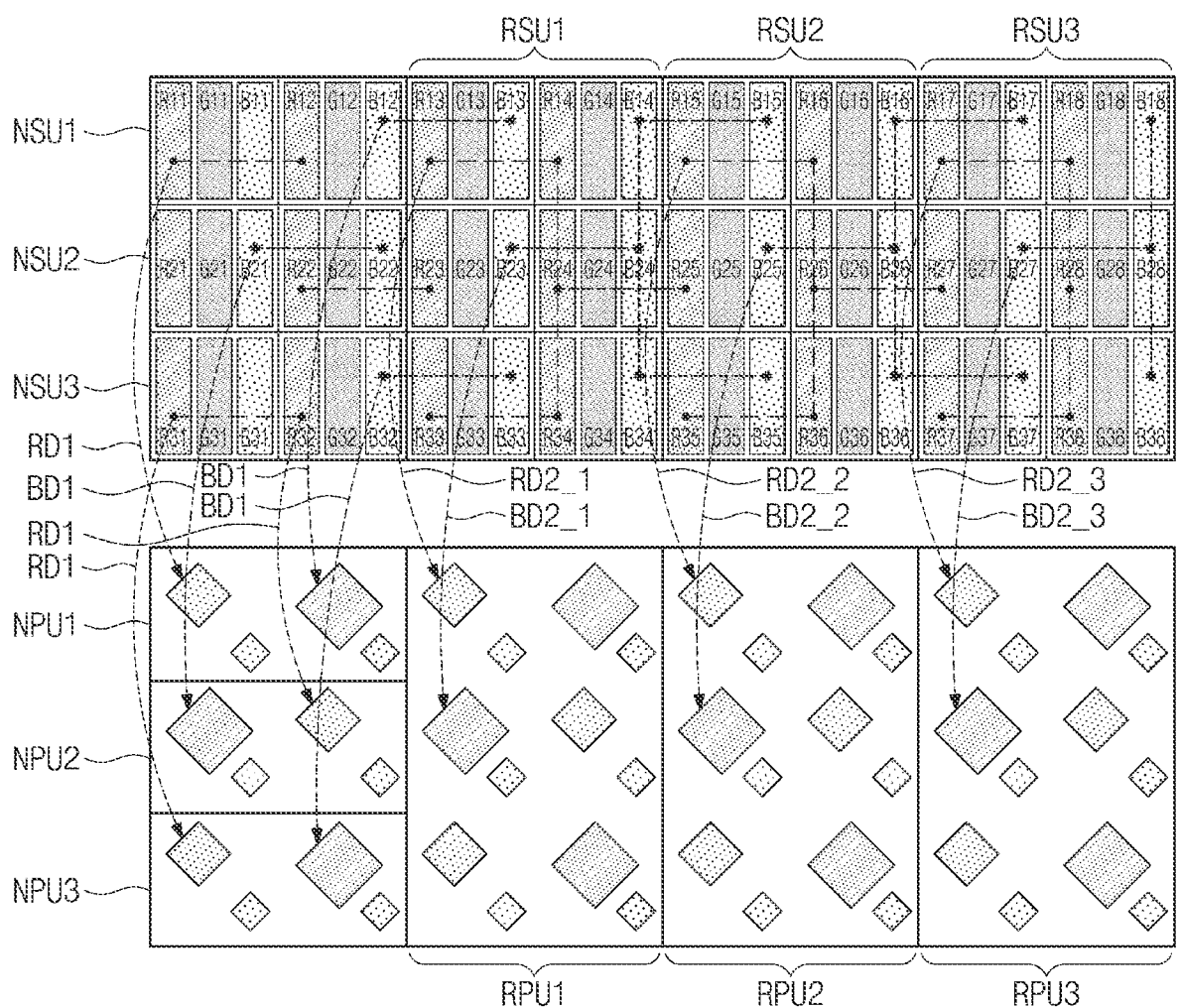
FIG. 8B is a schematic diagram illustrating a process of rendering image signals according to an embodiment of the disclosure.

FIG. 8A is a plan view illustrating a connection structure of normal pixel parts and base pixel parts of a 2×3 structure according to an embodiment of the disclosure. FIG. 8B is a schematic diagram illustrating a process of rendering image signals according to an embodiment of the disclosure.

Referring to FIGS. 8A and 8B, image signals corresponding to normal pixel parts NPU1, NPU2, and NPU3 among the image signals RGB are referred to as "first image signals", and image signals corresponding to the base pixel parts RPU1, RPU2, and RPU3 among the image signals RGB are referred to as "second image signals". The first image signals may be classified into multiple normal signal parts (e.g., NSU1, NSU2, and NSU3). For example, each of the normal signal parts NSU1, NSU2, and NSU3 may include two first red image signals (e.g., R11 and R12), one first green image signal (e.g., G11), one second green image signal (e.g., G12), and two first blue image signals (e.g., B11 and B12). The second image signals may be classified into the multiple base signal parts RSU1, RSU2, and RSU3, each of which may include "m*n" second red image signals, "m*n" green image signals, and "m*n" second blue image signals. Herein, each of "m" and "n" may be a natural number of 2 or more. For example, "m" may be 2, and "n" may be 3.

The controller 100 may generate the second red image data RD2_1, RD2_2, or RD2_3 by rendering "p" second red image signals of "m*n" second red image signals included in a corresponding base signal part of the multiple base signal parts RSU1, RSU2, and RSU3 and "(m*n)−p" referenced red signals included in the first referenced signal part adjacent to the corresponding base signal part. Herein, "p" may be a natural number of 2 or more, and "p" may be a natural number less than a product of "m" and "n". For example, in the case where "m" is 2 and "n" is 3, "p" may be 5. The controller 100 may generate the second red image data RD2_1, RD2_2, or RD2_3 by rendering five second red image signals and one referenced red signal. For example, the first referenced signal part may be another base signal part adjacent to the corresponding base signal part.

To generate the second red image data RD2_1, the controller 100 may render five second red image signals R13, R14, R24, R33, and R34 included in the first base signal part RSU1 and one referenced red signal (e.g., R25) included in the first referenced signal part (e.g., the second base signal part RSU2). For example, the one referenced red signal R25 may be one second red image signal R25 included in the second base signal part RSU2. To generate the second red image data RD2_2, the controller 100 may render five second red image signals R15, R16, R26, R35, and R36 included in the second base signal part RSU2 and one referenced red signal (e.g., R27) included in the first referenced signal part (e.g., the third base signal part RSU3). For example, the one referenced red signal R27 may be one second red image signal R27 included in the third base signal part RSU3. To generate the second red image data RD2_3, the controller 100 may render five second red image signals R17, R18, R28, R37, and R38 included in the third base signal part RSU3.

The controller 100 may generate the second blue image data BD2_1, BD2_2, or BD2_3 by rendering "q" second blue image signals of "m*n" second blue image signals included in a corresponding base signal part of the multiple base signal parts RSU1, RSU2, and RSU3 and "(m*n)−q" referenced blue signals included in the second referenced signal part adjacent to the corresponding base signal part. For example, in the case where "m" is 2 and "n" is 3, "q" may be 4. The controller 100 may generate the second blue image data BD2_1, BD2_2, or BD2_3 by rendering four second blue image signals and two referenced blue signals. For example, the second referenced signal part may be another base signal part adjacent to the corresponding base signal part.

To generate the second blue image data BD2_1, the controller 100 may render four second blue image signals B14, B23, B24, and B34 included in the first base signal part RSU1 and two referenced blue signals (e.g., B15 and B35) included in the second referenced signal part (e.g., the second base signal part RSU2). For example, the two referenced blue signals B15 and B35 may be two second blue image signals B15 and B35 included in the second base signal part RSU2. To generate the second blue image data BD2_2, the controller 100 may render four second blue image signals B16, B25, B26, and B36 included in the second base signal part RSU2 and two referenced blue signals (e.g., B17 and B37) included in the second referenced signal part (e.g., the third base signal part RSU3). For example, the two referenced blue signals B17 and B37 may be two second blue image signals B17 and B37 included in the third base signal part RSU3. To generate the second blue image data BD2_3, the controller 100 may render four second blue image signals B18, B27, B28, and B38 included in the third base signal part RSU3.

Also, an embodiment in which the referenced red signal (e.g., R25) and the referenced blue signals (e.g., B15 and B35) are disposed at different rows is illustrated in FIG. 8A, but the disclosure is not limited thereto. For example, the referenced red signal and the referenced blue signals may be disposed at the same row.

The remaining, for example, "(m*n)−p" second red image signals other than "p" second red image signals of a corresponding base signal part may be referred to as "non-referenced red signals", and the remaining, for example, "(m*n)−q" second blue image signals other than "q" second blue image signals of the corresponding base signal part may be referred to as "non-referenced blue signals". The non-referenced red signal and the referenced red signal may be placed at the same row, and the non-referenced blue signal and the referenced blue signal may be placed at the same row.

For example, the first base signal part RSU1 may include the first non-referenced red signal R23; and the referenced red signal R25 of the first referenced signal part (e.g., the second base signal part RSU2) may be placed at the same row as the first non-referenced red signal R23. Also, the first base signal part RSU1 may include the first and second non-referenced blue signals B13 and B33; and the two referenced blue signals B15 and B35 of the second referenced signal part (e.g., the second base signal part RSU2) may be placed at the same row as the first and second non-referenced blue signals B13 and B33.

As described above, in the case where some image signals (i.e., the normal-referenced signals B13, R23, and B33) included in an adjacent base signal part are used to generate normal color image data, the normal-referenced signals B13, R23, and B33 may be excluded in case that rendering is performed on image signals included in each of the base signal parts RSU1 to RSU3. Also, in case that rendering is performed on image signals included in each of the base signal parts RSU1 to RSU3, some image signals (i.e., referenced image signals) included in an adjacent base signal part (i.e., a referenced reference unit) may be used as much as the number of non-referenced image signals included in each of the base signal parts RSU1 to RSU3. Accordingly, the rendering may be performed on image signals of the normal signal part NSU1 to NSU3 and image signals of the base signal parts RSU1 to RSU3 without the duplication or loss of image signals, and thus, a color may be prevented from being distorted at a boundary of the first and second display areas DA1 and DA2.

Figure 9A:
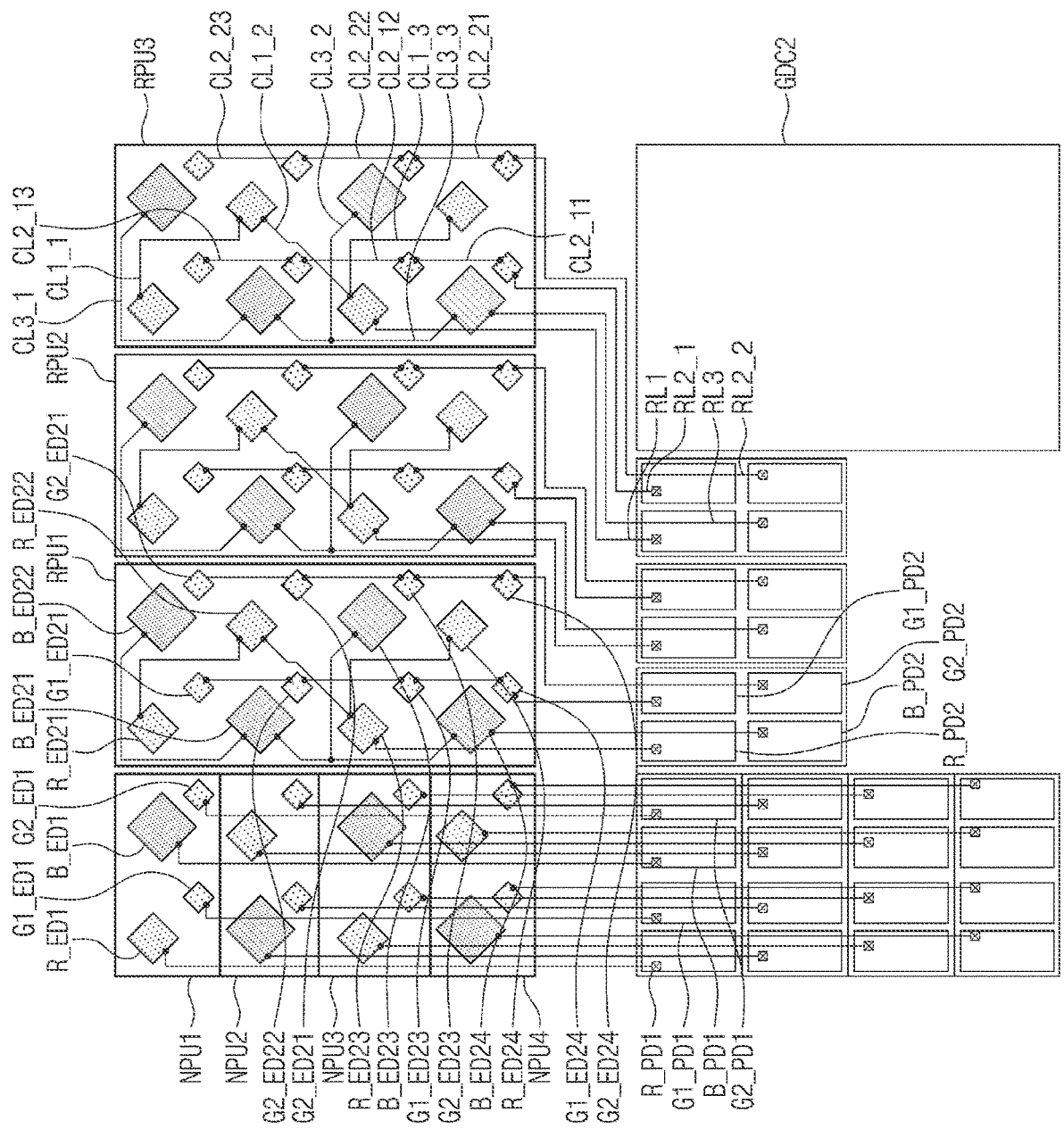
FIG. 9A is a plan view illustrating a connection structure of normal pixel parts and base pixel parts of a 2×4 structure according to an embodiment of the disclosure.
Figure 9B:
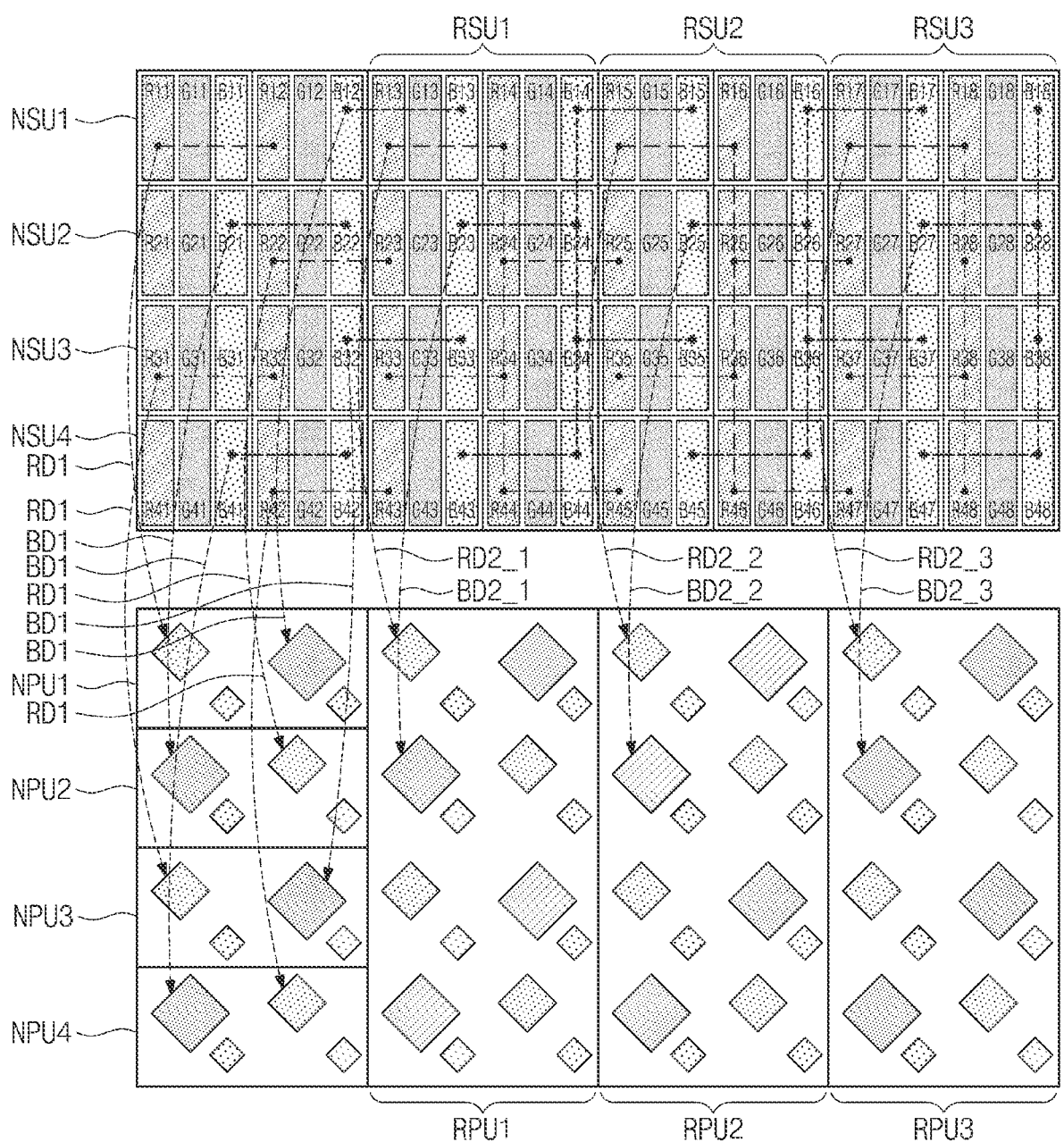
FIG. 9B is a schematic diagram illustrating a process of rendering image signals according to an embodiment of the disclosure.

FIG. 9A is a plan view illustrating a connection structure of normal pixel parts and base pixel parts of a 2×4 structure according to an embodiment of the disclosure. FIG. 9B is a schematic diagram illustrating a process of rendering image signals according to an embodiment of the disclosure.

Referring to FIGS. 9A and 9B, image signals corresponding to normal pixel parts NPU1, NPU2, NPU3, and NPU4 among the image signals RGB are referred to as "first image signals", and image signals corresponding to the base pixel parts RPU1, RPU2, and RPU3 among the image signals RGB are referred to as "second image signals". The first image signals may be classified into multiple normal signal parts (e.g., NSU1, NSU2, NSU3, and NSU4). For example, each of the normal signal parts NSU1, NSU2, NSU3, and NSU4 may include two first red image signals (e.g., R11 and R12), one first green image signal (e.g., G11), one second green image signal (e.g., G12), and two first blue image signals (e.g., B11 and B12). The second image signals may be classified into the multiple base signal parts RSU1, RSU2, and RSU3, each of which may include "m*n" second red image signals, "m*n" green image signals, and "m*n" second blue image signals. Herein, each of "m" and "n" may be a natural number of 2 or more. For example, "m" may be 2, and "n" may be 4.

The controller 100 may generate the second red image data RD2_1, RD2_2, or RD2_3 by rendering "p" second red image signals of "m*n" second red image signals included in a corresponding base signal part of the multiple base signal parts RSU1, RSU2, and RSU3 and "(m*n)−p" referenced red signals included in the first referenced signal part adjacent to the corresponding base signal part. Herein, "p" may be a natural number of 2 or more, and "p" may be a natural number less than a product of "m" and "n". For example, in the case where "m" is 2 and "n" is 4, "p" may be 6. The controller 100 may generate the second red image data RD2_1, RD2_2, or RD2_3 by rendering six second red image signals and two referenced red signals. For example, the first referenced signal part may be another base signal part adjacent to the corresponding base signal part.

To generate the second red image data RD2_1, the controller 100 may render six second red image signals R13, R14, R24, R33, R34, and R44 included in the first base signal part RSU1 and two referenced red signals (e.g., R25 and R45) included in the first referenced signal part (e.g., the second base signal part RSU2). For example, the two referenced red signals R25 and R45 may be two second red image signals R25 and R45 included in the second base signal part RSU2. To generate the second red image data RD2_2, the controller 100 may render six second red image signals R15, R16, R26, R35, R36, and R46 included in the second base signal part RSU2 and two referenced red signals (e.g., R27 and R47) included in the first referenced signal part (e.g., the third base signal part RSU3). For example, the two referenced red signals R27 and R47 may be two second red image signals R27 and R47 included in the third base signal part RSU3. To generate the second red image data RD2_3, the controller 100 may render six second red image signals R17, R18, R28, R37, R38, and R48 included in the third base signal part RSU3.

The controller 100 may generate the second blue image data BD2_1, BD2_2, or BD2_3 by rendering "q" second blue image signals of "m*n" second blue image signals included in a corresponding base signal part of the multiple base signal parts RSU1, RSU2, and RSU3 and "(m*n)−q" referenced blue signals included in the second referenced signal part adjacent to the corresponding base signal part. For example, in the case where "m" is 2 and "n" is 4, "q" may be 6. The controller 100 may generate the second blue image data BD2_1, BD2_2, or BD2_3 by rendering six second blue image signals and two referenced blue signals.

For example, the second referenced signal part may be another base signal part adjacent to the corresponding base signal part.

To generate the second blue image data BD2_1, the controller 100 may render six second blue image signals B14, B23, B24, B34, B43, and B44 included in the first base signal part RSU1 and two referenced blue signals (e.g., B15 and B35) included in the second referenced signal part (e.g., the second base signal part RSU2). For example, the two referenced blue signals B15 and B35 may be two second blue image signals B15 and B35 included in the second base signal part RSU2. To generate the second blue image data BD2_2, the controller 100 may render six second blue image signals B16, B25, B26, B36, B45, and B46 included in the second base signal part RSU2 and two referenced blue signals (e.g., B17 and B37) included in the second referenced signal part (e.g., the third base signal part RSU3). For example, the two referenced blue signals B17 and B37 may be two second blue image signals B17 and B37 included in the third base signal part RSU3. To generate the second blue image data BD2_3, the controller 100 may render six second blue image signals B18, B27, B28, B38, B47, and B48 included in the third base signal part RSU3.

Also, an embodiment in which the referenced red signals (e.g., R25 and R45) and the referenced blue signals (e.g., B15 and B35) are disposed at different rows is illustrated in FIG. 9A, but the disclosure is not limited thereto. For example, a referenced red signal and a referenced blue signal may be disposed at the same row.

The remaining, for example, "(m*n)−p" second red image signals other than "p" second red image signals of a corresponding base signal part may be referred to as "non-referenced red signals", and the remaining, for example, "(m*n)−q" second blue image signals other than "q" second blue image signals of the corresponding base signal part may be referred to as "non-referenced blue signals". The non-referenced red signal and the referenced red signal may be placed at the same row, and the non-referenced blue signal and the referenced blue signal may be placed at the same row.

For example, the first base signal part RSU1 may include the first and second non-referenced red signals R23 and R43; and the referenced red signals R25 and R45 of the first referenced signal part (e.g., the second base signal part RSU2) may be placed at the same row as the first and second non-referenced red signal R23 and R43. Also, the first base signal part RSU1 may include the first and second non-referenced blue signals B13 and B33; and the two referenced blue signals B15 and B35 of the second referenced signal part (e.g., the second base signal part RSU2) may be respectively placed at the same rows as the first and second non-referenced blue signals B13 and B33.

As described above, in the case where some image signals (i.e., the normal-referenced signals B13, R23, B33, and R43) included in an adjacent base signal part are used to generate normal color image data, the normal-referenced signals B13, R23, B33, and R43 may be excluded in case that rendering is performed on image signals included in each of the base signal parts RSU1 to RSU3. Also, in case that rendering is performed on image signals included in each of the base signal parts RSU1 to RSU3, some image signals (i.e., referenced image signals) included in an adjacent base signal part (i.e., a referenced reference unit) may be used as much as the number of non-referenced image signals included in each of the base signal parts RSU1 to RSU3. Accordingly, the rendering may be performed on image signals of the normal signal part NSU1 to NSU4 and image signals of the base signal parts RSU1 to RSU3 without the duplication or loss of image signals, and thus, a color may be prevented from being distorted at a boundary of the first and second display areas DA1 and DA2.

Figure 10:
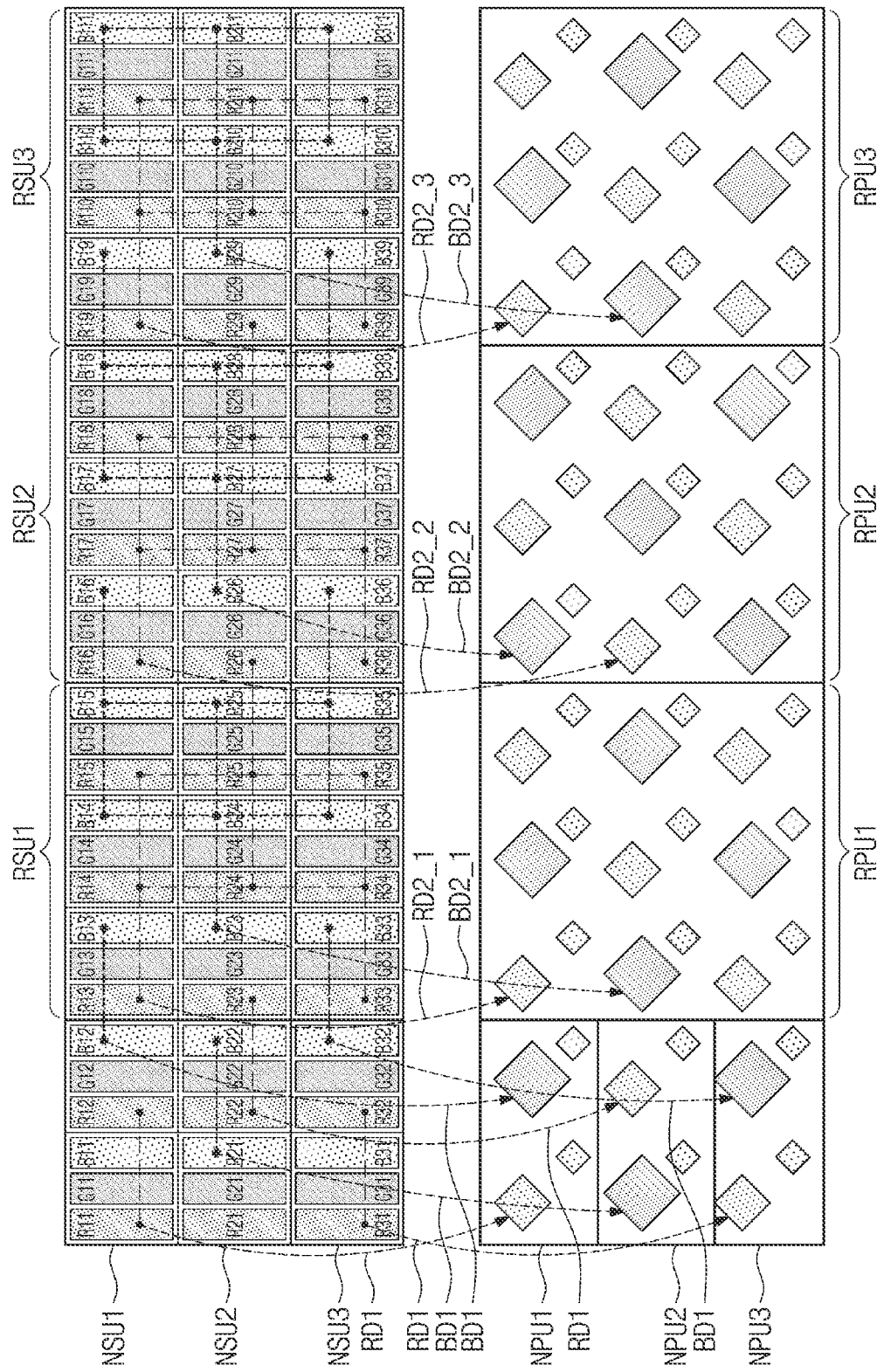
FIG. 10 is a schematic diagram illustrating base pixel parts of a 3×3 structure and a process of rendering image signals provided to correspond to the base pixel parts, according to an embodiment of the disclosure.

FIG. 10 is a schematic diagram illustrating base pixel parts of a 3×3 structure and a process of rendering image signals provided to correspond to the base pixel parts, according to an embodiment of the disclosure.

Referring to FIG. 10, each of the base signal parts RSU1, RSU2, and RSU3 may include "m*n" second red image signals, "m*n" green image signals, and "m*n" second blue image signals. Herein, each of "m" and "n" may be a natural number of 2 or more. For example, "m" may be 3, and "n" may be 3.

The controller 100 may generate the second red image data RD2_1, RD2_2, or RD2_3 by rendering "p" second red image signals of "m*n" second red image signals included in a corresponding base signal part of the multiple base signal parts RSU1, RSU2, and RSU3 and "(m*n)−p" referenced red signals included in the first referenced signal part adjacent to the corresponding base signal part. Herein, "p" may be a natural number of 2 or more, and "p" may be a natural number less than a product of "m" and "n". For example, in the case where "m" is 2 and "n" is 4, "p" may be 8. The controller 100 may generate the second red image data RD2_1, RD2_2, or RD2_3 by rendering eight second red image signals and one referenced red signal. For example, the first referenced signal part may be another base signal part adjacent to the corresponding base signal part.

To generate the second red image data RD2_1, the controller 100 may render eight second red image signals R13, R14, R15, R24, R25, R33, R34, and R35 included in the first base signal part RSU1 and one referenced red signal (e.g., R26) included in the first referenced signal part (e.g., the second base signal part RSU2). For example, the one referenced red signal R26 may be one second red image signal R26 included in the second base signal part RSU2. To generate the second red image data RD2_2, the controller 100 may render eight second red image signals R16, R17, R18, R27, R28, R36, R37, and R38 included in the second base signal part RSU2 and one referenced red signal (e.g., R29) included in the first referenced signal part (e.g., the third base signal part RSU3). For example, the one referenced red signal R29 may be one second red image signal R29 included in the third base signal part RSU3. To generate the second red image data RD2_3, the controller 100 may render eight second red image signals R19, R110, R111, R210, R211, R39, R310, and R311 included in the third base signal part RSU3.

The controller 100 may generate the second blue image data BD2_1, BD2_2, or BD2_3 by rendering "q" second blue image signals of "m*n" second blue image signals included in a corresponding base signal part of the multiple base signal parts RSU1, RSU2, and RSU3 and "(m*n)−q" referenced blue signals included in the second referenced signal part adjacent to the corresponding base signal part. Herein, "q" may be a natural number of 2 or more, and "q" may be a natural number less than a product of "m" and "n". For example, in the case where "m" is 3 and "n" is 3, "q" may be 7. The controller 100 may generate the second blue image data BD2_1, BD2_2, or BD2_3 by rendering seven second blue image signals and two referenced blue signals. For example, the second referenced signal part may be another base signal part adjacent to the corresponding base signal part.

To generate the second blue image data BD2_1, the controller 100 may render seven second blue image signals B14, B15, B23, B24, B25, B34, and B35 included in the first base signal part RSU1 and two referenced blue signals (e.g., B16 and B36) included in the second referenced signal part (e.g., the second base signal part RSU2). For example, the two referenced blue signals B16 and B36 may be two second blue image signals B16 and B36 included in the second base signal part RSU2. To generate the second blue image data BD2_2, the controller 100 may render seven second blue image signals B17, B18, B26, B27, B28, B37, and B38 included in the second base signal part RSU2 and two referenced blue signals (e.g., B19 and B39) included in the second referenced signal part (e.g., the third base signal part RSU3). For example, the two referenced blue signals B19 and B39 may be two second blue image signals B19 and B39 included in the third base signal part RSU3. To generate the second blue image data BD2_3, the controller 100 may render seven second blue image signals B110, B111, B29, B210, B211, B310, and B311 included in the third base signal part RSU3.

An embodiment in which the referenced red signal (e.g., R26) and the referenced blue signals (e.g., B16 and B36) are disposed at different rows is illustrated in FIG. 10, but the disclosure is not limited thereto. For example, the referenced red signal and the referenced blue signals may be disposed at the same row.

The remaining, for example, "(m*n)–p" second red image signals other than "p" second red image signals of a corresponding base signal part may be referred to as "non-referenced red signals", and the remaining, for example, "(m*n)–q" second blue image signals other than "q" second blue image signals of the corresponding base signal part may be referred to as "non-referenced blue signals". The non-referenced red signal and the referenced red signal may be placed at the same row, and the non-referenced blue signal and the referenced blue signal may be placed at the same row.

For example, the first base signal part RSU1 may include the first non-referenced red signal R23; and the referenced red signal R26 of the first referenced signal part (e.g., the second base signal part RSU2) may be placed at the same row as the first non-referenced red signal R23. Also, the first base signal part RSU1 may include the first and second non-referenced blue signals B13 and B33; and the two referenced blue signals B16 and B36 of the second referenced signal part (e.g., the second base signal part RSU2) may be placed at the same row as the first and second non-referenced blue signals B13 and B33.

As described above, in the case where some image signals (i.e., the normal-referenced signals B13, R23, and B33) included in an adjacent base signal part are used to generate normal color image data, the normal-referenced signals B13, R23, and B33 may be excluded in case that rendering is performed on image signals included in each of the base signal parts RSU1 to RSU3. Also, in case that rendering is performed on image signals included in each of the base signal parts RSU1 to RSU3, some image signals (i.e., referenced image signals) included in an adjacent base signal part (i.e., a referenced reference unit) may be used as much as the number of non-referenced image signals included in each of the base signal parts RSU1 to RSU3. Accordingly, the rendering may be performed on image signals of the normal signal part NSU1 to NSU3 and image signals of the base signal parts RSU1 to RSU3 without the duplication or loss of image signals, and thus, a color may be prevented from being distorted at a boundary of the first and second display areas DA1 and DA2.

Figure 11:
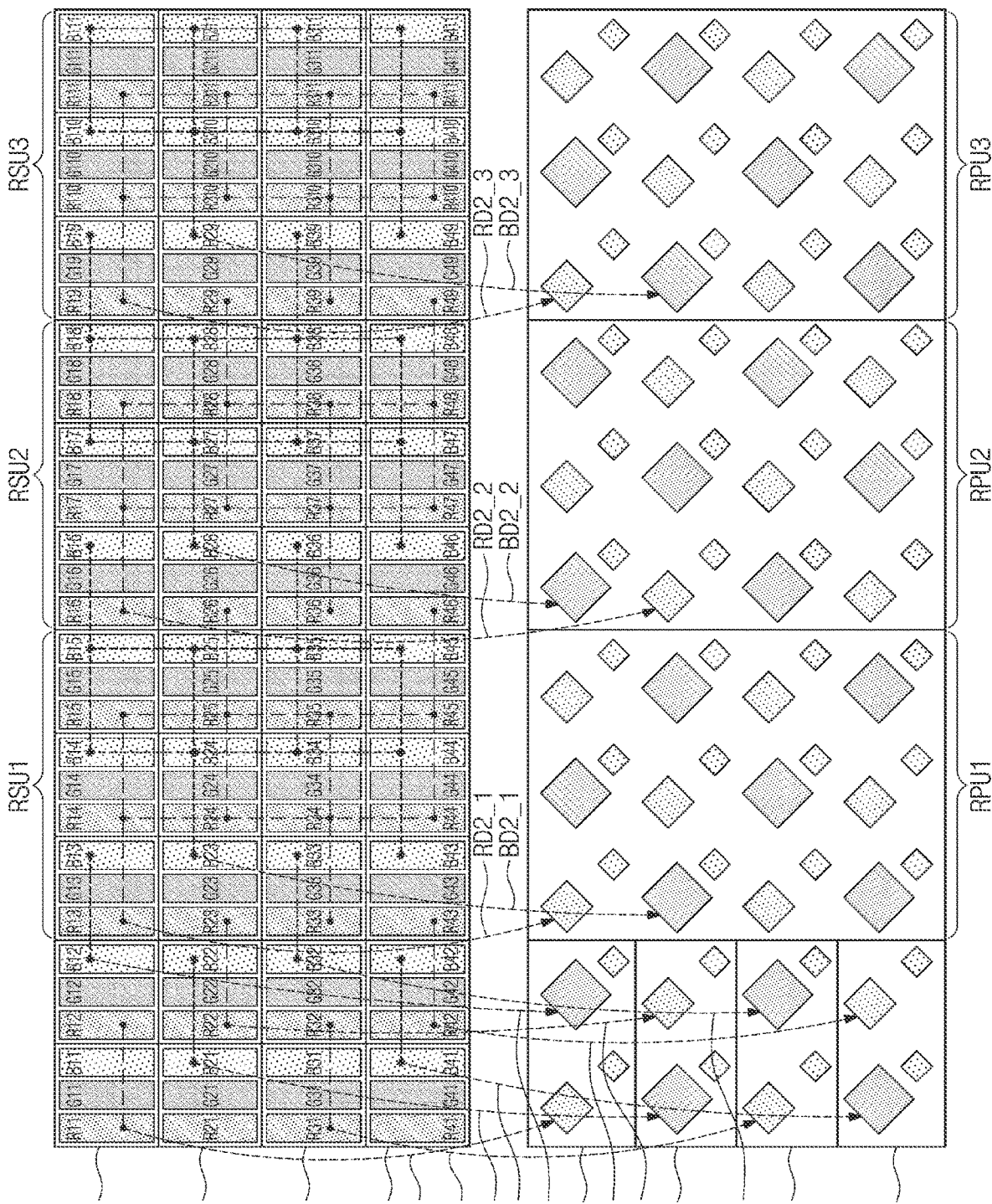
FIG. 11 is a schematic diagram illustrating base pixel parts of a 3×4 structure and a process of rendering image signals provided to correspond to the base pixel parts, according to an embodiment of the disclosure.

FIG. 11 is a schematic diagram illustrating base pixel parts of a 3×4 structure and a process of rendering image signals provided to correspond to the base pixel parts, according to an embodiment of the disclosure.

Referring to FIG. 11, each of the base signal parts RSU1, RSU2, and RSU3 may include "m*n" second red image signals, "m*n" green image signals, and "m*n" second blue image signals. Herein, each of "m" and "n" may be a natural number of 2 or more. For example, "m" may be 3, and "n" may be 4.

The controller 100 may generate the second red image data RD2_1, RD2_2, or RD2_3 by rendering "p" second red image signals of "m*n" second red image signals included in a corresponding base signal part of the multiple base signal parts RSU1, RSU2, and RSU3 and "(m*n)–p" referenced red signals included in the first referenced signal part adjacent to the corresponding base signal part. Herein, "p" may be a natural number of 2 or more, and "p" may be a natural number less than a product of "m" and "n". For example, in the case where "m" is 3 and "n" is 4, "p" may be 10. The controller 100 may generate the second red image data RD2_1, RD2_2, or RD2_3 by rendering ten second red image signals and two referenced red signals. For example, the first referenced signal part may be another base signal part adjacent to the corresponding base signal part.

To generate the second red image data RD2_1, the controller 100 may render ten second red image signals R13, R14, R15, R24, R25, R33, R34, R35, R44, and R45 included in the first base signal part RSU1 and two referenced red signals (e.g., R26 and R46) included in the first referenced signal part (e.g., the second base signal part RSU2). For example, the two referenced red signals R26 and R46 may be two second red image signals R26 and R46 included in the second base signal part RSU2. To generate the second red image data RD2_2, the controller 100 may render ten second red image signals R16, R17, R18, R27, R28, R36, R37, R38, R47, and R48 included in the second base signal part RSU2 and two referenced red signals (e.g., R29 and R49) included in the first referenced signal part (e.g., the third base signal part RSU3). For example, the two referenced red signals R29 and R49 may be two second red image signals R29 and R49 included in the third base signal part RSU3. To generate the second red image data RD2_3, the controller 100 may render ten second red image signals R19, R110, R111, R210, R211, R39, R310, R311, R410, and R411 included in the third base signal part RSU3.

The controller 100 may generate the second blue image data BD2_1, BD2_2, or BD2_3 by rendering "q" second blue image signals of "m*n" second blue image signals included in a corresponding base signal part of the multiple base signal parts RSU1, RSU2, and RSU3 and "(m*n)–q" referenced blue signals included in the second referenced signal part adjacent to the corresponding base signal part. Herein, "q" may be a natural number of 2 or more, and "q" may be a natural number less than a product of "m" and "n". For example, in the case where "m" is 3 and "n" is 4, "q" may be 10. The controller 100 may generate the second blue image data BD2_1, BD2_2, or BD2_3 by rendering ten second blue image signals and two referenced blue signals. For example, the second referenced signal part may be another base signal part adjacent to the corresponding base signal part.

To generate the second blue image data BD2_1, the controller 100 may render ten second blue image signals B14, B15, B23, B24, B25, B34, B35, B43, B44, and B45 included in the first base signal part RSU1 and two referenced blue signals (e.g., B16 and B36) included in the second referenced signal part (e.g., the second base signal part RSU2). For example, the two referenced blue signals B16 and B36 may be two second blue image signals B16 and B36 included in the second base signal part RSU2. To generate the second blue image data BD2_2, the controller 100 may render ten second blue image signals B17, B18, B26, B27, B28, B37, B38, B46, B47, and B48 included in the second base signal part RSU2 and two referenced blue signals (e.g., B19 and B39) included in the second referenced signal part (e.g., the third base signal part RSU3). For example, the two referenced blue signals B19 and B39 may be two second blue image signals B19 and B39 included in the third base signal part RSU3. To generate the second blue image data BD2_3, the controller 100 may render ten second blue image signals B110, B111, B29, B210, B211, B310, B311, B49, B410, and B411 included in the third base signal part RSU3.

An embodiment in which the referenced red signals (e.g., R26 and R46) and the referenced blue signals (e.g., B16 and B36) are disposed at different rows is illustrated in FIG. 11, but the disclosure is not limited thereto. For example, a referenced red signal and a referenced blue signal may be disposed at the same row.

For example, the first base signal part RSU1 may include the first and second non-referenced red signals R23 and R43; and the referenced red signals R26 and R46 of the first referenced signal part (e.g., the second base signal part RSU2) may be respectively placed at the same rows as the first and second non-referenced red signal R23 and R43. Also, the first base signal part RSU1 may include the first and second non-referenced blue signals B13 and B33; and the two referenced blue signals B16 and B36 of the second referenced signal part (e.g., the second base signal part RSU2) may be respectively placed at the same rows as the first and second non-referenced blue signals B13 and B33.

As described above, in the case where some image signals (i.e., the normal-referenced signals B13, R23, B33, and R43) included in an adjacent base signal part are used to generate normal color image data, the normal-referenced signals B13, R23, B33, and R43 may be excluded in case that rendering is performed on image signals included in each of the base signal parts RSU1 to RSU3. Also, in case that rendering is performed on image signals included in each of the base signal parts RSU1 to RSU3, some image signals (i.e., referenced image signals) included in an adjacent base signal part (i.e., a referenced reference unit) may be used as much as the number of non-referenced image signals included in each of the base signal parts RSU1 to RSU3. Accordingly, the rendering may be performed on image signals of the normal signal part NSU1 to NSU4 and image signals of the base signal parts RSU1 to RSU3 without the duplication or loss of image signals, and thus, a color may be prevented from being distorted at a boundary of the first and second display areas DA1 and DA2.

Figure 12:
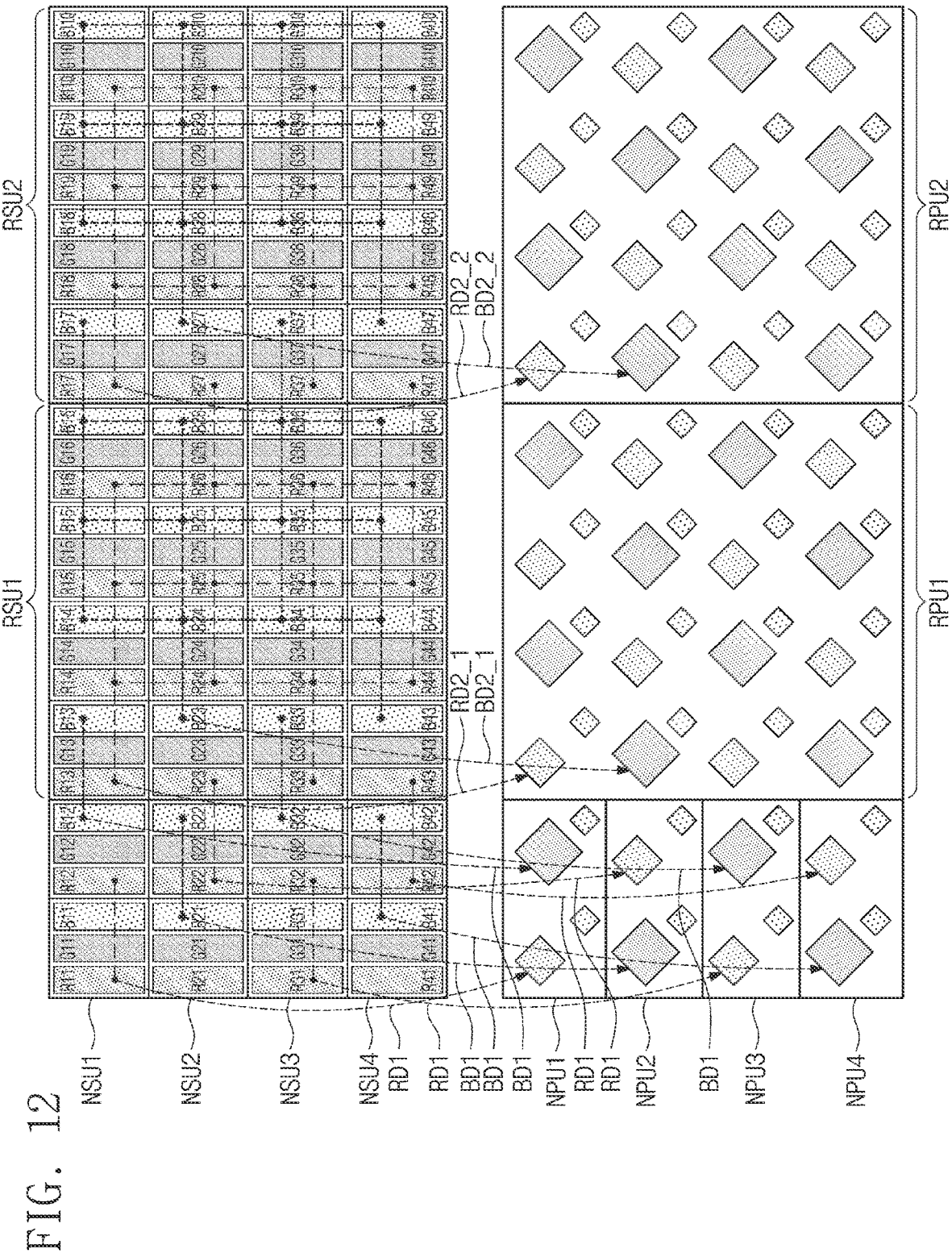
FIG. 12 is a schematic diagram illustrating base pixel parts of a 4×4 structure and a process of rendering image signals provided to correspond to the base pixel parts, according to an embodiment of the disclosure.

FIG. 12 is a schematic diagram illustrating base pixel parts of a 4×4 structure and a process of rendering image signals provided to correspond to the base pixel parts, according to an embodiment of the disclosure.

Referring to FIG. 12, each of the base signal parts RSU1 and RSU2 may include "m*n" second red image signals, "m*n" green image signals, and "m*n" second blue image signals. Herein, each of "m" and "n" may be a natural number of 2 or more. For example, "m" may be 4, and "n" may be 4.

The controller 100 may generate the second red image data RD2_1 or RD2_2 by rendering "p" second red image signals of "m*n" second red image signals included in a corresponding base signal part of the multiple base signal parts RSU1 and RSU2 and "(m*n)−p" referenced red signals included in the first referenced signal part adjacent to the corresponding base signal part. Herein, "p" may be a natural number of 2 or more, and "p" may be a natural number less than a product of "m" and "n". For example, in the case where "m" is 4 and "n" is 4, "p" may be 14. The controller 100 may generate the second red image data RD2_1 or RD2_2 by rendering 12 second red image signals and two referenced red signals. For example, the first referenced signal part may be another base signal part adjacent to the corresponding base signal part.

To generate the second red image data RD2_1, the controller 100 may render 12 second red image signals R13, R14, R15, R16, R24, R25, R26, R33, R34, R35, R36, R44, R45, and R46 included in the first base signal part RSU1 and two referenced red signals (e.g., R27 and R47) included in the first referenced signal part (e.g., the second base signal part RSU2). For example, the two referenced red signals R27 and R47 may be two second red image signals R27 and R47 included in the second base signal part RSU2. To generate the second red image data RD2_2, the controller 100 may render 12 second red image signals R17, R18, R19, R110, R28, R29, R210, R37, R38, R39, R310, R48, R49, and R410 included in the second base signal part RSU2.

The controller 100 may generate the second blue image data BD2_1 and BD2_2 by rendering "q" second blue image signals of "m*n" second blue image signals included in a corresponding base signal part of the multiple base signal parts RSU1 and RSU2 and "(m*n)−q" referenced blue signals included in the second referenced signal part adjacent to the corresponding base signal part. Herein, "q" may be a natural number of 2 or more, and "q" may be a natural number less than a product of "m" and "n". For example, in the case where "m" is 4 and "n" is 4, "q" may be 14. The controller 100 may generate the second blue image data BD2_1 or BD2_2 by rendering 14 second blue image signals and two referenced blue signals. For example, the second referenced signal part may be another base signal part adjacent to the corresponding base signal part.

To generate the second blue image data BD2_1, the controller 100 may render 14 second blue image signals B14, B15, B16, B23, B24, B25, B26, B34, B35, B36, B43, B44, B45, and B46 included in the first base signal part RSU1 and two referenced red signals (e.g., B17 and B37) included in the second referenced signal part (e.g., the second base signal part RSU2). For example, the two referenced blue signals B17 and B37 may be two second blue image signals B17 and B37 included in the second base signal part RSU2. To generate the second red image data BD2_2, the controller 100 may render 14 second red image signals B18, B19, B110, B27, B28, B29, B210, B38, B39, B310, B47, B48, B49, and B410 included in the second base signal part RSU2.

An embodiment in which the referenced red signals (e.g., R27 and R47) and the referenced blue signals (e.g., B17 and B37) are disposed at different rows is illustrated in FIG. 12, but the disclosure is not limited thereto. For example, a referenced red signal and a referenced blue signal may be disposed at the same row.

For example, the first base signal part RSU1 may include the first and second non-referenced red signals R23 and R43; and the referenced red signals R27 and R47 of the first referenced signal part (e.g., the second base signal part RSU2) may be respectively placed at the same rows as the first and second non-referenced red signal R23 and R43. Also, the first base signal part RSU1 may include the first and second non-referenced blue signals B13 and B33; and the two referenced blue signals B17 and B37 of the second referenced signal part (e.g., the second base signal part RSU2) may be respectively placed at the same rows as the first and second non-referenced blue signals B13 and B33.

As described above, in the case where some image signals (i.e., the normal-referenced signals B13, R23, B33, and R43) included in an adjacent base signal part are used to generate normal color image data, the normal-referenced signals B13, R23, B33, and R43 may be excluded in case that rendering is performed on image signals included in each of the base signal parts RSU1 and RSU2. Also, in case that rendering is performed on image signals included in each of the base signal parts RSU1 and RSU2, some image signals (i.e., referenced image signals) included in an adjacent base signal part (i.e., a referenced reference unit) may be used as much as the number of non-referenced image signals included in each of the base signal parts RSU1 and RSU2. Accordingly, the rendering may be performed on image signals of the normal signal part NSU1 to NSU4 and image signals of the base signal parts RSU1 and RSU2 without the duplication or loss of image signals, and thus, a color may be prevented from being distorted at a boundary of the first and second display areas DA1 and DA2.

Figure 13A:
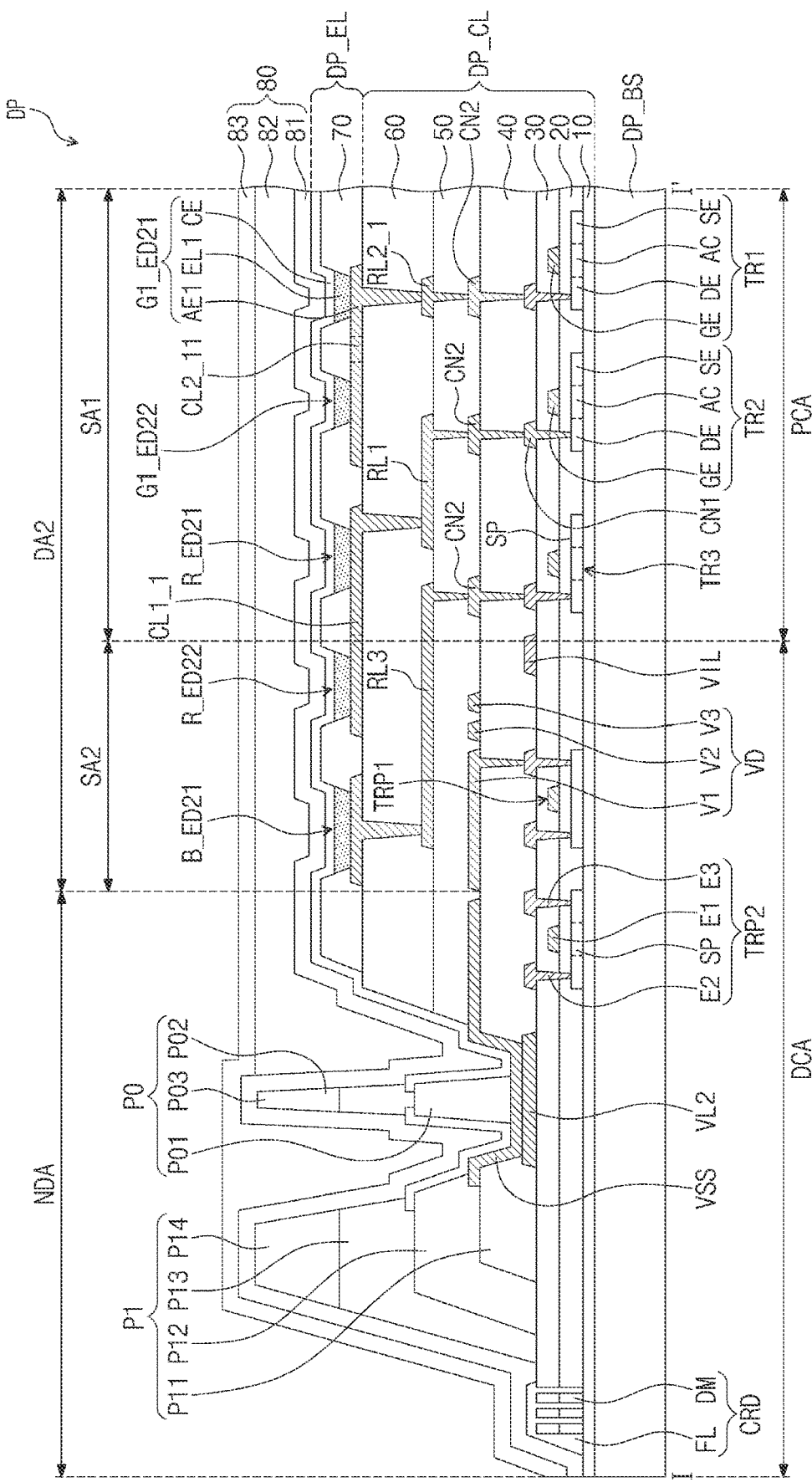
FIG. 13A is a schematic cross-sectional view of a display panel taken along line I-I' of FIG. 3A.
Figure 13B:
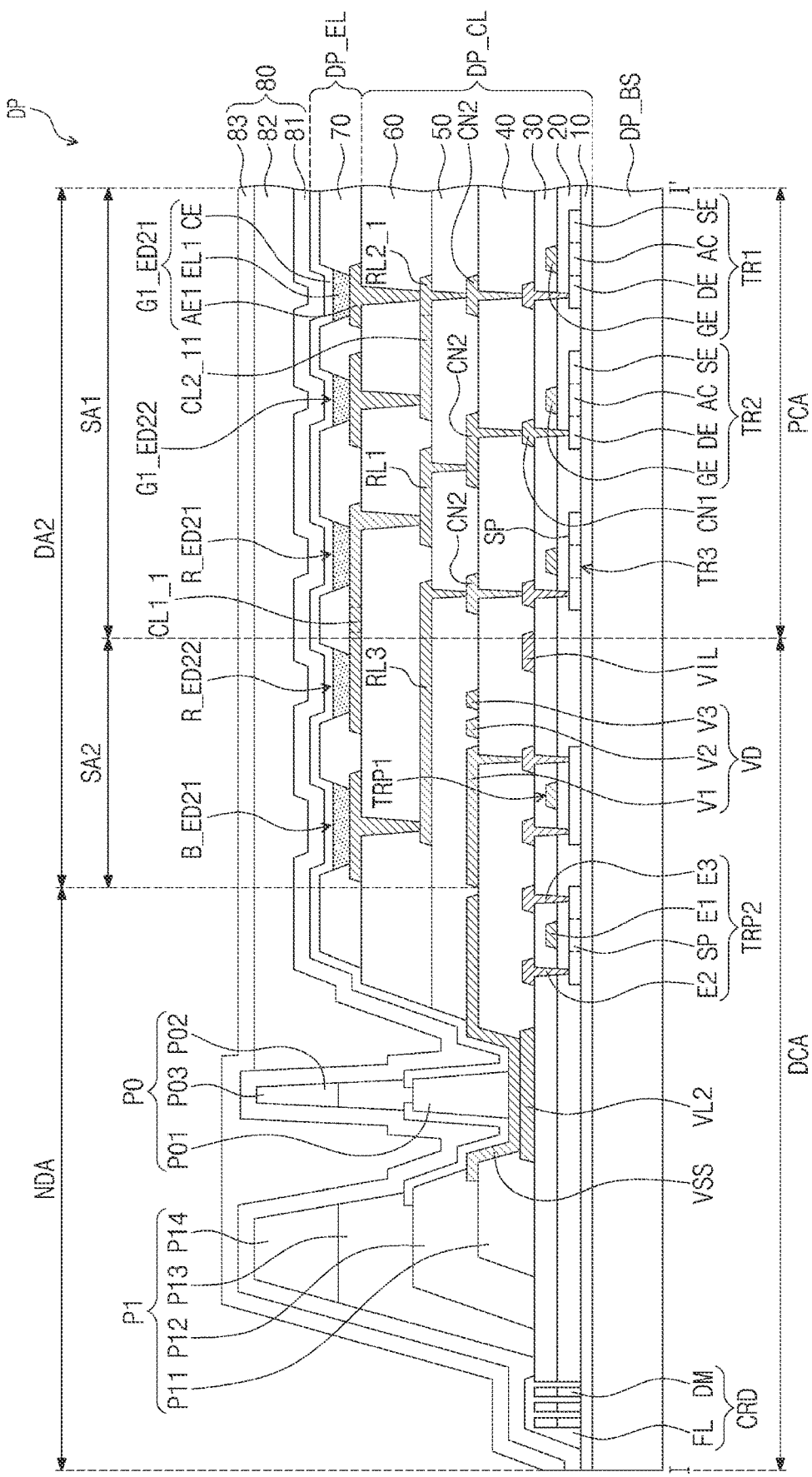
FIG. 13B is a schematic cross-sectional view of a display panel according to an embodiment of the disclosure.

FIG. 13A is a schematic cross-sectional view of a display panel taken along line I-I' of FIG. 3A. FIG. 13B is a schematic cross-sectional view of a display panel according to an embodiment of the disclosure. FIG. 13B shows an area corresponding to FIG. 13A.

As illustrated in FIG. 13A, the display panel DP may include a base layer DP_BS, a circuit layer DP_CL, a light emitting element layer DP_EL, and an encapsulation layer 80. The base layer DP_BS may be a member that provides a base surface on which the circuit layer DP_CL is disposed. The base layer DP_BS may be a rigid layer or may be a flexible layer capable of being bent, folded, or rolled. The base layer DP_BS may be a glass layer, a metal layer, or a polymer layer. However, an embodiment is not limited thereto. For example, the base layer DP_BS may be an inorganic layer, an organic layer, or a composite material layer.

The base layer DP_BS may have a multi-layer structure. For example, the base layer DP_BS may include a first synthetic resin layer, an intermediate layer of a multi-layer structure or a single layer structure, and a second synthetic resin layer disposed on the intermediate layer. The intermediate layer may be referred to as a "base barrier layer". The intermediate layer may include a silicon oxide (SiOx) layer and an amorphous silicon (a-Si) layer disposed on the silicon oxide layer but is not particularly limited thereto. For example, the intermediate layer may include at least one of a silicon oxide layer, a silicon nitride layer, a silicon oxynitride layer, and an amorphous silicon layer.

Each of the first and second synthetic resin layers may include polyimide-based resin. Also, each of the first and second synthetic resin layers may include at least one of acrylate-based resin, methacrylate-based resin, polyisoprene-based resin, vinyl-based resin, epoxy-based resin, urethane-based resin, cellulose-based resin, siloxane-based resin, polyamide-based resin, and perylene-based resin. The wording "X-based resin" in the specification may indicate that "X-based resin" includes the functional group of "X".

According to an embodiment, in a plan view, the base layer DP_BS may be divided into the first display area DA1 (refer to FIG. 3A), the second display area DA2, and a non-display area NDA. The second display area DA2 may include the first sub-area SA1 and the second sub-area SA2.

The first and second display areas DA1 and DA2 may be areas in which an image is displayed, and the non-display area NDA may be an area in which an image is not displayed. The first sub-area SA1 may be an area adjacent to the first display area DA1, and the second sub-area SA2 may be an area adjacent to the non-display area NDA.

The circuit layer DP_CL may be disposed on the base layer DP_BS. The circuit layer DP_CL may include an insulating layer, a semiconductor pattern, a conductive pattern, a signal line, etc. An insulating layer, a semiconductor layer, and a conductive layer may be formed on the base layer DP_BS through a coating or deposition process, and the insulating layer, the semiconductor layer, and the conductive layer may be selectively patterned through multiple photolithography processes. After the processes, the semiconductor pattern, the conductive pattern, and the signal line included in the circuit layer DP_CL may be formed.

The circuit layer DP_CL may include multiple insulation layers 10, 20, 30, 40, and 50, a pixel driving circuit, and the first and second scan drivers GDC1 and GDC2 (refer to FIG. 3A). The base layer DP_BS may be divided into a pixel circuit area PCA and a driving circuit area DCA. The pixel circuit area PCA may be defined in the first display area DA1 and the first sub-area SA1 of the second display area DA2. The driving circuit area DCA may be defined to overlap the second sub-area SA2 of the second display area DA2 and the non-display area NDA.

In detail, driving circuits constituting the pixels PX (refer to FIG. 2B) may be disposed in the pixel circuit area PCA. Three pixel transistors TR1, TR2, and TR3 of the driving circuits are illustrated in FIG. 13A. The three pixel transistors TR1, TR2, and TR3 may be electrically connected with three light emitting elements separated from each other.

The pixel transistors TR1, TR2, and TR3 may be disposed on the base layer DP_BS. In an embodiment, the first insulating layer 10 may be disposed between the base layer DP_BS and the pixel transistors TR1, TR2, and TR3. The first insulating layer 10 may include a single layer or multiple layers, or may include an organic layer. However, the first insulation layer 10 is not limited to any one embodiment.

Each of the pixel transistors TR1, TR2, and TR3 may include a semiconductor pattern SP and a control electrode GE. The semiconductor pattern SP may include a semiconductor material such as silicon or metal oxide.

The semiconductor pattern SP may include a channel region AC, a source region SE, and a drain region DE. The channel region AC, the source region SE, and the drain region DE may be partitioned parts in a plan view. The channel region AC may have conductivity lower than that of the source region SE and the drain region DE.

In an embodiment, the source region SE and the drain region DE may include a reduced metal. The source region SE and the drain region DE may respectively function as a source electrode and a drain electrode of the first transistor TR1. However, the above description is given as an embodiment. The first transistor TR1 may further include separate source and drain electrodes electrically connected with the source and drain regions SE and DE, but the disclosure is not limited to any one embodiment.

The control electrode GE may have conductivity. The control electrode GE may be spaced apart from the semiconductor pattern SP, with the second insulating layer 20 interposed therebetween. The control electrode GE may overlap the channel region AC of the semiconductor pattern SP in a plan view. The second insulating layer 20 may be an inorganic layer, and may be a single layer or a multilayer.

The third insulating layer 30, the fourth insulating layer 40, the fifth insulating layer 50, and a sixth insulating layer 60 may be sequentially stacked each other on the pixel transistors TR1, TR2, and TR3. Each of the third to sixth insulating layers 30, 40, 50, and 60 may include an organic layer or may be an organic layer and an inorganic layer stacked each other.

A first connection electrode CN1 may be disposed between the third insulating layer 30 and the fourth insulating layer 40. Multiple first connection electrodes CN1 may be provided and may be respectively electrically connected with the pixel transistors TR1, TR2, and TR3 through the third insulating layer 30 and the second insulating layer 20. An embodiment in which the first connection electrode CN1 is connected with the drain region DE is illustrated, but this is provided for the illustrative purpose. For example, the first connection electrode CN1 may be electrically connected with the source region SE, and the disclosure is not limited to any one embodiment.

A second connection electrode CN2 may be disposed between the fourth insulating layer 40 and the fifth insulating layer 50. The second connection electrode CN2 may be electrically connected with the first connection electrode CN1 through the fourth insulating layer 40.

The routing lines RL1, RL2_1, and RL3 may be disposed between the fifth insulating layer 50 and the sixth insulating layer 60. The routing lines RL1, RL2_1, and RL3 may be electrically connected with the second connection electrode CN2 through the fifth insulating layer 50. Each of the routing lines RL1, RL2_1, and RL3 may be electrically connected with a corresponding light emitting element of the multiple light emitting elements R_ED21, R_ED22, G1_ED21, G1_ED22, and B_ED21.

In the routing lines RL1, RL2_1, and RL3, the first sub-routing line RL2_1 may be electrically connected with the third green light emitting element G1_ED21, the first routing line RL1 is connected with the second red light emitting element R_ED21, and the third routing line RL3 may be electrically connected with the second blue light emitting element B_ED21. According to an embodiment, the routing lines RL1, RL2_1, and RL3 and the second connection electrodes CN2 may be disposed on different layers, but the disclosure is not limited thereto. For example, the routing lines RL1, RL2_1, and RL3 and the second connection electrodes CN2 may be disposed on the same layer.

Each of the routing lines RL1, RL2_1, and RL3 may include a transparent conductive line. The transparent conductive line may include a transparent conductive material or a light-transmissive material. For example, each of the routing lines RL1, RL2_1, and RL3 may be formed of a film of transparent conductive oxide (TCO) such as indium tin oxide (ITO), indium zinc oxide (IZO), indium gallium zinc oxide (IGZO), zinc oxide (ZnO) or indium oxide ($In_2O_3$).

The light emitting element layer DP_EL may be disposed on the circuit layer DP_CL. The light emitting element layer DP_EL may include the multiple light emitting elements R_ED21, R_ED22, G1_ED21, G1_ED22, and B_ED21. For example, the light emitting element layer DP_EL may include an organic light emitting material, an inorganic light emitting material, an organic-inorganic light emitting material, a quantum dot, a quantum rod, a micro-LED, or a nano-LED.

The light emitting elements R_ED21, R_ED22, G1_ED21, G1_ED22, and B_ED21 may be disposed on the sixth insulating layer 60 and may be electrically connected with the corresponding pixel transistors TR1, TR2, and TR3 through the routing lines RL1, RL2_1, and RL3. The encapsulation layer 80 may be disposed on the light emitting element layer DP_EL. The encapsulation layer 80 may protect the light emitting element layer DP_EL from foreign substances such as moisture, oxygen, and dust particles.

The encapsulation layer 80 may be disposed on the light emitting element layer DP_EL. The encapsulation layer 80 may include a first inorganic encapsulation layer 81, an organic encapsulation layer 82, and a second inorganic encapsulation layer 83 that are sequentially stacked each other, but layers constituting the encapsulation layer 80 are not limited thereto.

The first and second inorganic encapsulation layers 81 and 83 may protect the light emitting element layer DP_EL from moisture and oxygen, and the organic encapsulation layer 82 may protect the light emitting element layer DP_EL from a foreign substance such as dust particles. Each of the first and second inorganic encapsulation layers 81 and 83 may include a silicon nitride layer, a silicon oxynitride layer, a silicon oxide layer, a titanium oxide layer, or an aluminum oxide layer. The organic encapsulation layer 82 may include an acryl-based organic layer but may not be limited thereto.

Each of the light emitting elements R_ED21, R_ED22, G1_ED21, G1_ED22, and B_ED21 may include a first electrode AE1, a second electrode CE, and a light emitting layer EL1. The first electrode AE1 may be disposed on the sixth insulating layer 60 and may be electrically connected with a corresponding routing line RL1, RL2_1, or RL3 through the sixth insulating layer 60. In the case where the routing lines RL1, RL2_1, and RL3 are disposed on the same layer as the second connection electrode CN2, the first electrode AE1 of a light emitting element (e.g., the third green light emitting element G1_ED21) that is disposed to overlap a corresponding pixel transistor TR1 may be directly connected with the second connection electrode CN2. The first sub-routing line RL2_1 may be omitted.

The first electrode AE1 may include a reflective layer formed of Ag, Mg, Al, Pt, Pd, Au, Ni, Nd, Ir, Cr, or a compound thereof, and a transparent or semi-transparent electrode layer formed on the reflective layer. The transparent or semi-transparent electrode layer may include at least one selected from a group including indium tin oxide (ITO), indium zinc oxide (IZO), indium gallium zinc oxide (IGZO), zinc oxide (ZnO) or indium oxide ($In_2O_3$), and aluminum-doped zinc oxide (AZO). For example, the first electrode AE1 may be formed of ITO/Ag/ITO.

A seventh insulation layer 70 may include an opening exposing at least a portion of the first electrode AE1. The seventh insulating layer 70 may include an organic material and/or an inorganic material, and may correspond to a pixel defining film.

The light emitting layer EL1 may be disposed in the opening defined in the seventh insulation layer 70. The light emitting layer EL1 may include an organic light emitting material and/or an inorganic light emitting material. The second electrode CE may be disposed on the seventh insulating layer 70. The second electrode CE may be provided in an integrated shape so as to cover multiple light emitting layers. The second electrode CE may be formed on the entire surface of the first and second display areas DA1 and DA2. In each of the light emitting elements R_ED21, R_ED22, G1_ED21, G1_ED22, and B_ED21, a light may be produced as the light emitting layer EL1 is excited depending on a potential difference of the first electrode AE1 and the second electrode CE.

Although not illustrated, a hole control layer may be disposed between the first electrode AE1 and the light emitting layer EL1. The hole control layer may include a hole transport layer and may further include a hole injection layer. An electron control layer may be disposed between the light emitting layer EL1 and the second electrode CE. The electron control layer may include an electron transport layer and may further include an electron injection layer. The hole control layer and the electron control layer may be formed in common in the multiple pixels PX (refer to FIG. 1) by using an open mask.

The light emitting element layer DP_EL may further include the multiple connection lines CL1_1 and CL2_11. The connection lines CL1_1 and CL2_11 may be disposed in the second display area DA2. In the connection lines CL1_1 and CL2_11, the first connection line CL1_1 may electrically connect two adjacent red light emitting elements R_ED21 and R_ED22, and the first sub-connection line CL2_11 may electrically connect two third green light emitting elements G1_ED21 and G1_ED22 adjacent to each other. The first connection line CL1_1 and the first sub-connection line CL2_11 may be disposed on the same layer as the first electrode AE1. However, locations of the connection lines CL1_1 and CL2_11 are not limited thereto. For example, as illustrated in FIG. 13B, some (e.g., the first sub-connection line CL2_11) of the connection lines CL1_1 and CL2_11 may be disposed on the same layer as the routing lines RL1, RL2_1, and RL3, and the others (e.g., the first connection line CL1_1) thereof may be disposed on the same layer as the first electrode AE1. According to another embodiment, each of the connection lines CL1_1 and CL2_11 may be disposed on the same layer as the routing lines RL1, RL2_1, and RL3.

In addition to the pixel driving circuits, any other circuit components, for example, the first and second scan drivers GDC1 and GDC2, the initialization voltage line VIL (refer to FIG. 2B), the first power supply voltage line VL1 (refer to FIG. 2B), and a second power supply voltage line VL2, etc. may be disposed in the driving circuit area DCA.

The initialization voltage line VIL may be disposed on the second display area DA2 and may be disposed to overlap the second sub-area SA2.

The first and second scan drivers GDC1 and GDC2 may be disposed in a portion of the driving circuit area DCA, which overlaps the second sub-area SA2. For ease of description, some driving transistors TRP1 and TRP2 of the first and second scan drivers GDC1 and GDC2 are illustrated in FIGS. 13A and 13B.

The driving transistor TRP1 may include a semiconductor pattern SP, a control electrode E1, an input electrode E2, and an output electrode E3. The driving transistors TRP1 and TRP2 may be formed through the same process as the pixel transistors TR1, TR2, and TR3. The driving transistors TRP1 and TRP2 may be spaced apart from the pixel transistors TR1, TR2, and TR3 in a plan view.

Each of the first and second scan drivers GDC1 and GDC2 may include driving signal lines VD. According to an embodiment, the driving signal lines VD may include first to third lines V1, V2, and V3. The two-dimensional area of the first line V1 may be larger than that of the second line V2 and/or the third line V3. The first line V1 is illustrated as being connected with the first driving transistor TRP1 among the components of the first and second scan drivers GDC1 and GDC2.

The first line V1 may transfer a constant voltage to the first driving transistor TRP1. The constant voltage may include a low gate voltage VGL or a high gate voltage VGH. However, this is provided for the illustrative purpose. For example, the first line V1 may be any one of various lines transferring the constant voltage to the first and second scan drivers GDC1 and GDC2, and the disclosure is not limited thereto.

According to an embodiment, a power supply voltage pattern VSS may be disposed on the same layer as the first line V1. The power supply voltage pattern VSS may be electrically connected with the second power supply voltage line VL2 to receive the second driving voltage ELVSS (refer to FIG. 2B).

The display panel DP according to an embodiment may include multiple dams P0 and P1 and a crack dam CRD. The dams P0 and P1 may be disposed along the periphery of the second display area DA2 in a plan view. The dams P0 and P1 may prevent the overflow of the organic encapsulation layer 82. The dams P0 and P1 may include the first dam P0 and the second dam P1.

The first dam P0 may be disposed relatively more adjacent to the second display area DA2 than the second dam P1. The first dam P0 may overlap the second power supply voltage line VL2 in a plan view. The first dam P0 may include a first dam layer P01, a second dam layer P02, and a third dam layer P03. Each of the first dam layer P01, the second dam layer P02, and the third dam layer P03 may be formed of an insulating material. According to the embodiment, the first dam layer P01 may be formed of the same material as the fifth insulating layer 50, and the second dam layer P02 and the third dam layer P03 may be formed of the same material as the sixth insulating layer 60 and/or the seventh insulation layer 70.

The second dam P1 may be spaced from the second display area DA2 to be relatively farther than the first dam P0. According to the embodiment, the second dam P1 may include a first dam layer P11, a second dam layer P12, a third dam layer P13, and a fourth dam layer P14. For example, the first dam layer P11 may be formed of the same material as the fourth insulating layer 40, the second dam layer P12 may be formed of the same material as the fifth insulating layer 50, and the third dam layer P13 and the fourth dam layer P14 may be formed of the same material as the sixth insulating layer 60 and/or the seventh insulation layer 70. The first dam P0 and the second dam P1 may have the same layer structure; in addition to the first dam P0 and the second dam P1, an additional dam may be further disposed in the non-display area NDA. However, the disclosure is not limited to any one embodiment.

A crack dam CRD may be disposed in the non-display area NDA and may be disposed at ends of the second insulating layer 20 and the third insulating layer 30. The crack dam CRD may include a dam part DM and a filling part FL. The dam part DM may include multiple insulating patterns disposed along a periphery of the display panel DP. The insulating patterns may be formed of the same material as the second insulating layer 20 and the third insulating layer 30 and may be formed simultaneously therewith.

The filling part FL may include an organic material. The filling part FL may be formed of a material of which softness is higher than that of the dam part DM. The filling part FL may cover the dam part DM and may fill spaces between the insulating parts.

According to an embodiment of the disclosure, some of image signals included in an adjacent base signal part placed in a second display area may be used to generate normal color image data corresponding to a first display area. A normal-referenced signal may be excluded in case that rendering is performed on image signals included in each base signal part placed in the second display area. Also, in case that rendering is performed on image signals included in each of the base signal part, some image signals included in an adjacent base signal part may be used as much as the number of non-referenced image signals included in each base signal part.

Accordingly, the rendering may be performed on image signals of a normal signal part and image signals of base signal parts without the duplication or loss of image signals, and thus, a color may be prevented from being distorted at a boundary of the first and second display areas.

While the disclosure has been described with reference to embodiments thereof, it will be apparent to those of ordinary skill in the art that various changes and modifications may be made thereto without departing from the spirit and scope of the disclosure as set forth in the following claims.

What is claimed is:

1. A display device comprising:
a display panel including a first display area and a second display area adjacent to the first display area;
a controller that receives image signals and renders the image signals to output image data; and
a data driver that converts the image data into data signals and provides the data signals to the first and second display areas of the display panel, wherein
a plurality of base pixel parts are disposed in the second display area,
each of the plurality of base pixel parts comprises "k" first color light emitting elements that receive a data signal corresponding to first color image data,
the image signals comprise first image signals corresponding to the first display area and second image signals corresponding to the second display area,
the second image signals are divided into a plurality of base signal parts, each of the plurality of base signal parts respectively corresponding to each of the plurality of base pixel parts,
each of the plurality of base signal parts comprises "m*n" first color image signals,
the controller generates the first color image data by rendering "p" first color image signals of "m*n" first color image signals included in a corresponding base signal part and "(m*n)−p" first referenced image signals included in a first referenced signal part adjacent to the corresponding base signal part,
each of k and p is less than a product of m and n,
each of k, m, and n is a natural number of 2 or more,
p is a natural number of 1 or more, and
each of the plurality of base pixel parts further comprises "j" second color light emitting elements that receive a data signal corresponding to second color image data, j being a natural number more than k.

2. The display device of claim 1, wherein
each of the plurality of base signal parts further comprises "m*n" second color image signals and "m*n" third color image signals,
each of the plurality of base pixel parts further comprises "k" third color light emitting elements that receive a data signal corresponding to third color image data.

3. The display device of claim 2, wherein
a plurality of normal pixel parts are disposed in the first display area,
in case that the first display area is disposed adjacent to a first side of the second display area, the first referenced signal part is disposed adjacent to the first side of the corresponding base signal part, and
in case that the first display area is disposed adjacent to a second side of the second display area which is opposite to the first side, the first referenced signal part is disposed adjacent to the second side of the corresponding base signal part.

4. The display device of claim 3, wherein
the first image signals are divided into a plurality of normal signal parts, each of the plurality of normal signal parts respectively corresponding to each of the plurality of normal pixel parts,
each of the plurality of normal signal parts comprises two normal color image signals,
the controller generates normal color image data by rendering one of two normal color image signals included in a corresponding one of the plurality of normal signal parts and one referenced normal signal included in a normal-referenced part adjacent to the corresponding normal signal part, and
a corresponding normal pixel part associated with the corresponding normal signal part receives a data signal associated with the normal color image data.

5. The display device of claim 3, wherein
the controller generates the third color image data by rendering "q" third color image signals of the "m*n" third color image signals included in the corresponding base signal part and "(m*n)−q" second referenced image signals included in the first referenced signal part,
a data signal associated with the third color image data is provided to the "k" third color light emitting elements included in the corresponding base pixel part, and
q is less than a product of m and n and is a natural number of 1 or more.

6. The display device of claim 5, wherein
each of m and n is 2 and each of p and q is 3,
one first referenced image signal is placed at a same row as a first non-referenced image signal other than three of four first color image signals included in the corresponding base signal part, and
one second referenced image signal is placed at a same row as a second non-referenced image signal other than three of four third color image signals included in the corresponding base signal part.

7. The display device of claim 6, wherein
k is 2 and j is 4,
two first color light emitting elements are electrically connected with each other,
two of four second color light emitting elements are electrically connected with each other,
a rest of the four second color light emitting elements are electrically connected with each other, and
two third color light emitting elements are electrically connected with each other.

8. The display device of claim 6, wherein the first non-referenced image signal and the second non-referenced image signal are placed at different rows.

9. The display device of claim 5, wherein
m is 3, n is 2, and each of p and q is 5,
one first referenced image signal is placed at a same row as a first non-referenced image signal other than five of six first color image signals included in the corresponding base signal part, and
one second referenced image signal is placed at a same row as a second non-referenced image signal other than five of six third color image signals included in the corresponding base signal part.

10. The display device of claim 9, wherein
k is 3 and j is 6,
three first color light emitting elements are electrically connected with each other,
three of six second color light emitting elements are electrically connected with each other,
a rest of the six second color light emitting elements are electrically connected with each other, and
three third color light emitting elements are electrically connected with each other.

11. The display device of claim 5, wherein
m is 4, n is 2, and each of p and q is 7,
one first referenced image signal is placed at a same row as a first non-referenced image signal other than seven of eight first color image signals included in the corresponding base signal part, and
one second referenced image signal is placed at a same row as a second non-referenced image signal other than seven of eight third color image signals included in the corresponding base signal part.

12. The display device of claim 11, wherein
k is 4 and j is 8,
four first color light emitting elements are electrically connected with each other,
four of eight second color light emitting elements are electrically connected with each other,
a rest of the eight second color light emitting elements are electrically connected with each other, and
four third color light emitting elements are electrically connected with each other.

13. The display device of claim 5, wherein
m is 2, n is 4, and each of p and q is 6,
two first referenced image signals are respectively placed at same rows as two first non-referenced image signals other than six of eight first color image signals included in the corresponding base signal part, and
two second referenced image signals are respectively placed at same rows as two second non-referenced image signals other than six of eight third color image signals included in the corresponding base signal part.

14. The display device of claim 13, wherein
k is 4 and j is 8,
four first color light emitting elements are electrically connected with each other,
four of eight second color light emitting elements are electrically connected with each other,
a rest of the eight second color light emitting elements are electrically connected with each other, and
four third color light emitting elements are electrically connected with each other.

15. The display device of claim 5, wherein
m is 3, n is 4, and each of p and q is 10,
two first referenced image signals are respectively placed at same rows as two first non-referenced image signals other than 10 of 12 first color image signals included in the corresponding base signal part, and
two second referenced image signals are respectively placed at same rows as two second non-referenced image signals other than 10 of 12 third color image signals included in the corresponding base signal part.

16. The display device of claim 5, wherein
m is 4, n is 4, and each of p and q is 14,
two first referenced image signals are placed at a same row as two first non-referenced image signals other than 14 of 16 first color image signals included in the corresponding base signal part, and
two second referenced image signals are placed at a same row as two second non-referenced image signals other than 14 of 16 third color image signals included in the corresponding base signal part.

17. The display device of claim 16, wherein the two first non-referenced image signals are respectively placed at same rows as the two second non-referenced image signals.

18. The display device of claim 5, wherein
m is 2, n is 3, p is 5, and q is 4,
one first referenced image signal is placed at a same row as a first non-referenced image signal other than five of six first color image signals included in the corresponding base signal part, and
two second referenced image signals are respectively placed at same rows as two second non-referenced image signals other than four of six third color image signals included in the corresponding base signal part.

19. The display device of claim 18, wherein
k is 3 and j is 6,
three first color light emitting elements are electrically connected with each other,
three of six second color light emitting elements are electrically connected with each other,
a rest of the six second color light emitting elements are electrically connected with each other, and
three third color light emitting elements are electrically connected with each other.

20. The display device of claim 5, wherein
m is 3, n is 2, each of p and q is 5,
one first referenced image signal is placed at a same row as a first non-referenced image signal other than five of six first color image signals included in the corresponding base signal part, and
one second referenced image signal is placed at a same row as a second non-referenced image signal other than five of six third color image signals included in the corresponding base signal part.

21. The display device of claim 2, wherein
the "k" first color light emitting elements are electrically connected with each other,
"j/2" second color light emitting elements of the "j" second color light emitting elements are electrically connected with each other,
a rest of the "j" second color light emitting elements are electrically connected with each other, and
the "k" third color light emitting elements are electrically connected with each other.

22. The display device of claim 21, wherein the data signal converted from the first color image data is provided to the "k" first color light emitting elements in common.

23. The display device of claim 2, wherein
the "k" first color light emitting elements output red light,
the "j" second color light emitting elements output green light, and
the "k" third color light emitting elements output blue light.

24. The display device of claim 1, further comprising:
a scan driver disposed to overlap the second display area of the display panel in a plan view.

25. The display device of claim 1, wherein
the first image signals are fewer in number than the second image signals, and
the first image signals include a referenced normal signal not used in the second image signals.

26. A display device comprising:
a display panel including a first display area and a second display area adjacent to the first display area; and a controller that receives image signals and renders the image signals to output image data, wherein a plurality of normal pixel parts, each of the plurality of normal pixel parts including a first color light emitting element, are disposed in the first display area, a plurality of base pixel parts are disposed in the second display area, each of the plurality of base pixel parts comprises second color light emitting elements, a number of second color light emitting elements included in each of the normal pixel parts is k times a number of first color light emitting elements included in each of the plurality of base pixel parts, the image signals comprise first image signals corresponding to the first display area and second image signals corresponding to the second display area, the second image signals are divided into a plurality of base signal parts, each of the plurality of base signal parts respectively corresponding to each of the plurality of base pixel parts, each of the plurality of base signal parts comprises "m*n" reference color image signals, the first image signals are divided into a plurality of normal signal parts, each of the plurality of normal signal parts respectively corresponding to each of the plurality of normal pixel parts, each of the normal signal parts comprises "(m*n)/k" normal color image signals, the controller generates normal color image data by rendering a portion of "(m*n)/k" normal color image signals included in a corresponding normal signal part and a normal-referenced image signal included in a base signal part adjacent to the corresponding normal signal part, the normal-referenced signal is not referenced in case that rendering is performed on reference color image signals included in a corresponding base signal part, k is less than a product of m and n, and each of k, m, and n is a natural number of 2 or more.

27. The display device of claim 26, wherein each of the plurality of base signal parts further comprises "m*n" second color image signals and "m*n" third color image signals, each of the plurality of base pixel parts further comprises "j" second color light emitting elements, and "k" third color light emitting elements, and j is a natural number more than k.

28. The display device of claim 27, wherein in case that the first display area is disposed adjacent to a first side of the second display area, the normal-referenced signal is included in a base signal part adjacent to the first side of the normal signal part, and in case that the first display area is disposed adjacent to a second side of the second display area which is opposite to the first side, the normal-referenced signal is included in a base signal part adjacent to the second side of the normal signal part.

29. The display device of claim 28, wherein the controller generates a reference color image data by rendering "p" reference color image signals of "m*n" reference color image signals included in a corresponding base signal part and "(m*n)−p" referenced criterion signals included in a referenced signal part adjacent to the corresponding base signal part, and p is less than a product of m and n and is a natural number of 1 or more.

30. The display device of claim 29, wherein the normal-referenced signal and the referenced criterion signals are placed at a same row.

* * * * *